US007850817B2

(12) United States Patent
Wakabayashi et al.

(10) Patent No.: US 7,850,817 B2
(45) Date of Patent: Dec. 14, 2010

(54) POLISHING DEVICE AND SUBSTRATE PROCESSING DEVICE

(75) Inventors: Satoshi Wakabayashi, Tokyo (JP); Tetsuji Togawa, Tokyo (JP); Ryuichi Kosuge, Tokyo (JP); Koji Ato, Tokyo (JP); Hiroshi Sotozaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 208 days.

(21) Appl. No.: 10/481,001

(22) PCT Filed: Apr. 9, 2003

(86) PCT No.: PCT/JP03/04493
§ 371 (c)(1),
(2), (4) Date: Aug. 9, 2004

(87) PCT Pub. No.: WO03/088335
PCT Pub. Date: Oct. 23, 2003

(65) Prior Publication Data
US 2004/0261944 A1 Dec. 30, 2004

(30) Foreign Application Priority Data
Apr. 15, 2002 (JP) ............................... 2002-112752

(51) Int. Cl.
*C23F 1/00* (2006.01)
(52) U.S. Cl. ............................. 156/345.12; 156/345.22
(58) Field of Classification Search ............ 156/345.12, 156/345.31, 345.32, 345.2, 345.22; 6/345.22
See application file for complete search history.

(56) References Cited
U.S. PATENT DOCUMENTS 5,248,024 A * 9/1993 Yokosuka ............... 198/341.02
5,830,045 A * 11/1998 Togawa et al. ............... 451/288
6,036,582 A * 3/2000 Aizawa et al. ................. 451/41
6,354,922 B1 * 3/2002 Sakurai et al. .............. 451/288
6,358,126 B1 * 3/2002 Jackson et al. ................ 451/65
6,607,427 B2 * 8/2003 Togawa et al. ................ 451/56
6,625,556 B1 * 9/2003 Conboy et al. ................ 702/84
6,942,541 B2 * 9/2005 Togawa et al. .................. 451/5
6,997,782 B2 * 2/2006 Nishi et al. .................... 451/41

(Continued)

FOREIGN PATENT DOCUMENTS

CN            1342998           4/2002

(Continued)

OTHER PUBLICATIONS

Korean Office Action issued Apr. 30, 2009 in corresponding Korean Application No. Oct. 2003-7016610 with English translation.

(Continued)

*Primary Examiner*—Sylvia R. MacArthur
(74) *Attorney, Agent, or Firm*—Wenderoth, Lind & Ponack, L.L.P.

(57) ABSTRACT

A polishing apparatus has a plurality of polishing units. Moving mechanisms for moving top rings between polishing positions on polishing surfaces and wafer receiving/delivering positions are provided in each of the polishing units. Linear transporters are provided for transferring a wafer between a plurality of transferring positions including the wafer receiving/delivering positions. Pushers for receiving and delivering the wafer between the linear transporters and the top rings are provided at the transferring positions as the wafer receiving/delivering positions.

9 Claims, 42 Drawing Sheets

U.S. PATENT DOCUMENTS

| | | | |
|---|---|---|---|
| 7,063,600 B2 * | 6/2006 | Yoshida et al. | 451/67 |
| 7,101,259 B2 * | 9/2006 | Kimura et al. | 451/8 |
| 7,108,589 B2 * | 9/2006 | Kimura et al. | 451/65 |
| 2001/0009157 A1 | 7/2001 | Maekawa et al. | |
| 2001/0024937 A1 | 9/2001 | Inaba | |

FOREIGN PATENT DOCUMENTS

| | | |
|---|---|---|
| EP | 0 761 387 | 3/1997 |
| EP | 1 072 359 A2 | 1/2001 |
| JP | 6-232016 | 8/1994 |
| JP | 10-92781 | 4/1998 |
| JP | 10-172939 | 6/1998 |
| JP | 11-238707 | 8/1999 |
| JP | 2000-91292 | 3/2000 |
| JP | 2000-117627 | 4/2000 |
| JP | 2001-38614 | 2/2001 |
| JP | 2001-274121 | 10/2001 |
| WO | 95/31309 | 11/1995 |

OTHER PUBLICATIONS

Chinese Office Action issued Sep. 8, 2006 in corresponding Chinese Application No. 03801220 with English translation.

Chinese Office Action issued Jul. 20, 2007 in corresponding Chinese Application No. 03801220 with English translation.

Written Opinion issued Aug. 26, 2004 and Response to the Written Opinion dated Feb. 28, 2005 in corresponding Singapore Patent Application No. 200307630-4.

Supplementary European Search Report issued Dec. 14, 2009 in EP 03 74 6438.

* cited by examiner

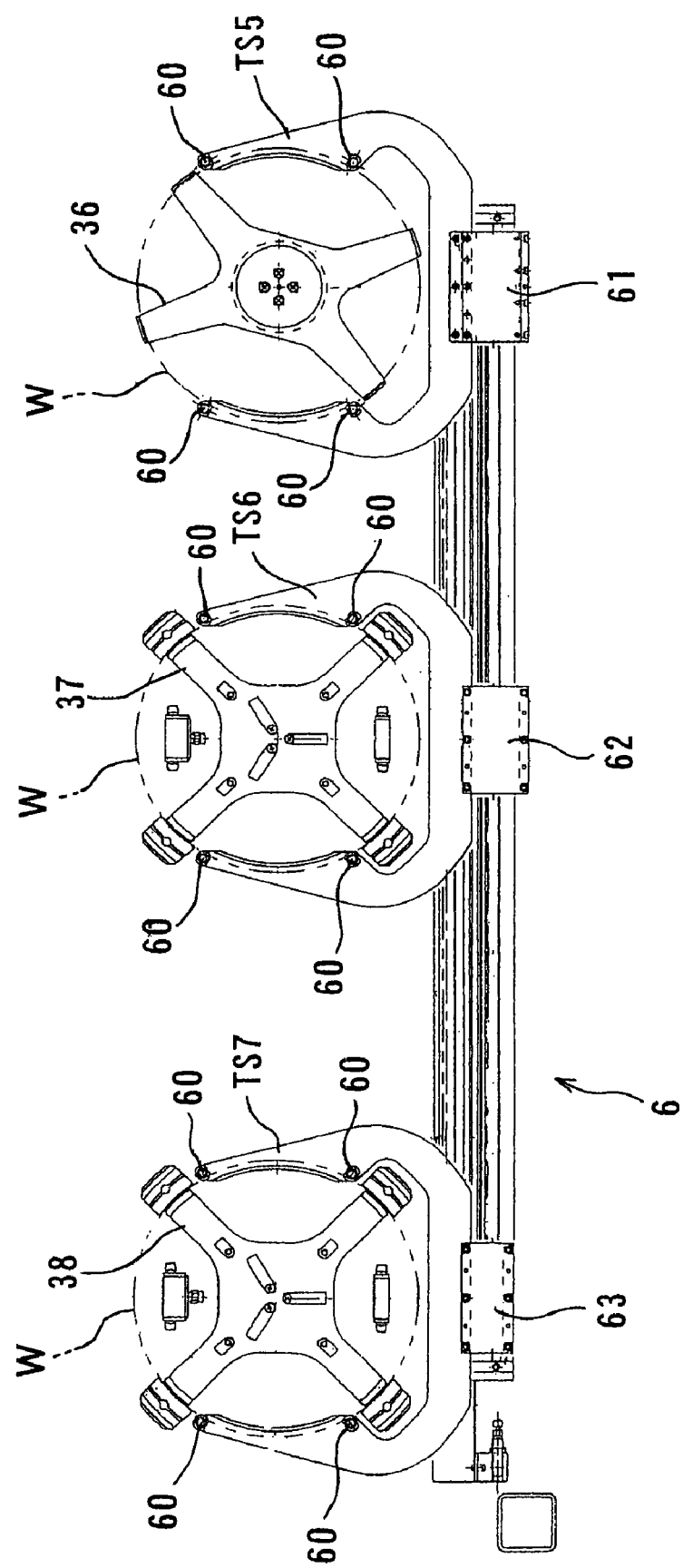

F I G. 1 5
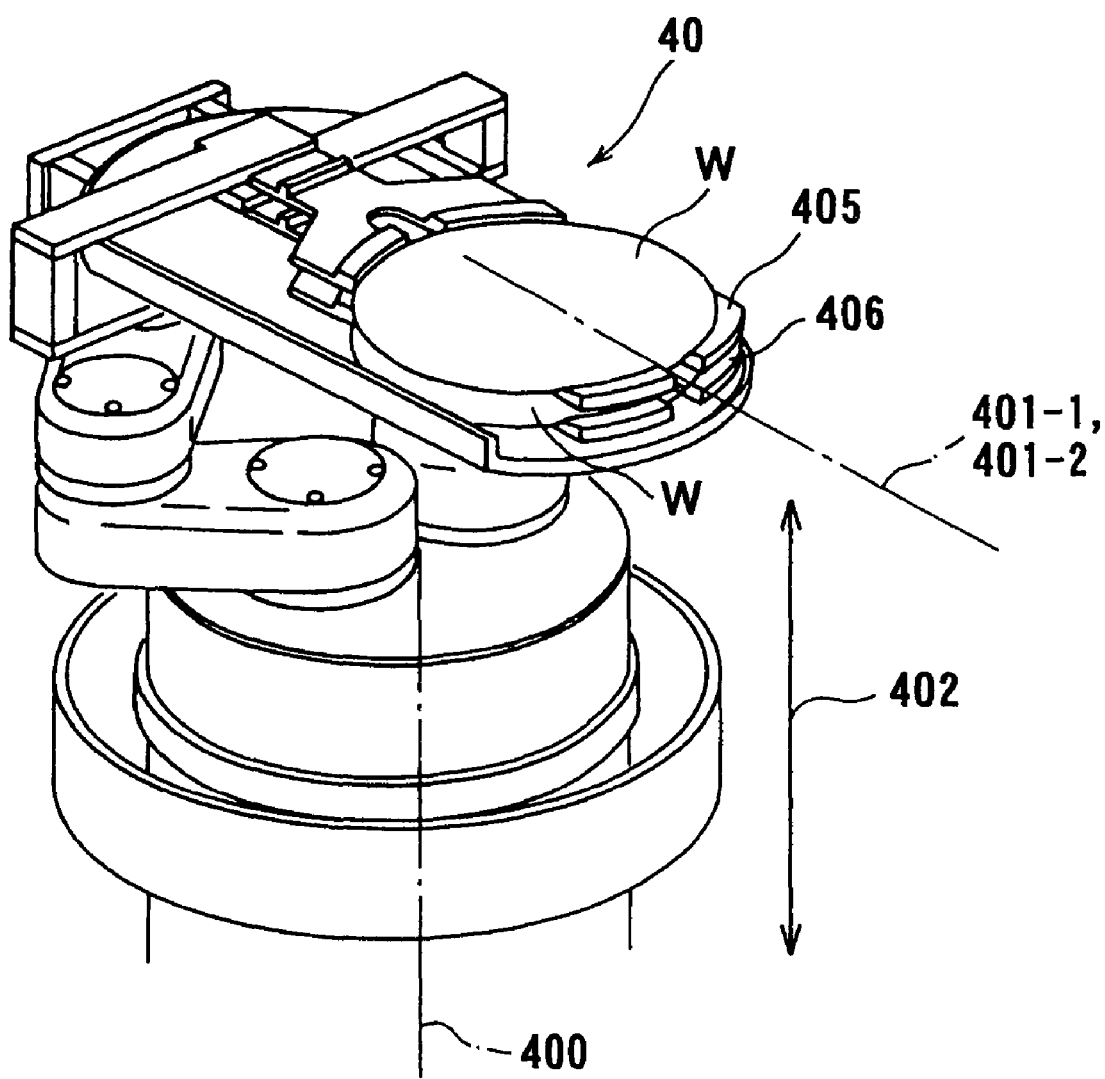

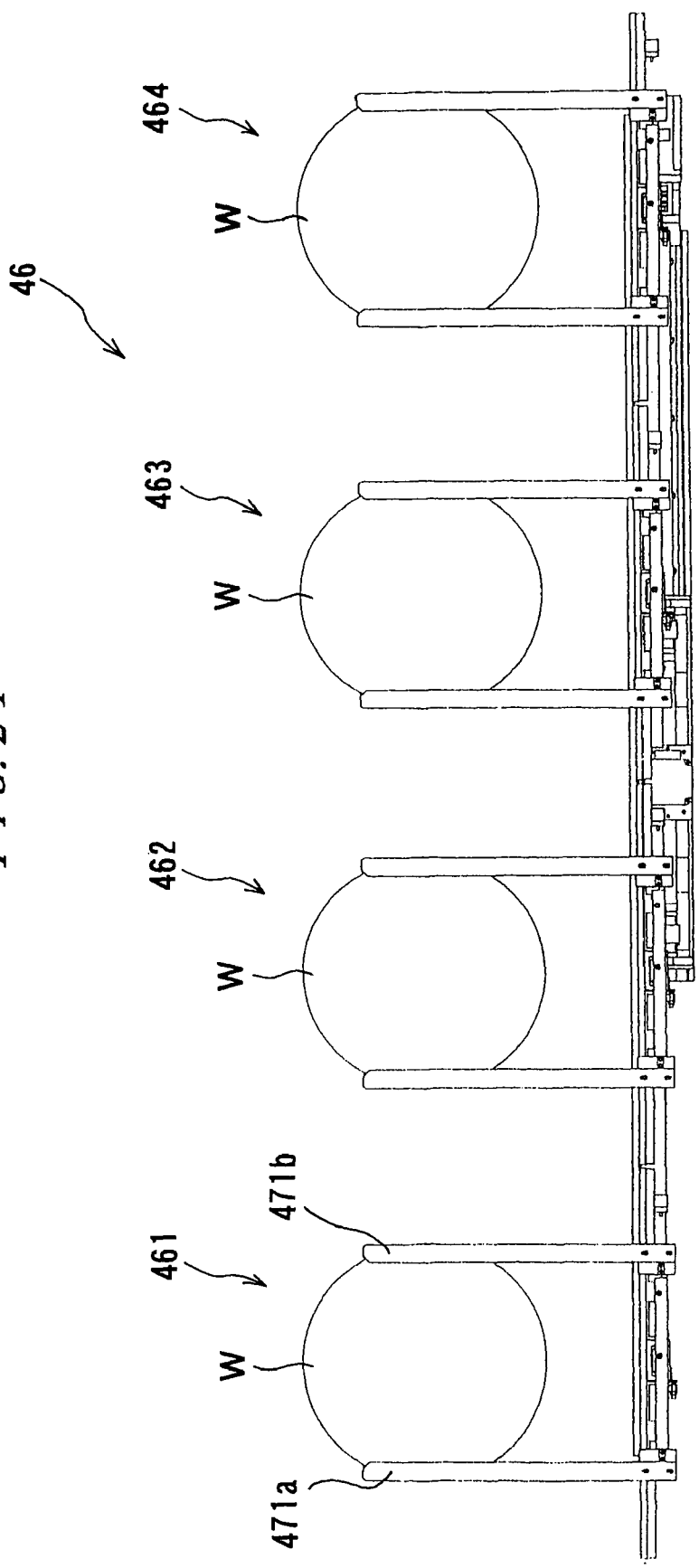

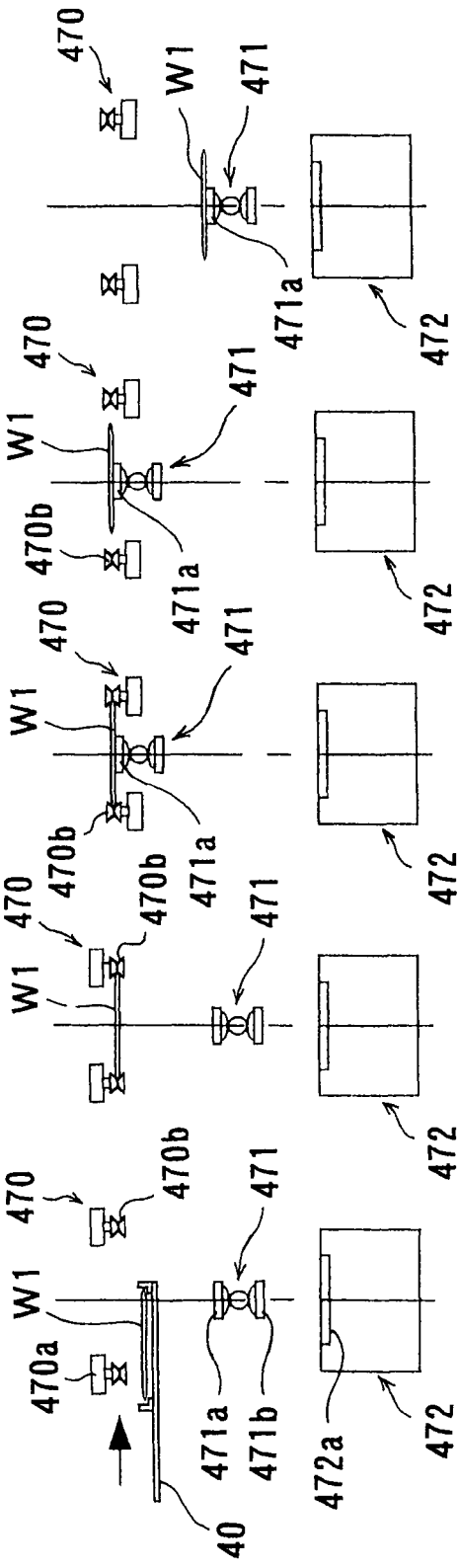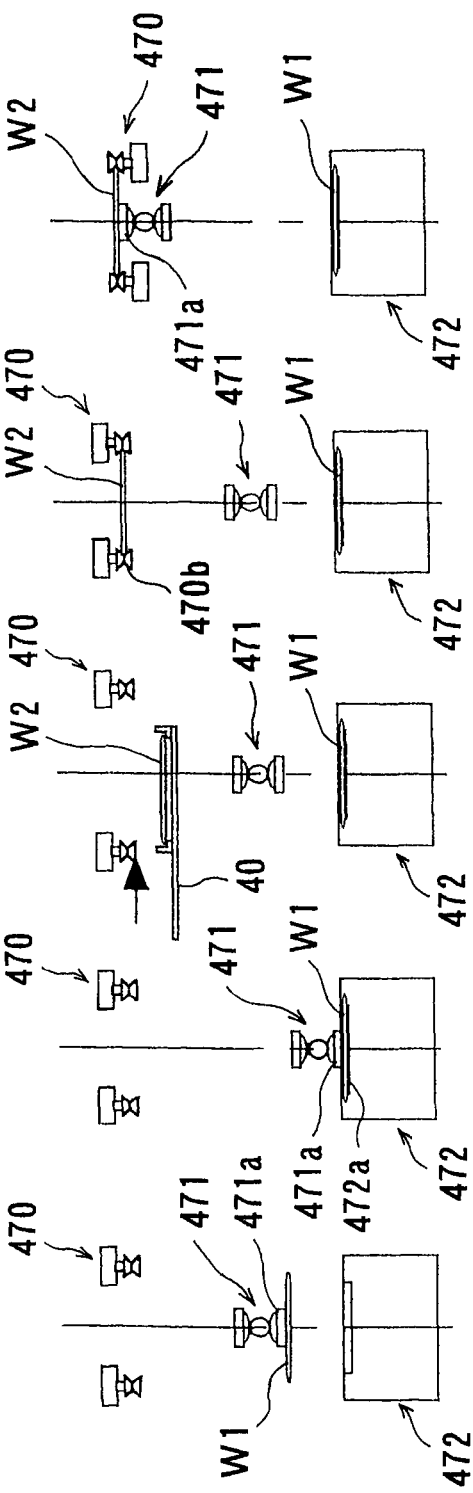

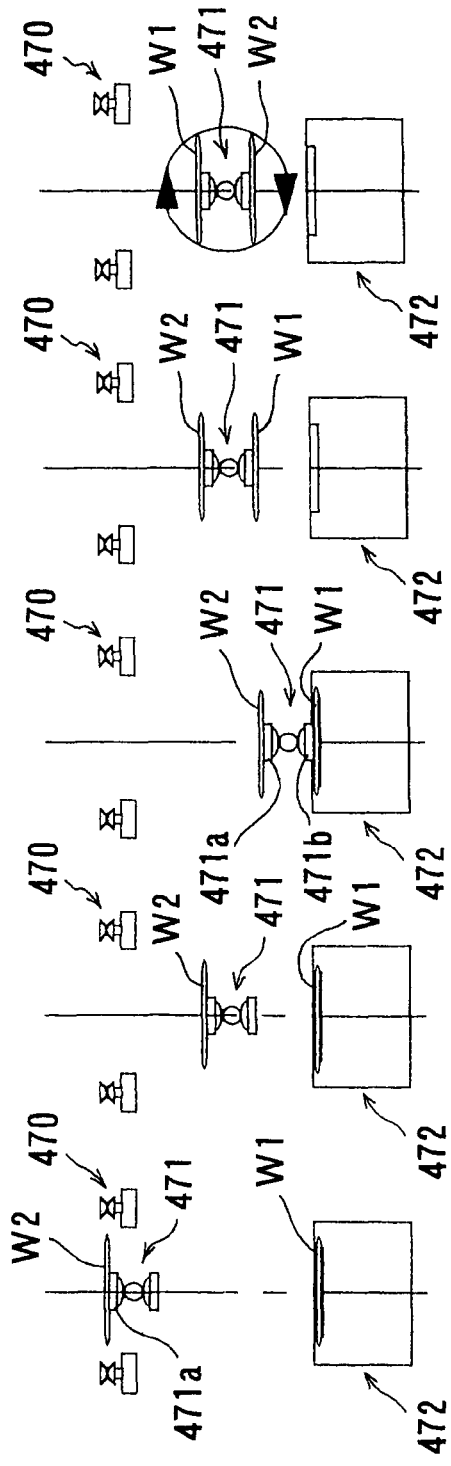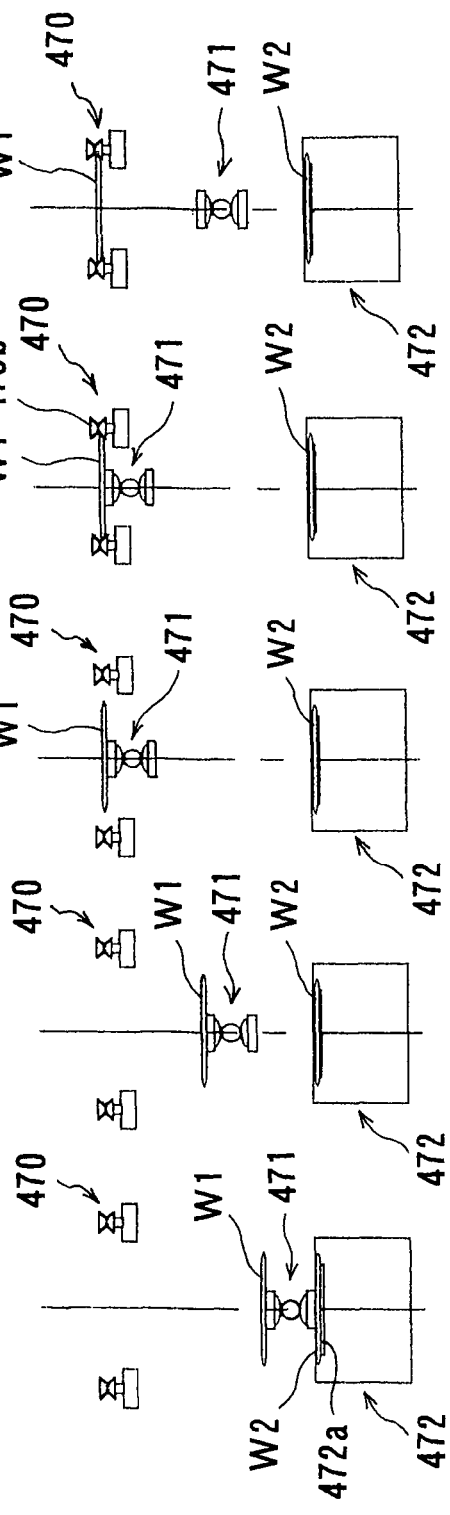

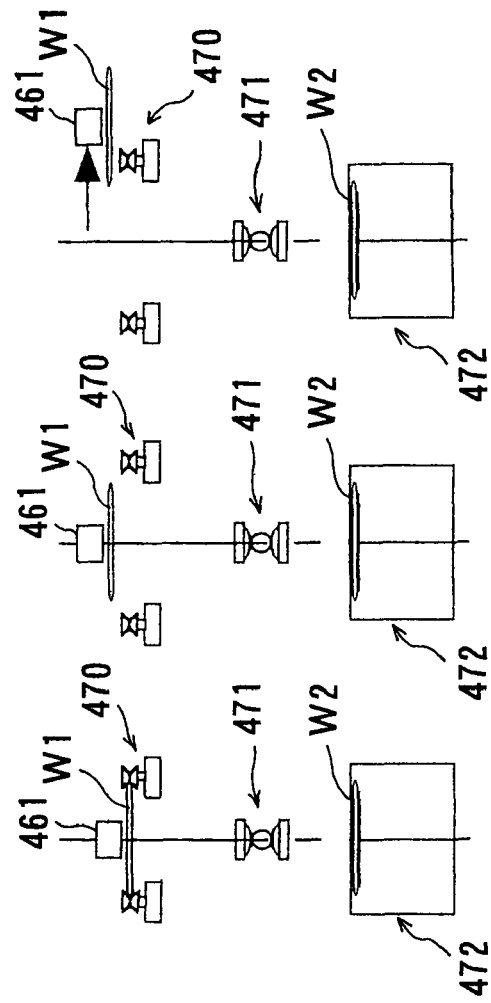
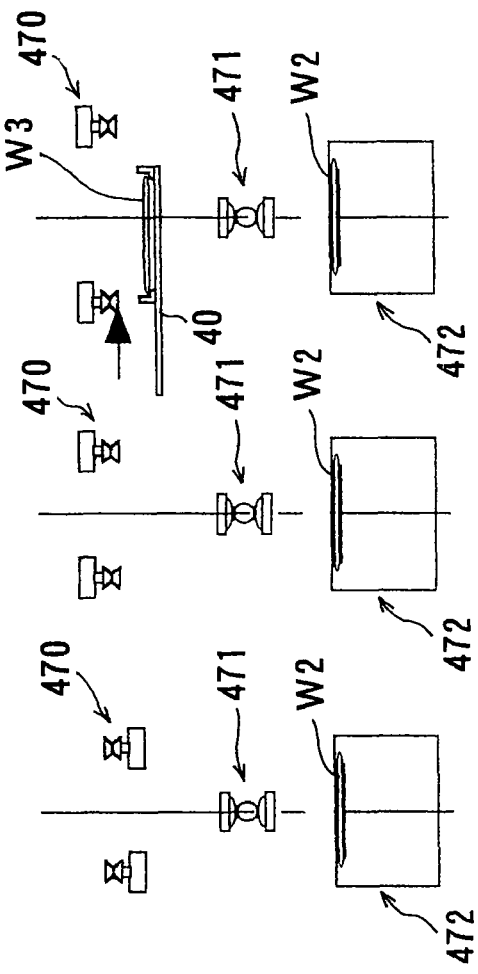

POLISHING DEVICE AND SUBSTRATE PROCESSING DEVICE

TECHNICAL FIELD

The present invention relates to a substrate processing apparatus, and more particularly to a polishing apparatus for polishing a workpiece such as a semiconductor wafer to a flat mirror finish.

BACKGROUND ART

As semiconductor devices have become more highly integrated in recent years, circuit interconnections have become finer and distances between those interconnections have become smaller. In case of photolithography, which can form interconnections that are at most 0.5 µm wide, it is required that surfaces on which pattern images are to be focused by a stepper should be as flat as possible because a depth of focus of an optical system is relatively small. A polishing apparatus for performing chemical mechanical polishing (CMP) has been used as means for planarizing a surface of such a semiconductor wafer.

This type of chemical mechanical polishing (CMP) apparatus comprises a polishing table having a polishing cloth thereon and a top ring. An abrasive liquid is supplied onto a surface of the polishing cloth while a workpiece (wafer) is interposed between the polishing table and the top ring. At the same time, the workpiece is pressed against the polishing table by the top ring to polish a surface of the workpiece to a flat mirror finish.

Recently, there has been known a polishing apparatus having a plurality of polishing units including a polishing table and a top ring. In such a polishing apparatus, receiving/delivering mechanisms (pushers) for receiving and delivering a wafer are provided at wafer receiving/delivering positions for respective top rings, and a transfer robot is provided to transfer a wafer between these pushers.

However, in the aforementioned polishing apparatus, since each polishing unit requires a pusher, a large space is required for installing the pushers. Further, a large space is required for moving the transfer robot to transfer the wafer between the pushers, and thus the apparatus becomes larger. Further, because the transfer robot cannot transfer a plurality of wafers at the same time, transfer of a target wafer may be delayed when the transfer robot is used to transfer another wafer in a case where the transfer robot is employed for various purposes. In such a case, processing and transfer of wafers cannot be performed efficiently, so that throughput is lowered.

SUMMARY OF THE INVENTION

The present invention has been made in view of the above drawback of the prior art. It is, therefore, an object of the present invention to provide a polishing apparatus which can reduce a space for the apparatus and can process and transfer a workpiece efficiently to improve throughput. Further, another object of the present invention is to provide a substrate processing apparatus which can reduce a space for the apparatus and can process and transfer a substrate efficiently to improve throughput.

In order to solve the above drawback of the prior art, according to a first aspect of the present invention, there is provided a polishing apparatus having a plurality of polishing units including a polishing table with a polishing surface and a top ring for pressing a workpiece against the polishing surface on the polishing table, the polishing apparatus characterized in that: a moving mechanism for moving the top ring of the polishing unit between a polishing position on the polishing surface and a workpiece receiving/delivering position is provided in each of the polishing units; a linear transferring mechanism is provided for transferring the workpiece between a plurality of transferring positions including the workpiece receiving/delivering positions; and receiving/delivering mechanisms for receiving and delivering the workpiece between the linear transferring mechanism and the top ring are provided at the transferring positions as the workpiece receiving/delivering positions in the linear transferring mechanism.

With such an arrangement, it is not necessary to provide an installation space for receiving/delivering mechanisms (pushers) which is different from a moving space for a transferring mechanism. Therefore, the apparatus can be made compact in size, and a workpiece can be transferred efficiently. When a plurality of transferring positions of a linear transferring mechanism are arranged along a longitudinal direction of the apparatus, the workpiece can linearly be transferred in the longitudinal direction of the apparatus, and a width of the apparatus can be minimized. Therefore, a space for the apparatus in its entirety can be reduced efficiently.

According to a preferred aspect of the present invention, the plurality of polishing units are arranged along a longitudinal direction of the apparatus, and the plurality of transferring positions in the linear transferring mechanism are arranged along the longitudinal direction of the apparatus.

A polishing apparatus for polishing a workpiece such as a semiconductor wafer is provided in a clean room. In view of cleanliness of the clean room, a polishing apparatus generally has a structure extending from a loading/unloading section of a workpiece in a longitudinal direction, and a plurality of polishing apparatuses are disposed adjacent to each other in a width direction of the apparatus. In such a case, when a plurality of transferring positions in the linear transferring mechanism are arranged along the longitudinal direction of the apparatus to linearly transfer the workpiece in the longitudinal direction, i.e., in a direction of an array of the polishing units, a width of the apparatus can be minimized. Therefore, a space for the apparatus in its entirety can be reduced efficiently.

According to a preferred aspect of the present invention, the linear transferring mechanism comprises a plurality of transfer stages for transferring the workpiece. With a plurality of transfer stages, a plurality of workpieces can simultaneously be transferred to efficiently process and transfer workpieces, thereby improving throughput.

According to a preferred aspect of the present invention, the plurality of transfer stages include an upper transfer stage and a lower transfer stage.

According to a preferred aspect of the present invention, the transferring positions in the linear transferring mechanism include at least one transferring position in addition to the workpiece receiving/delivering positions.

For example, when a workpiece is polished in two polishing units X and Y, transferring steps mainly include the following three steps.

(1) Transferring from a position of a workpiece to be polished to a receiving/delivering position for the polishing unit X (2) Transferring from the receiving/delivering position for the polishing unit X to a receiving/delivering position for the polishing unit Y (3) Transferring from the receiving/delivering position for the polishing unit Y to a position of a polished workpiece When the transferring positions of the linear transferring mechanism comprise only the workpiece receiving/delivering positions, only the above step (2) can be achieved. However, when at least one transferring position is provided in addition to the workpiece receiving/delivering positions for the top rings, this transferring position can serve as a standby position for a workpiece before or after polishing. Therefore, a workpiece can be introduced into the linear transferring mechanism or discharged from the linear transferring mechanism at any timing during polishing in the polishing units X and Y. Thus, efficiency of processing and transferring a workpiece can further be improved. In this case, a standby position for a workpiece before polishing and a standby position for a workpiece after polishing may be the same position or two different positions.

According to a second aspect of the present invention, there is provided a polishing apparatus having a polishing unit including a polishing table with a polishing surface and a top ring for pressing a workpiece against the polishing surface on the polishing table, and a plurality of cleaning devices for cleaning a polished workpiece, the polishing apparatus characterized in that: the plurality of cleaning devices are arranged along a predetermined direction; and the polishing apparatus comprises a transferring mechanism having a holding mechanism for detachably holding the workpiece in respective cleaning devices, a vertically moving mechanism for vertically moving the holding mechanism, and a moving mechanism for moving the holding mechanism in a direction of an array of the cleaning devices. The holding mechanism may clamp a peripheral portion of a workpiece or have a recess to hold a workpiece. A vacuum chuck may be used as the holding mechanism.

With such an arrangement, as with the linear transferring mechanism, by providing a transferring mechanism for transferring workpieces in the respective cleaning devices in a direction of an array of the cleaning devices, a space required for transferring workpieces between the cleaning devices can be minimized.

According to a preferred aspect of the present invention, the cleaning devices are partitioned by partition walls; openings for allowing the holding mechanism of the transferring mechanism to pass therethrough are formed in the partition walls; and shutters capable of opening and closing are provided at the openings in the partition walls.

With such an arrangement, the holding mechanism of the transferring mechanism can be moved vertically within the cleaning devices. Specifically, a workpiece has heretofore been taken out of a cleaning device and then introduced and transferred into a next cleaning device. However, according to the present invention, a workpiece can be transferred to the next cleaning device within a cleaning device without being taken out of the cleaning device. Thus, workpieces can be transferred more rapidly and prevented from contacting an external atmosphere because the workpieces do not need to be taken out of the cleaning devices.

According to a preferred aspect of the present invention, the transferring mechanism comprises a holding mechanism for each cleaning device. When the transferring mechanism comprises the holding mechanism for each cleaning device, a plurality of workpieces can simultaneously be transferred to efficiently process and transfer the workpieces, thereby improving throughput.

According to a preferred aspect of the present invention, the moving mechanism of the transferring mechanism moves the holding mechanism to a standby position of a workpiece to be cleaned or a cleaned workpiece. With such an arrangement, since a workpiece to be cleaned or a cleaned workpiece can stand by at the standby position, efficiency of processing and transferring workpieces can further be improved.

According to a third aspect of the present invention, there is provided a polishing apparatus characterized by comprising: a plurality of wafer cassettes arranged along a predetermined direction; a first transferring mechanism movable in a direction of an array of the wafer cassettes; a plurality of polishing units arranged in a predetermined direction, each of the polishing units including a polishing table with a polishing surface and a top ring for pressing a wafer against the polishing surface on the polishing table; a second transferring mechanism for transferring the wafer between a plurality of transferring positions along a direction of an array of the plurality of polishing units; a first receiving/delivering mechanism disposed at a position to which the first transferring mechanism and the second transferring mechanism are accessible for receiving and delivering the wafer between the first transferring mechanism and the second transferring mechanism; a plurality of cleaning devices arranged in a predetermined direction; a third transferring mechanism for transferring the wafer along a direction of an array of the plurality of cleaning devices; and a second receiving/delivering mechanism disposed at a position to which the second transferring mechanism and the third transferring mechanism are accessible for receiving and delivering the wafer between the second transferring mechanism and the third transferring mechanism.

According to a preferred aspect of the present invention, a reversing machine for reversing the wafer is disposed above the first receiving/delivering mechanism.

According to a preferred aspect of the present invention, a loading/unloading section, a polishing section for polishing a wafer, and a cleaning section for cleaning the wafer polished in the polishing section are partitioned by partition walls; and the first transferring mechanism is disposed in the loading/unloading section, the second transferring mechanism is disposed in the polishing section, and the third transferring mechanism is disposed in the cleaning section.

According to a preferred aspect of the present invention, openings for allowing the wafer to pass therethrough are formed in the partition walls; and shutters capable of opening and closing are provided at the openings in the partition walls.

According to a preferred aspect of the present invention, the loading/unloading section, the polishing section, and the cleaning section are assembled independently of each other.

According to a preferred aspect of the present invention, air is discharged from the loading/unloading section, the polishing section, and the cleaning section independently of each other. Further, air may be discharged from the plurality of polishing units independently of each other. Air may be discharged from the plurality of cleaning devices independently of each other.

According to a preferred aspect of the present invention, the transferring positions of the second transferring mechanism include workpiece receiving/delivering positions for the top rings in the polishing units; and a third receiving/delivering mechanism for receiving and delivering the wafer between the second transferring mechanism and the top rings is disposed at the transferring positions as the workpiece receiving/delivering positions.

According to a preferred aspect of the present invention, a film thickness measuring device for measuring a film thickness of the wafer is disposed between the second receiving/delivering mechanism and the cleaning devices.

According to a preferred aspect of the present invention, a transferring direction of the wafer in the second transferring mechanism and a transferring direction of the wafer in the third transferring mechanism are parallel with each other.

According to a preferred aspect of the present invention, a transferring direction of the wafer in the second transferring mechanism and a transferring direction of the wafer in the third transferring mechanism are opposite to each other.

According to a preferred aspect of the present invention, the second transferring mechanism comprises a linear transferring mechanism.

According to a preferred aspect of the present invention, a transferring direction of the wafer in the first transferring mechanism and a transferring direction of the wafer in the second transferring mechanism are substantially perpendicular to each other.

According to a fourth aspect of the present invention, there is provided a substrate processing apparatus having a plurality of substrate processing units including a substrate holding portion for holding a substrate, the substrate processing apparatus characterized in that: a moving mechanism for moving the substrate holding portion of the substrate processing unit between a predetermined position within the substrate processing unit and a substrate receiving/delivering position is provided in each substrate processing unit; a linear transferring mechanism is provided for transferring the substrate between a plurality of transferring positions including the substrate receiving/delivering positions; and a receiving/delivering mechanism for receiving and delivering the substrate between the linear transferring mechanism and the substrate holding portions of the substrate processing units is provided at the transferring positions as the substrate receiving/delivering positions in the linear transferring mechanism.

According to a fifth aspect of the present invention, there is provided a substrate processing apparatus having a substrate processing unit including a substrate holding portion for holding a substrate, and a plurality of cleaning devices for cleaning a processed substrate, the substrate processing apparatus characterized in that: the plurality of cleaning devices are arranged along a predetermined direction; and the substrate processing apparatus comprises a transferring mechanism having a holding mechanism for detachably holding the workpiece in respective cleaning devices, a vertically moving mechanism for vertically moving the holding mechanism, and a moving mechanism for moving the holding mechanism in a direction of an array of the cleaning devices.

According to a sixth aspect of the present invention, there is provided a substrate processing apparatus, characterized by comprising: a plurality of wafer cassettes arranged along a predetermined direction; a first transferring mechanism movable in a direction of an array of the wafer cassettes; a plurality of polishing units arranged in a predetermined direction, each of the polishing units including a substrate holding portion for holding a substrate; a second transferring mechanism for transferring the substrate between a plurality of transferring positions along a direction of an array of the plurality of polishing units; a first receiving/delivering mechanism disposed at a position to which the first transferring mechanism and the second transferring mechanism are accessible for receiving and delivering the substrate between the first transferring mechanism and the second transferring mechanism; a plurality of cleaning devices arranged in a predetermined direction; a third transferring mechanism for transferring the wafer along a direction of an array of the plurality of cleaning devices; and a second receiving/delivering mechanism disposed at a position to which the second transferring mechanism and the third transferring mechanism are accessible for receiving and delivering the substrate between the second transferring mechanism and the third transferring mechanism.

According to a seventh aspect of the present invention, there is provided a substrate processing apparatus having a transferring mechanism for transferring a substrate, characterized in that: the transferring mechanism comprises a plurality of transfer stages for transferring the substrate between a plurality of transferring positions; a shaft is inserted into a driving transfer stage driven by a driving mechanism; a driven transfer stage is fixed to an end of the shaft; and a stopper for positioning the driven transfer stage is provided at a transferring position for the driven transfer stage.

With such an arrangement, when the driven transfer stage is to be moved over the transferring position provided with the stopper, the driven transfer stage is restricted by the stopper. Therefore, the driven transfer stage is accurately positioned at the transferring position. When respective transfer stages have different strokes of movement, movement of the respective transfer stages can be controlled by driving mechanisms provided in the respective transfer stages. However, such driving mechanisms cause the apparatus to become large. According to the present invention, a plurality of transfer stages can simultaneously be moved and accurately positioned by one driving mechanism.

According to an eighth aspect of the present invention, there is provided a substrate processing apparatus having a film thickness measuring device for measuring a film thickness of a substrate, the substrate processing apparatus characterized in that: the film thickness measuring device comprises a reversing and holding mechanism for holding and reversing the substrate, a film thickness measuring unit disposed substantially in a vertical direction with respect to the reversing and holding mechanism, and a transferring mechanism for transferring the substrate between the reversing and holding mechanism and the film thickness measuring unit.

According to a preferred aspect of the present invention, the transferring mechanism comprises a plurality of holding portions for holding the substrate.

According to a preferred aspect of the present invention, the transferring mechanism is arranged so as to be vertically reversible.

According to a preferred aspect of the present invention, at least one of the plurality of holding portions comprises a suction holding portion for attracting the substrate under vacuum suction.

According to a ninth aspect of the present invention, there is provided a substrate processing apparatus having a reversing machine for reversing a substrate, the substrate processing apparatus characterized in that: the reversing machine comprises a holding mechanism for holding the substrate, a rotational mechanism for rotating the substrate held by the holding mechanism, and a sensor for detecting a notch or an orientation flat formed in the substrate; and rotational positioning of the substrate is performed based on a detected result of the sensor.

According to a preferred aspect of the present invention, the reversing machine comprises a sensor for recognizing a code on the substrate.

According to a preferred aspect of the present invention, the holding mechanism of the reversing machine comprises at least three rotatable pins for holding the substrate, and rotational positioning of the substrate is performed by controlling rotation of at least one of the pins.

According to a preferred aspect of the present invention, the holding mechanism of the reversing machine comprises a vacuum suction portion for attracting the substrate under vacuum suction and rotating the substrate, and rotational positioning of the substrate is performed by controlling rotation of the vacuum suction portion.

According to a tenth aspect of the present invention, there is provided a polishing apparatus having a polishing table with a polishing surface, and a top ring for pressing a workpiece against the polishing surface on the polishing table, the polishing apparatus characterized in that: a sensor for detecting a notch or an orientation flat of the substrate held by the top ring is disposed below the top ring; and rotational positioning of the substrate is performed based on a detected result of the sensor.

BRIEF DESCRIPTION OF DRAWINGS

FIG. 13 is a plan view of FIG. 12;

FIG. 15 is a perspective view showing a second transfer robot in the polishing apparatus shown in FIG. 1;

FIG. 21 is a plan view of FIG. 19;

FIGS. 24A through 24J are views explanatory of operation of a film thickness measuring device provided instead of a reversing machine in a cleaning section;

FIGS. 25A through 25J are views explanatory of operation of the film thickness measuring device provided instead of a reversing machine in a cleaning section;

FIGS. 26A through 26F are views explanatory of operation of the film thickness measuring device provided instead of a reversing machine in a cleaning section;

DETAILED DESCRIPTION OF THE PREFERRED EMBODIMENTS

Figure 1:
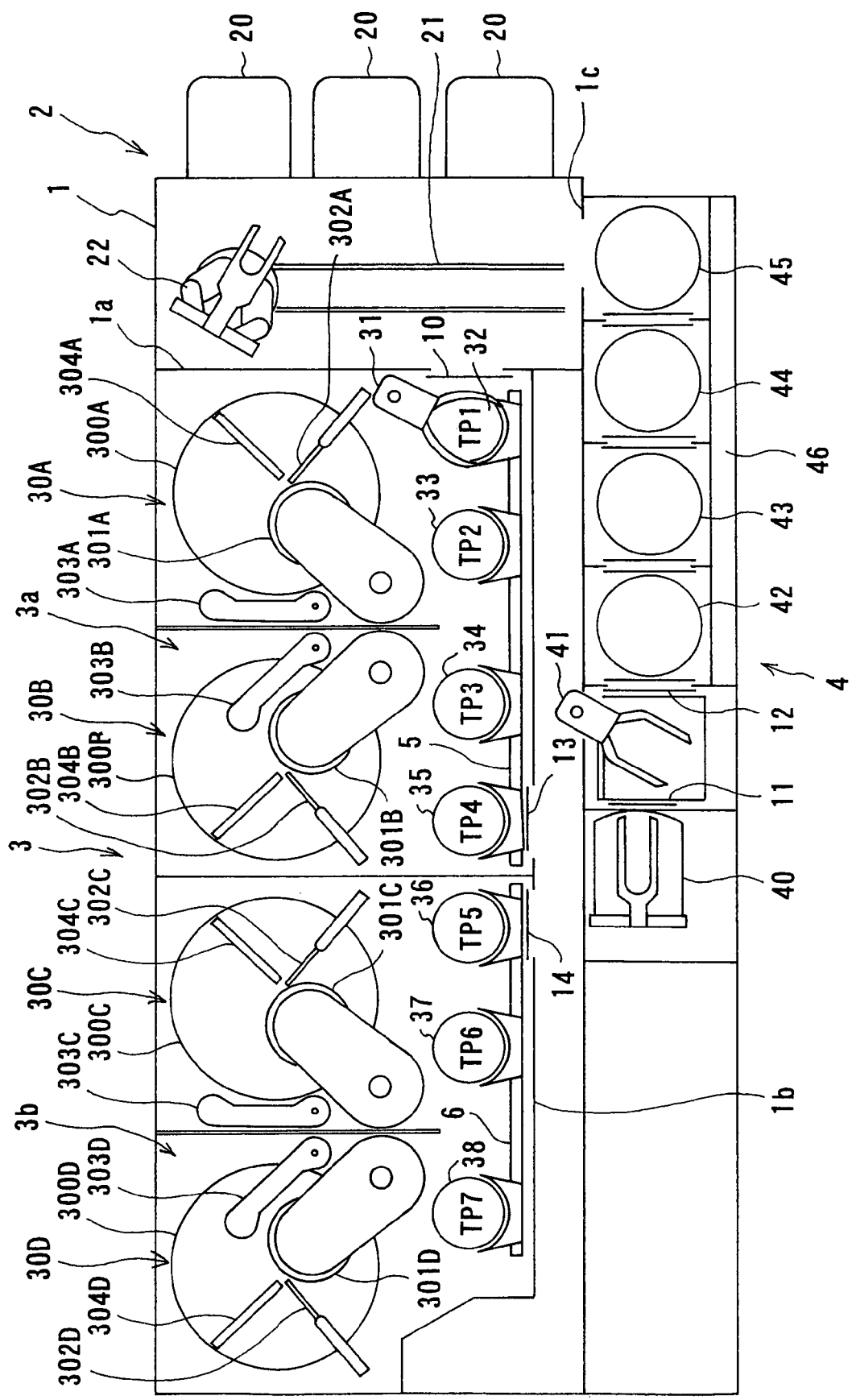
FIG. 1 is a plan view showing an entire arrangement of a polishing apparatus according to an embodiment of the present invention.
Figure 2:
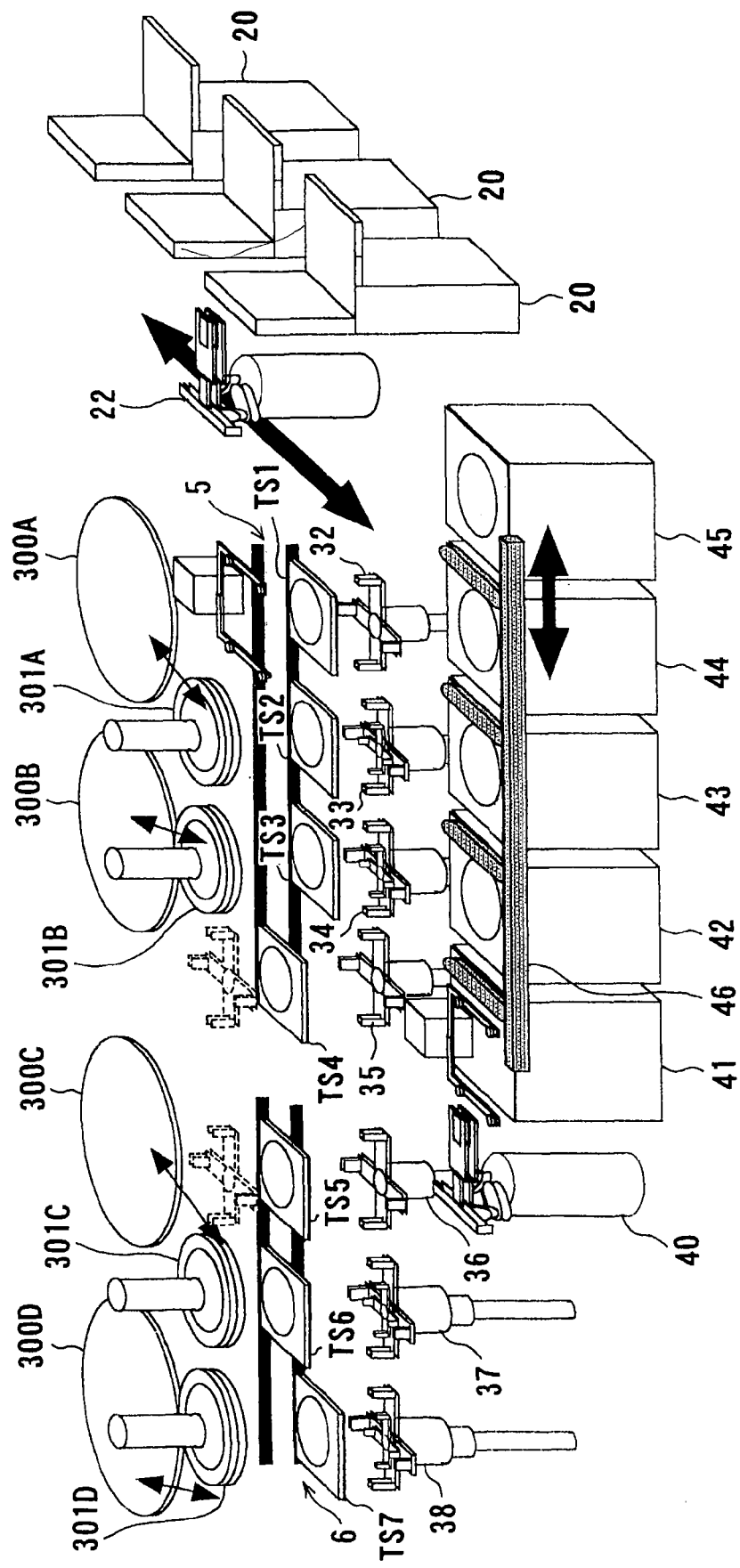
FIG. 2 is a perspective view showing an outline of the polishing apparatus shown in FIG. 1.

A polishing apparatus according to embodiments of the present invention will be described below in detail with reference to the accompanying drawings. FIG. 1 is a plan view showing an entire arrangement of a polishing apparatus according to an embodiment of the present invention, and FIG. 2 is a perspective view showing an outline of the polishing apparatus shown in FIG. 1. As shown in FIG. 1, the polishing apparatus in the present embodiment has a housing 1 in a rectangular form, and an interior of the housing 1 is divided into a loading/unloading section 2, a polishing section 3 (3a, 3b), and a cleaning section 4 by partition walls 1a, 1b, and 1c. The loading/unloading section 2, the polishing sections 3a, 3b, and the cleaning section 4 are assembled independently of each other, and air is discharged from these sections independently of each other.

The loading/unloading section 2 has at least two front loading portions 20 (three in the present embodiment) on which a wafer cassette which stores a number of semiconductor wafers is placed. The front loading portions 20 are arranged adjacent to each other along a width direction of the polishing apparatus (a direction perpendicular to a longitudinal direction of the polishing apparatus). The front loading portions 20 can receive thereon an open cassette, an SMIF (Standard Manufacturing Interface) pod, or a FOUP (Front Opening Unified Pod). The SMIF and FOUP have a hermetically sealed container which houses a wafer cassette therein and covers it with a partition wall so as to maintain an interior of the container as an environment independent of an external space.

Further, the loading/unloading section 2 has a moving mechanism 21 extending in a direction along which the front loading portions 20 are arranged, and a first transfer robot 22 capable of moving in a direction along which the wafer cassettes are arranged is provided on the moving mechanism 21 as a first transfer mechanism. The first transfer robot 22 is accessible to the wafer cassettes mounted on the front loading portions 20 by moving on the moving mechanism 21. The first transfer robot 22 has two hands including an upper hand and a lower hand. For example, the upper hand is used for returning a semiconductor wafer to a wafer cassette, and the lower hand is used for transferring a semiconductor wafer before being polished. Thus, the upper and lower hands can be used for different purposes.

Because the loading/unloading section 2 needs to be maintained as a cleanest area, an interior of the loading/unloading section 2 is continuously maintained at a pressure higher than any one of pressures of an exterior of the apparatus, the polishing section 3, and the cleaning section 4. Further, a filter fan unit (not shown) having a clean air filter such as HEPA filter or ULPA filter is provided above the moving mechanism 21 of the first transfer robot 22, and clean air from which particles, toxic steam, and toxic gas have been removed by the filter fan unit is continuously ejected in a downward direction.

The polishing section 3 serves as an area for polishing a semiconductor wafer and comprises a first polishing section 3a having a first polishing unit 30A and a second polishing unit 30B, and a second polishing section 3b having a third polishing unit 30C and a fourth polishing unit 30D. As shown in FIG. 1, the first polishing unit 30A, the second polishing unit 30B, the third polishing unit 30C, and the fourth polishing unit 30D are arranged along the longitudinal direction of the polishing apparatus.

As shown in FIG. 1, the first polishing unit 30A comprises a polishing table 300A having a polishing surface thereon, a top ring 301A for holding a semiconductor wafer and pressing the semiconductor wafer against the polishing table 300A to polish the wafer, a polishing liquid supply nozzle 302A for supplying a polishing liquid or a dressing liquid (e.g., water) onto the polishing table 300A, a dresser 303A for dressing the polishing table 300A, and an atomizer 304A having at least one nozzle for ejecting a mixture of a liquid (e.g., pure water) and a gas (e.g., nitrogen) in an atomized state toward the polishing surface. Similarly, the second polishing unit 30B comprises a polishing table 300B, a top ring 301B, a polishing liquid supply nozzle 302B, a dresser 303B, and an atomizer 304B. The third polishing unit 30C comprises a polishing table 300C, a top ring 301C, a polishing liquid supply nozzle 302C, a dresser 303C, and an atomizer 304C. The fourth polishing unit 30D comprises a polishing table 300D, a top ring 301D, a polishing liquid supply nozzle 302D, a dresser 303D, and an atomizer 304D.

A first linear transporter 5 is disposed between the first polishing unit 30A and the second polishing unit 30B in the first polishing section 3a and the cleaning section 4, as a second (linear) transferring mechanism for transferring a wafer between four transferring positions located along the longitudinal direction (a first transferring position TP1, a second transferring position TP2, a third transferring position TP3, and a fourth transferring position TP4 in order from the loading/unloading section 2). A reversing machine 31 for reversing a wafer received from the first transfer robot 22 of the loading/unloading section 2 is disposed above the first transferring position TP1 of the first linear transporter 5, and a vertically movable lifter 32 is disposed below the first transferring position TP1. A vertically movable pusher 33 is disposed below the second transferring position TP2, a vertically movable pusher 34 is disposed below the third transferring position TP3, and a vertically movable lifter 35 is disposed below the fourth transferring position TP4.

A second linear transporter 6 is disposed in the second polishing section 3b adjacent to the first linear transporter 5 as a second (linear) transferring mechanism for transferring a wafer between three transferring positions located along the longitudinal direction (a fifth transferring position TP5, a sixth transferring position TP6, and a seventh transferring position TP7 in order from the loading/unloading section 2). A vertically movable lifter 36 is disposed below the fifth transferring position TP5 of the second linear transporter 6, a pusher 37 is disposed below the sixth transferring position TP6, and a pusher 38 is disposed below the seventh transferring position TP7.

As can be understood from the fact that slurry is used at a time of polishing, the polishing section 3 is a dirtiest area. Therefore, air is discharged around respective polishing tables so as to prevent particles in the polishing section 3 from scattering. A pressure of an interior of the polishing section 3 is made lower than pressures of the exterior of the apparatus, surrounding cleaning section 4, and the loading/unloading section 2 to prevent scattering of particles. Usually, discharging ducts (not shown) are provided below the polishing tables, and filters (not shown) are provided above the polishing tables when the apparatus is installed in any space other than a clean room. Clean air in the clean room is ejected through the discharging ducts, or cleaned air is ejected through the filters to form a downward flow.

The cleaning section 4 serves as an area for cleaning a semiconductor wafer which has been polished. The cleaning section 4 comprises a second transfer robot 40, a reversing machine 41 for reversing a wafer received from the second transfer robot 40, four cleaning devices 42-45 for cleaning a semiconductor wafer which has been polished, and a transfer unit 46 serving as a third transferring mechanism for transferring a wafer between the reversing machine 41 and the cleaning devices 42-45. The second transfer robot 40, the reversing machine 41, and the cleaning devices 42-45 are arranged in series along the longitudinal direction. Filter fan units (not shown) having a clean air filter are provided above the cleaning devices 42-45 so as to continuously eject clean air, from which particles have been removed, in a downward direction. Further, an interior of the cleaning section 4 is continuously maintained at a pressure higher than that of the polishing section 3 to prevent particles from flowing from the polishing section 3 into the cleaning section 4.

Figure 3A:
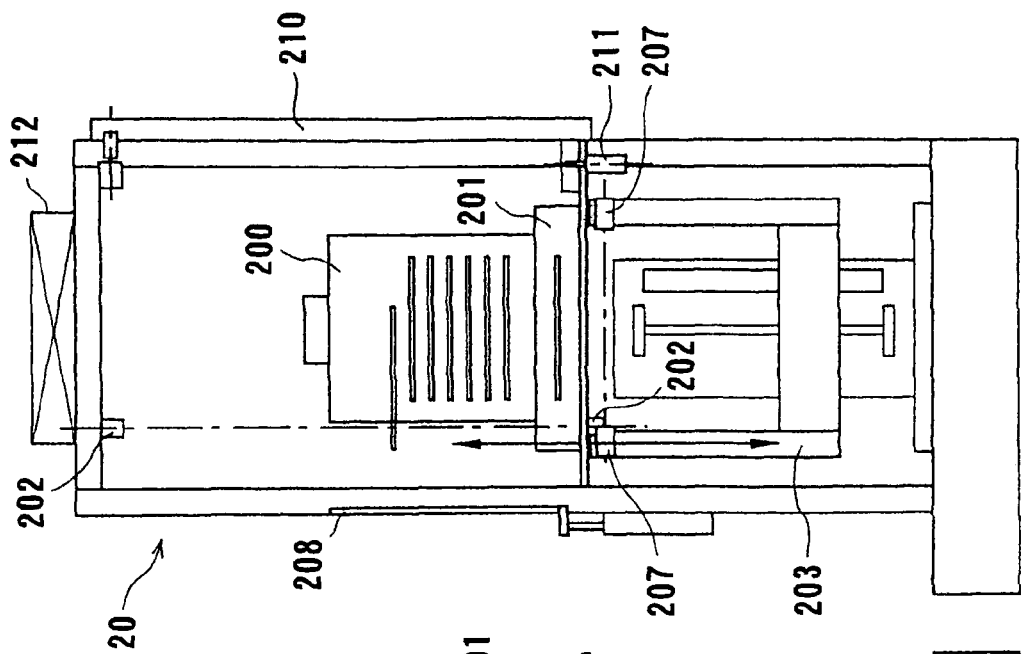
FIGS. 3A and 3B are views showing front loading portions in the polishing apparatus shown in FIG. 1, with FIG. 3A being a front view, and FIG. 3B being a side view.
Figure 3B:
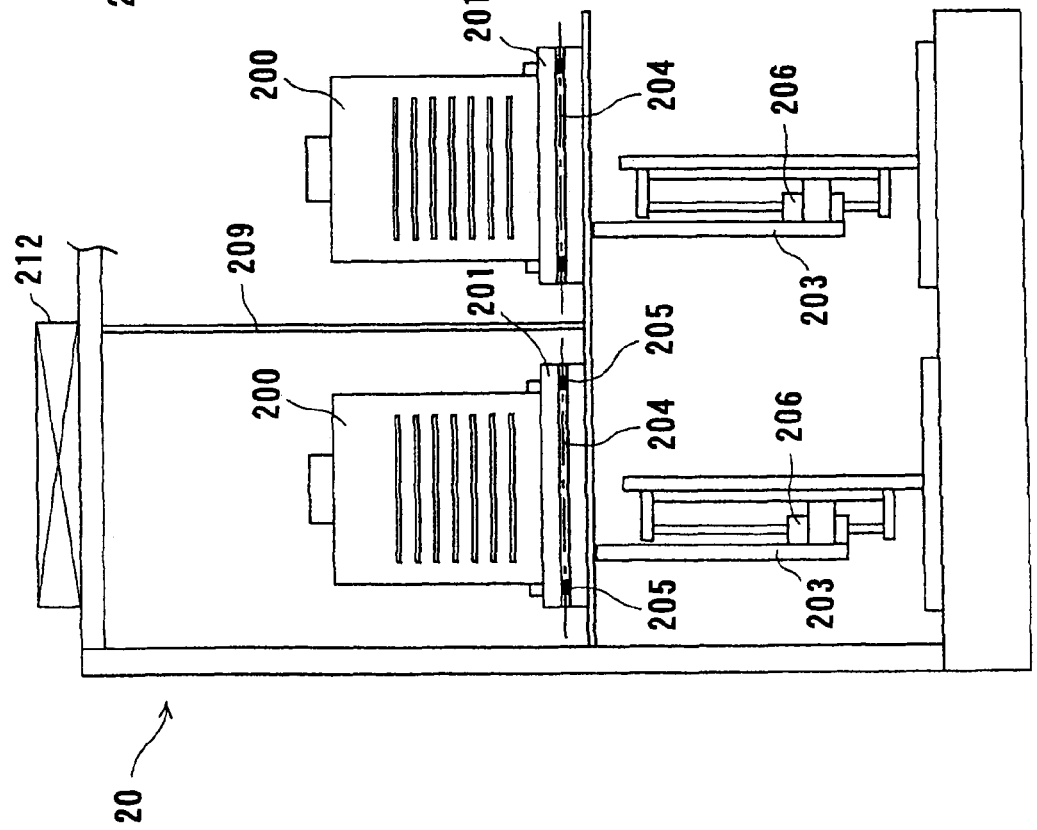

The front loading portions 20 of the loading/unloading sections 2 will be described below. FIGS. 3A and 3B are views showing the front loading portions 20. FIG. 3A is a front view, and FIG. 3B is a side view. As shown in FIGS. 3A and 3B, each front loading portion 20 has a loading/unloading stage 201 for mounting a wafer cassette 200 on the apparatus. The loading/unloading stage 201 has a positioning mechanism in the form of a block configured to match a shape of a lower portion of the wafer cassette 200. Therefore, the cassette is held in the same position whenever the cassette is placed on the loading/unloading sections 201. Presence of the wafer cassette 200 is detected by a button-type sensor when the wafer cassette 200 is placed in a proper position. Transmission optical sensors 202 are disposed above and below the cassette 200 so that light between the transmission optical sensors 202 is blocked by a wafer that projects from the cassette 200 by a predetermined length to detect projection of the wafer and determine whether wafers are properly received in respective slots of the cassette 200. If projection of a wafer is detected, then an interlocking mechanism is operated to control the first transfer robot 22, a searching mechanism 203, and the like so as not to access the front loading portion 20. Analysis of an image obtained by a CCD camera may be utilized to detect projection of a wafer, or alternatively a reflection-type sensor which detects reflected light from an end surface of a wafer into which light is emitted may be utilized to detect projection of a wafer.

Dummy wafer stations 204 are disposed below respective loading/unloading stages 201. Each of the dummy wafer stations 204 can receive at least one wafer placed thereon, and, for example, a dummy wafer used for stabilizing a polishing surface before a product wafer is processed, or a QC (Quality Control) wafer to be transferred for obtaining conditions of the polishing apparatus may be held in the dummy wafer stations 204. Each dummy wafer station 204 has sensors 205 provided therein for detecting presence of a wafer, and thus the sensors 205 can detect whether a wafer is held in the dummy wafer station 204. When no cassette 200 is placed on the loading/unloading stage 201, the loading/unloading stage 201 located above the station may be lifted to place a wafer manually on the dummy wafer station 204. According to a standard procedure, a cassette 200 having wafers inserted therein is placed on any one of the loading/unloading stages 201, and then searching of the wafers is performed. Thereafter, a control panel sends commands indicating which wafer is to be delivered to each dummy wafer station 204. A selected wafer is delivered from the cassette 200 to the dummy wafer station 204 by the first transfer robot 22, which is accessible to the cassette 200 and the dummy wafer station 204. Alternatively, a dummy wafer may be placed on one of the front loading portions 20, which then serves as a dummy wafer station. Wafer searching mechanisms 203 are disposed below the respective loading/unloading sections 201. (If dummy wafer stations are provided, the wafer searching mechanisms 203 are disposed below the dummy wafer stations.) Each wafer searching mechanism 203 is vertically movable by a driving source (pulse motor) 206 and has wafer searching sensors 207 mounted on tip ends thereof. When the wafer searching mechanisms 203 are not in operation for wafer searching, the wafer searching mechanisms 203 are held in a standby position, which is within the apparatus, in order not to interfere with other operating members. The wafer searching sensors 207 are disposed in confronting relation to each other such that light traveling between the wafer searching sensors 207 passes horizontally through the cassette 200 as viewed from a side of the front loading portions 20. A wafer searching operation is performed as follows. The wafer searching mechanism 203 moves upward from a position below the dummy wafer station 204 to a position above a final slot in the cassette 200, and then moves downward to a position below the dummy wafer station 204. During this movement, the wafer searching sensors 207 count a number of times that light is interrupted by a wafer, thereby counting a number of wafers. At that time, the wafer searching mechanism 203 determines positions of the wafers based on pulses of the pulse motor 206 as a driving source, thereby determining into which slots in the wafer cassette 200 the wafers are inserted. The wafer searching mechanism 203 also has an oblique wafer detecting function, which detects an obliquely inserted wafer when the light between the wafer searching sensors 207 is interrupted for a period of time corresponding to a number of pulses that is greater than a number of pulses corresponding to a spacing between the slots in the cassette 200, which is preset in advance.

Further, a shutter 208 is disposed between an opening portion in the wafer cassette and the apparatus, and is vertically movable by an air cylinder. The shutter 208 can separate a cassette placing area and an interior of the apparatus. The shutter 208 is closed except when the first transfer robot 22 transfers a wafer to or from the cassette. Partition walls 209 are provided between adjacent loading/unloading stages 201 arrayed in front of the apparatus. Thus, when an operator accesses a processed wafer cassette for replacement, the operator is prevented from touching an adjacent cassette which is in operation.

Doors 210 are provided in front of respective front loading portions 20 for separating the interior of the apparatus from the exterior of the apparatus. Each door 210 has a locking mechanism and a sensor 211 for detecting whether the door 210 is opened or closed. When the apparatus is in operation, the doors 210 are locked by the locking mechanisms to protect the cassette and forestall danger to the operator. If any one of the doors 210 is left opened for a certain period of time, then an alarm is issued.

The following two methods may be used in order to place a cassette on one of the front loading portions 20.

(1) A cassette 200 having wafers therein is placed directly on front loading portion 20. This process is employed when a chamber of a clean room facing the front loading portions 20 is relatively clean, e.g., it has a clean room environment of at most class 100.

(2) When a chamber of a clean room facing the front loading portions 20 is relatively dirty, e.g., it has a clean room environment of at least class 1000, a cassette 200 is placed in a box, which is controlled at a clean room environment of about class 100, and delivered in the clean room and placed on the front loading portions 20.

In the case of (1) above, it is desirable that a filter fan unit 212 is mounted above the front loading portions 20 for maintaining the front loading portions 20 clean.

Figure 4:
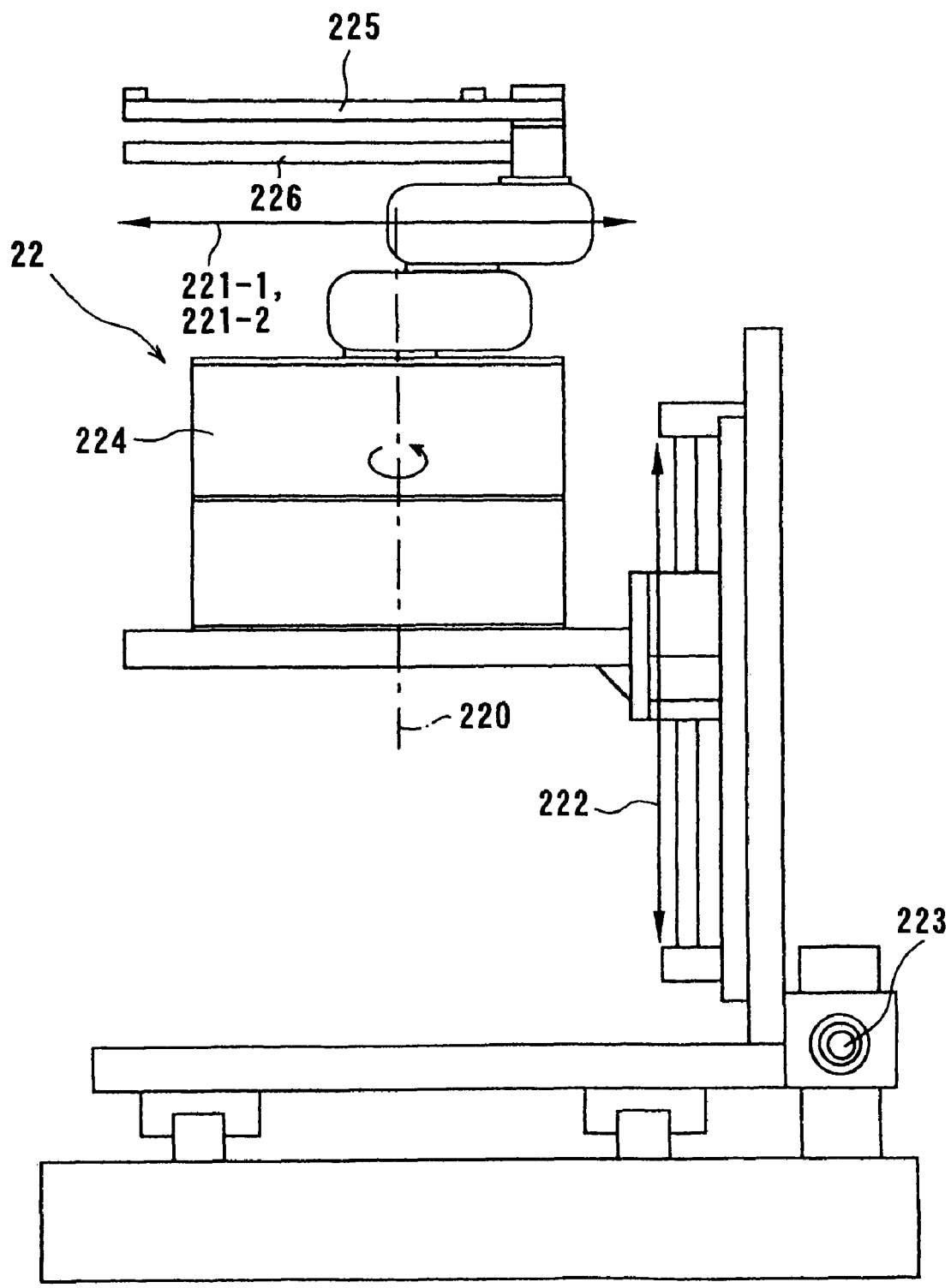
FIG. 4 is a side view of a first transfer robot in the polishing apparatus shown in FIG. 1.

Next, the first transfer robot 22 in the loading/unloading section 2 will be described below. FIG. 4 is a side view of the first transfer robot 22. As shown in FIG. 4, the first transfer robot 22 has a O-axis 220 for rotation, an R1-axis 221-1 for extending or contracting an upper hand, an R2-axis 221-2 for extending or contracting a lower hand, a Z-axis 222 for movement in a vertical direction, and an X-axis 223 for moving in a direction in which cassettes are arrayed. The Z-axis 222 of the robot may be incorporated in a robot body 224.

Figure 5:
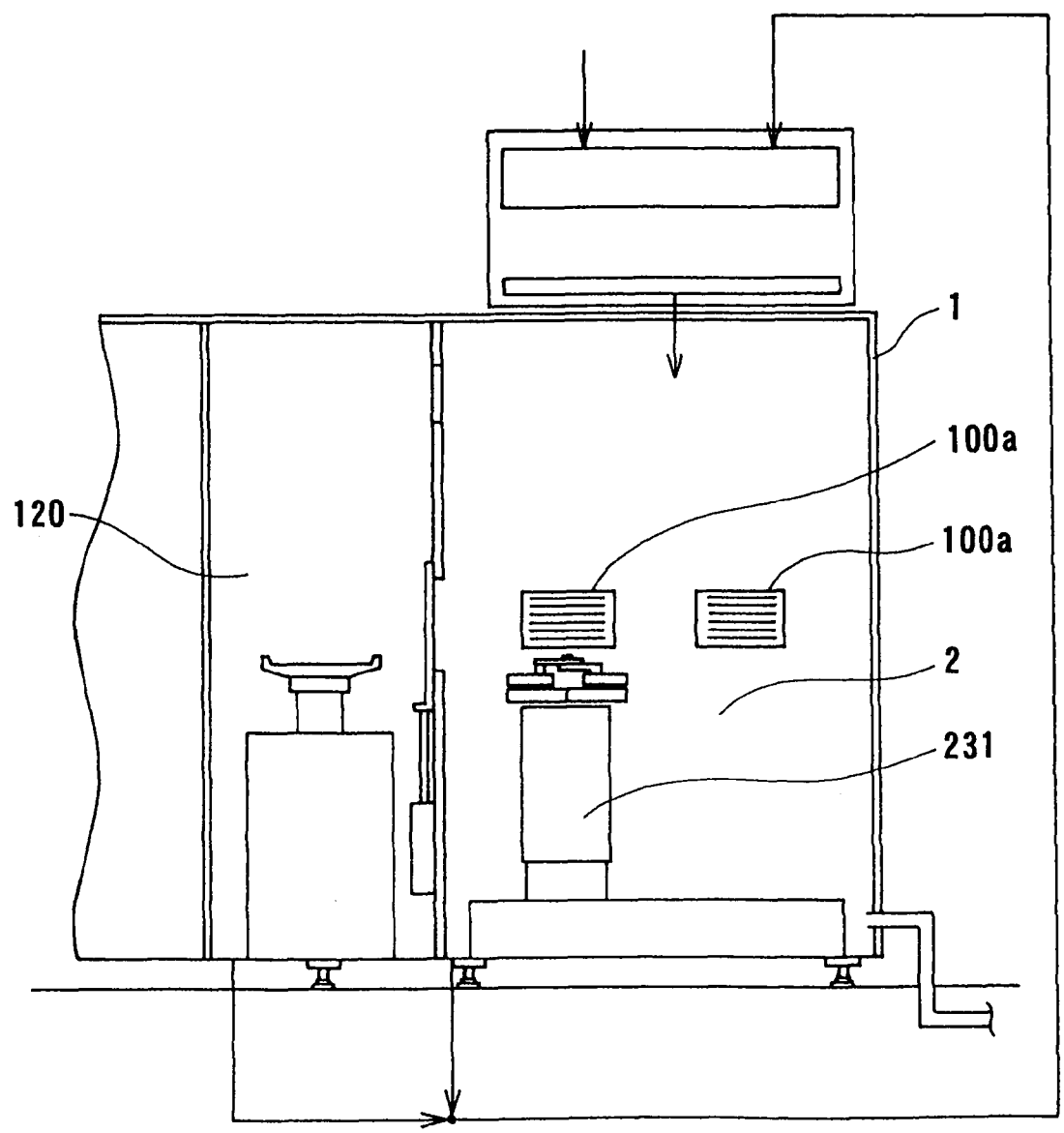
FIG. 5 is a cross-sectional view of a polishing apparatus according to the present invention.

The apparatus according to the present invention may employ a mechanism corresponding to an auxiliary device for wafer supply, which is attached to an outer front surface of a semiconductor processing apparatus, arranged to fix a door of FOUP (Front Opening Unified Pod) to the door of the loading port by vacuum chuck, and arranged to open and close the door by a front-rear upper-lower mechanism operated by a motor when a wafer transfer robot in the processing apparatus transfers a wafer. Specifically, as shown in FIG. 5, the housing 1 has a wall between the loading/unloading section 2 and the wafer cassette portion, and the wall has an opening 100a formed therein. Then, a scalar robot 231 picks up a semiconductor wafer from the wafer cassette 200 in the wafer cassette portion and supplies it to an adjacent clean room 120. The opening 100a can be closed by a vertically movable door. When a wafer is processed, the door is opened to form the opening 100a. Before and after processing, and when the apparatus is stopped, the door is closed to separate the loading/unloading section 2 and the wafer cassette portion from each other for maintenance and replacement of wafer cassettes. Specifically, when a wafer is processed, the wafer cassette portion and the loading/unloading section 2 are maintained under the same atmosphere.

The upper and lower hands of the robot described above have a vacuum line and can employ a vacuum attraction-type hand. The attraction-type hand can accurately transfer a wafer irrespective of displacement of the wafer in a cassette. Further, the hands can employ a recess support-type hand for supporting a peripheral edge of a wafer. The recess support-type hand can transfer a wafer while maintaining cleanliness of a reverse face of the wafer because it does not collect dust unlike the attraction-type hand. Therefore, it is effective that the recess support-type hand is used during a transferring process, which is between a time when a wafer is picked up from the cleaning device 45 and a time when the wafer is housed in the wafer cassette on the front loading portion 20, i.e., the recess support-type hand is used to transfer a wafer after the wafer has been cleaned. Further, when the upper hand comprises a recess support-type hand, a clean wafer that has been cleaned can be prevented from being further contaminated. FIG. 4 shows that the upper hand comprises a recess support-type hand 225 and the lower hand comprises an attraction-type hand 226.

When the hands of the robot employ a vacuum attraction-type hand, presence of a wafer on the hand can be detected by using a vacuum switch. When the hands of the robot employ a recess support-type hand, presence of a wafer on the hand can be detected by using a proximity sensor such as a reflection-type sensor or a capacitance-type sensor.

In the present embodiment, the upper hand 225 is accessible to the cleaning device 45 and the front loading portions 20, and the lower hand 226 is accessible to the front loading portions 20 and the reversing machine 31 in the polishing section 3.

Figure 6:
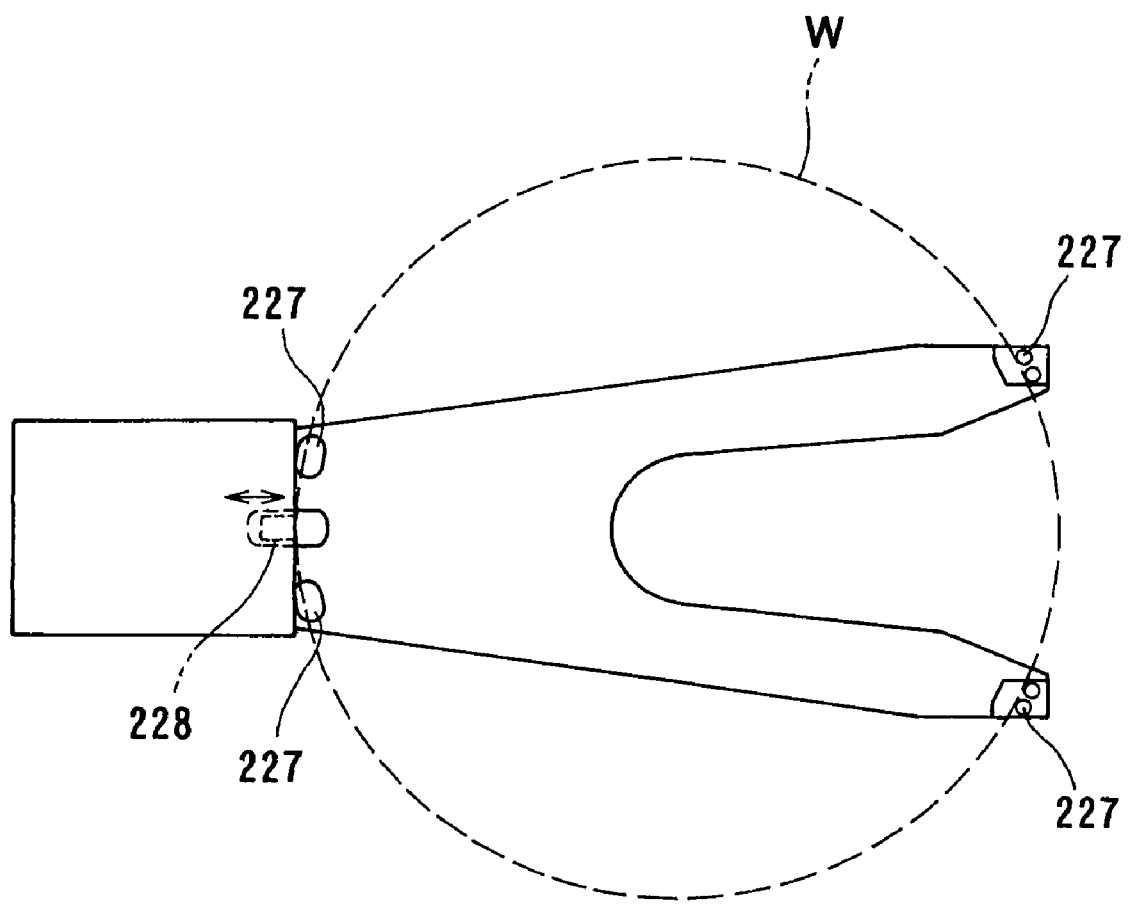
FIG. 6 is a plan view showing a hand of a first transfer robot according to another embodiment of the present invention.

FIG. 6 is a plan view showing a hand of a first transfer robot according to another embodiment of the present invention. The hand shown in FIG. 6 has a plurality of supports 227 for supporting a peripheral portion of a wafer W, and a movable clamp 228 provided at a base of the hand. When the movable clamp 228 is moved toward a center of the wafer W, the wafer is supported and held by the supports 227. Presence of a wafer on the hand can be detected by measuring an amount of stroke of the movable clamp 228.

Here, a film thickness measurement device (In-line Thickness Monitor: ITM) for measuring a film thickness of a wafer may be provided at an upper portion of the first transfer robot 22 in the loading/unloading section 2. When such a film thickness measurement device is provided, the first transfer robot 22 accesses the film thickness measurement device. The film thickness measurement device receives a wafer before or after being polished from the first transfer robot 22 and measures a film thickness of the wafer. When polishing conditions or the like are properly adjusted based on measured results obtained by the film thickness measurement device, polishing accuracy can be enhanced.

The polishing units 30A, 30B, 30C, and 30D in the polishing section 3 will be described below. These polishing units 30A, 30B, 30C, and 30D have substantially the same structure, and only the first polishing unit 30A will be described below.

The polishing table 300A has a polishing cloth or a grinding stone attached thereon, and the polishing pad or the grinding stone forms a polishing surface to polish a semiconductor wafer. At a time of polishing, a polishing liquid is supplied onto the polishing surface of the polishing table 300A from the polishing liquid supply nozzle 302A. A semiconductor wafer to be polished is pressed against the polishing surface by the top ring 301A to perform polishing. One or more polishing units may have a polishing surface in the form of a belt or a tape, and a polishing surface in the form of a belt or a tape may be combined with a polishing surface in the form of a table.

Figure 7:
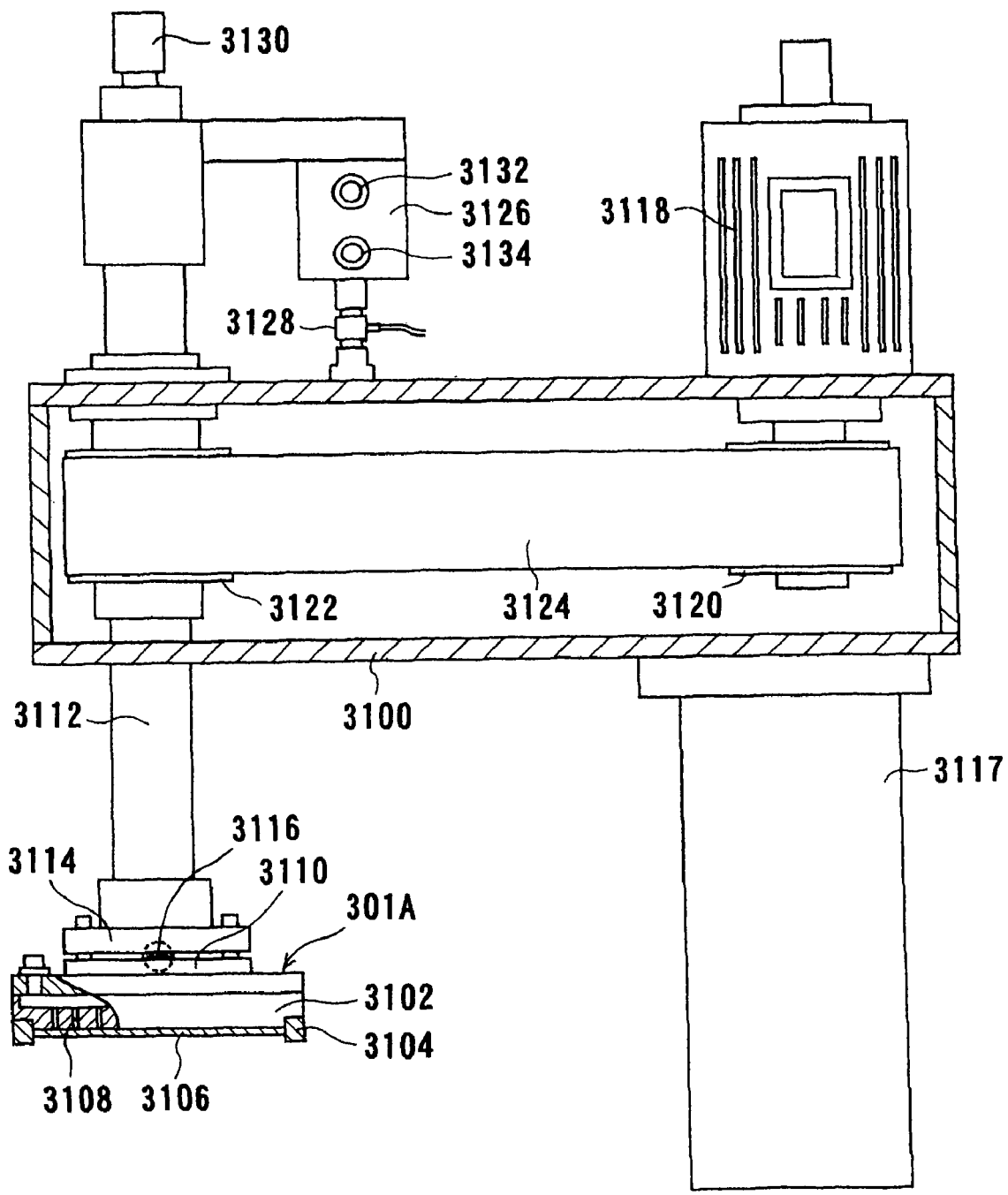
FIG. 7 is a side view, partly in cross section, showing a structure of a top ring in the polishing apparatus shown in FIG. 1.

FIG. 7 is a side view, partly in cross section, showing a structure of the top ring 301A in the first polishing unit 30A. The top ring 301A is supported by a top ring head 3100 for allowing the top ring 301A to be rotated, pressed, and swung. The top ring 301A has a top ring body 3102 for holding an upper surface of the wafer and pressing the wafer against the polishing surface of the polishing table 300A, a guide ring 3104 for retaining an outer periphery of the wafer, and a backing film 3106 interposed as a cushioning member between the top ring 301A and the wafer. The top ring body 3102 is made of a material having rigidity, such as ceramic or metal having corrosion resistance and stiffness (e.g., stainless steel). The top ring body 3102 has a wafer holding surface which is formed to a flat finish surface so that an entire surface of the wafer can be pressed uniformly against the polishing surface. The wafer holding surface of the top ring body 3102 may have a slightly concave or convex surface depending on a type of a wafer to be polished.

The guide ring 3104 has an inner diameter slightly larger than a diameter of the wafer so that the wafer is inserted into the guide ring 3104 and retained by the guide ring 3104. The top ring body 3102 has a plurality of through-holes 3108 which extend from the wafer holding surface to a surface opposite to the wafer holding surface. Clean air or nitrogen gas having a positive pressure is supplied to the wafer contacting surface through the through-holes 3108 to selectively and locally press certain areas of the wafer against the polishing surface. Further, a negative pressure is developed in the through-holes 3108 to attract the wafer under suction. Thus, the wafer is attracted to the top ring body 3102 and transferred. Further, clean air or nitrogen gas can be ejected toward the wafer through the through-holes 3108 to remove the wafer from the top ring body 3102. In this case, pure water mixed with clean air or gas may be used to enhance a wafer removing force in order to reliably remove the wafer.

The top ring 301A has an attachment flange 3110 mounted on an upper surface thereof, and the attachment flange 3110 has a hemispherical hole defined centrally in an upper surface thereof. A drive flange 3114 fixed to a top ring drive shaft 3112 is disposed above the attachment flange 3110. The drive flange 3114 has a hemispherical hole defined in a lower surface thereof. A hard ball 3116 made of, for example, ceramic is received in the hemispherical hole, so that a downward pressing force to the drive flange 3114 is transmitted via the ball 3116 to the attachment flange 3110.

On the other hand, the top ring head 3100 supports the top ring 301A through the top ring drive shaft 3112 comprising a spline shaft. The top ring head 3100 is supported by a swing shaft 3117. The swing shaft 3117 is swung by rotation of a motor (not shown) coupled to a lower end of the swing shaft to pivot the top ring head 3100. By this pivotal movement, the top ring 301A can be moved to a polishing position, a maintenance position, and a wafer receiving/delivering position. A motor 3118 is provided above the swing shaft 3117 and on an upper surface of the top ring head 3100. When the motor 3118 is rotated, a driving pulley 3120 fixed to an end of a shaft of the motor 3118 is rotated to rotate a driven pulley 3122 fixed to the top ring drive shaft 3112 through a belt 3124. When the driven pulley 3122 is rotated, the top ring drive shaft 3112 is rotated. Rotation of the top ring drive shaft 3112 is transmitted to the top ring 301A, so that the top ring 301A is rotated.

Further, a cylinder 3126 is fixed to the upper surface of the top ring head 3100 in a manner such that a shaft of the cylinder 3126 extends downward. The top ring head 3100 and the shaft of the cylinder 3126 are flexibly coupled to each other. By controlling air pressure supplied to the cylinder 3126, a force to lift or lower the top ring drive shaft 3112, i.e., a force to press the top ring 301A against the polishing surface, can be controlled. A tensile/compressive load measuring device (load cell) 3128 is interposed in a junction between the cylinder 3126 and the top ring head 3100 for measuring a vertical thrust force generated by the cylinder 3126 fixed to the top ring head 3100. Since the thrust force is equal to a force to press a wafer, a feedback circuit may be formed using measured thrust force for a purpose of controlling the force to press the wafer. The body of the cylinder 3126 and the top ring drive shaft 3112, comprising a spline shaft, are coupled to each other such that the top ring drive shaft 3112 can be rotated. When the cylinder 3126 is operated in a vertical direction, the top ring drive shaft 3112 is simultaneously operated in a vertical direction. The top ring drive shaft 3112 has a through-hole defined therein with a tube (not shown) disposed in the through-hole. Since the top ring drive shaft 3112 and the top ring 301A are rotated, a rotary joint 3130 is mounted on an upper end of the tube. A gas such as vacuum, nitrogen gas, or clean air and/or a liquid such as pure water is supplied via the rotary joint 3130 to the top ring body 3102. The cylinder 3126 may be mounted directly to the spline shaft. In such a case, the load measuring device 3128 is mounted on a junction between the cylinder 3126 and the spline shaft.

The top ring 301A having the above structure attracts the wafer, which has been transported to the pusher 33, under vacuum suction, and holds the wafer in the guide ring 3104 of the top ring 301A. Thereafter, the top ring 301A is swung from a position above the pusher 33 to a position above the polishing surface on the polishing table 300A. After the top ring 301A is moved to the position above the polishing table 300A, where the top ring 301A can polish the wafer, the top ring 301A is rotated at a predetermined rotational speed and then lowered by the cylinder 3126 to bring the wafer into contact with the polishing surface on the polishing table 300A. When the top ring 301A is lowered to an upper surface of the polishing table 300A, a sensor 3132 for detecting a lower end of the stroke of the cylinder 3126 is actuated to generate a signal indicating that downward movement of the cylinder 3126 is completed. In response to the signal, the cylinder 3126 is supplied with air under a pressure corresponding to a desired pressing load to press the top ring 301A against the polishing table 300A to apply a pressing force to the wafer. At the same time, a vacuum line for developing a negative pressure to attract the wafer under suction is cut off. At that time, depending on a type of layer to be polished on the wafer, a negative pressure may remain or be cut off, or a valve may be operated to control pressure of the gas to apply a positive pressure to the wafer to control a polished profile of the wafer. Pressure developed at that time is applied only to the through-holes 3108 defined in the wafer holding surface of the top ring 301A. Therefore, depending on areas of the wafer to which the pressure is to be applied, diameters, number, and positions of the through-holes 3108 are varied to achieve a desired polished profile.

After a desired polishing process is completed, the top ring 301A attracts the wafer under suction. (Completion of a polishing process is controlled based on a period of time or a film thickness.) The wafer is swung on the polishing table while the wafer is held in contact with the polishing cloth. The wafer is moved toward an outer periphery of the polishing table 300A so that about 40% of a surface of the wafer projects from an outer periphery of the polishing table 300A in a manner such that a center of the wafer is still located on the polishing table 300A but near the periphery of the polishing table 300A as much as possible. Thereafter, the cylinder 3126 is actuated to lift the top ring 301A holding the wafer. Depending on a polishing cloth which is used, a surface tension between slurry on the polishing pad and the wafer may be stronger than an attractive force of the top ring. In such a case, the wafer tends to be left on the polishing cloth when it is lifted from the polishing cloth. In order to reduce such a surface tension, the wafer is allowed to project from the polishing table, and then the top ring 301A is lifted. If not less than 40% of a surface area of the wafer projects from the polishing table, then the top ring would be tilted to cause the wafer to hit an edge of the polishing table 300A and be cracked. Therefore, it is desirable that about 40% of a surface area of the wafer projects from the polishing table. It is important that the center of the wafer is located on the polishing table 300A.

When lifting of the top ring 301A is completed, a sensor 3134 for detecting an end point of this lifting action of the cylinder 3126 is operated to detect completion of the lifting action. Thereafter, the top ring 301A starts a swinging motion, moves to a position above the pusher 33, and transfers the wafer to the pusher 33. After the wafer is transferred to the pusher 33, a cleaning liquid is ejected downwardly, horizontally, or upwardly toward the top ring 301A to clean the wafer holding surface of the top ring 301A, the polished wafer, and surrounding regions. Supply of the cleaning liquid may be continued until a next wafer is transferred to the top ring 301A to prevent the top ring from being dried. The cleaning liquid may be intermittently ejected to reduce a running cost. While the wafer is being polished, polishing time may be divided into a plurality of steps, and a pressing force and rotational speed of the top ring and a method of holding the wafer may be changed in each of the steps. It is also possible to change a kind, amount, density, and temperature of polishing liquid used, and a timing of supplying the polishing liquid.

If current supplied to the motor for rotating the top ring is monitored during a polishing process, then torque outputted by the motor can be calculated based on this monitored current. When polishing of a wafer reaches an end point, the friction between the wafer and the polishing cloth is changed. Therefore, an end point of the polishing of the wafer may be detected based on a change in torque of the motor. Similarly, current supplied to the motor for rotating the polishing table 300A may be monitored, and a change in torque may be calculated based on this monitored current to detect an end point of the polishing of the wafer. While a wafer is polished, vibrations of the top ring are measured to detect an end point of the polishing of the wafer based on detected inflection points of a vibration waveform. Furthermore, an electrostatic capacitance may be measured to detect an end point of the polishing process. These four types of detection methods are based on differences between surface irregularities or surface qualities before and after polishing, or on a thickness of a remaining film. After a surface of a polished wafer is cleaned, a polishing amount may be measured to determine if polishing is insufficient. In case of insufficient polishing, the wafer may be polished again.

Figure 8:
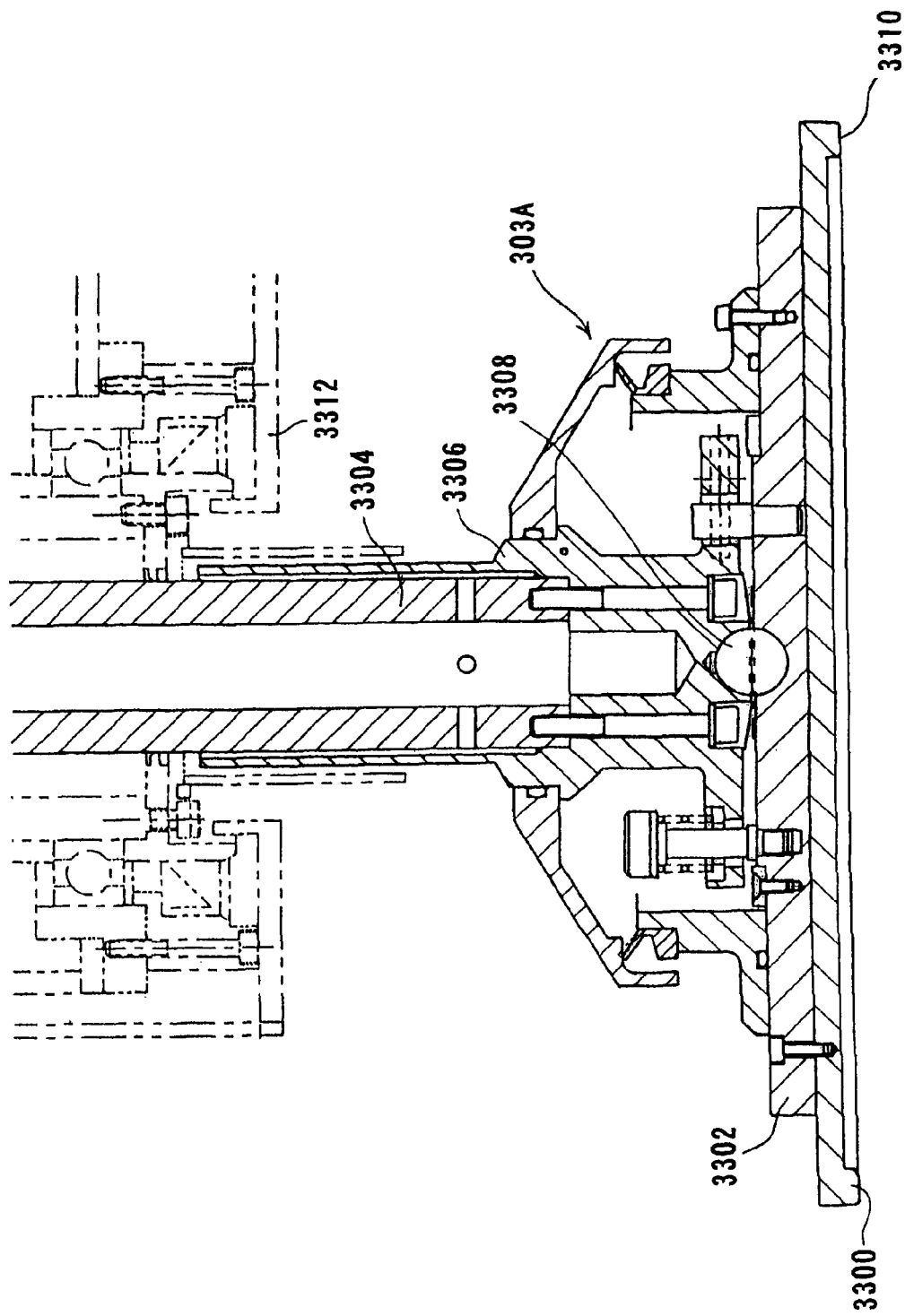
FIG. 8 is a vertical cross-sectional view showing a dresser in the polishing apparatus shown in FIG. 1, and shows a diamond dresser.
Figure 9:
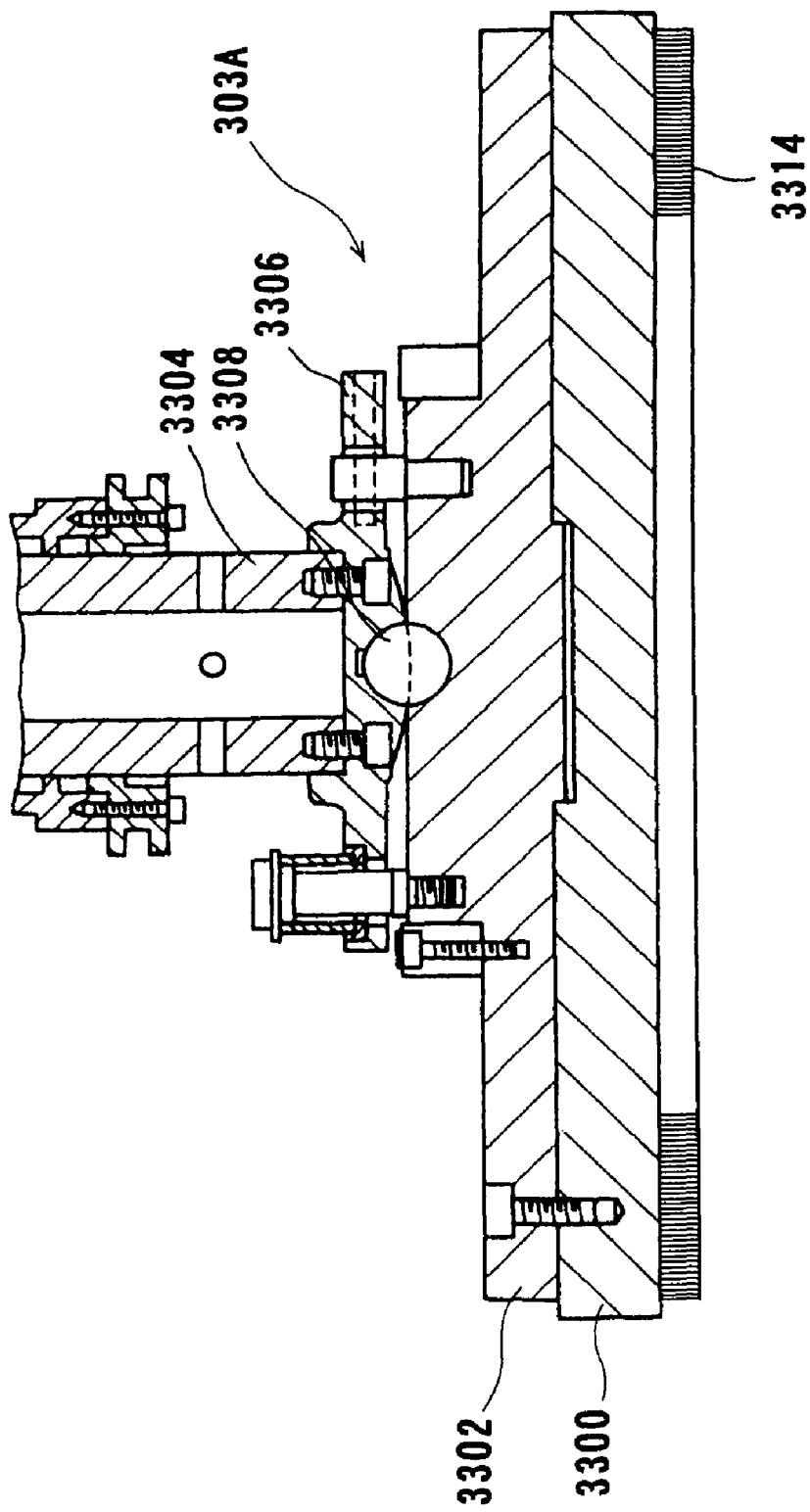
FIG. 9 is a vertical cross-sectional view showing a dresser in the polishing apparatus shown in FIG. 1, and shows a brush dresser.

FIGS. 8 and 9 are vertical cross-sectional views showing the dresser 303A. FIG. 8 shows a diamond dresser, and FIG. 9 shows a brush dresser. As shown in FIG. 8, the dresser 303A has a dresser plate 3300 having a dressing surface for dressing the polishing cloth. The dresser plate 3300 is fastened to an attachment flange 3302 having a hemispherical hole defined centrally in an upper surface thereof. A drive flange 3306 fixed to a dresser drive shaft 3304 is disposed above the attachment flange 3302. The drive flange 3306 has a hemispherical hole defined in a lower surface thereof. A hard ball 3308 made of, for example, ceramic is received in the hemispherical hole. A downward pressing force applied to the drive flange 3306 is transmitted via the ball 3308 to the dresser plate 3300. Diamond particles 3310 for conditioning a shape of the polishing pad and dressing the polishing pad are electrodeposited on a lower surface of the dresser plate 3300. Alternatively, a number of hard protrusions of, for example, ceramic may be provided on the dresser plate 3300 instead of diamond particles. The diamond particles or hard protrusions can be replaced merely by replacing the dresser plate 3300 so as to readily perform other types of dressing processes. In either case, because a surface configuration of the dresser plate 3300 reflects a surface configuration of the polishing pad to be dressed, the dressing surface of the dresser is finished to a flat surface.

The dresser drive shaft 3304 is supported on a dresser head 3312. The dresser head 3312 has essentially the same function as the top ring head 3100. The dresser drive shaft 3304 is rotated by a motor and vertically moved by a cylinder. Details of the structure of the dresser head 3312 are substantially the same as those of the top ring head 3100, and are thus not further illustrated or described.

FIG. 9 shows a brush dresser having a brush 3314 mounted on a lower surface of a dresser plate 3300. Other structural details of the brush dresser are substantially the same as those of the diamond dresser shown in FIG. 8.

When a shape of the polishing cloth is conditioned or the polishing pad is dressed, the dresser 303A is swung from a cleaning position to a dressing position on the polishing table 300A. After this swing motion is completed, the dresser 303A is rotated at a predetermined rotational speed, and the cylinder for lifting and lowering the dresser is actuated to lower the dresser 303A. When the dresser 303A is brought into contact with the polishing surface on the polishing table 300A, a sensor associated with the cylinder detects a lower end of its stroke to generate a signal indicating that the dresser 303A has touched the polishing surface. In response to the signal, the cylinder applies a pressing force to the dresser 303A to dress the polishing surface (e.g. polishing cloth or fixed abrasive) on the polishing table 300A under a desired pressing force. After the dresser 303A has dressed the polishing cloth for a desired period of time, the cylinder is operated to lift the dresser 303A away from the polishing table 300A. Thereafter, the dresser 303A is swung to the cleaning position, where the dresser 303A is submerged in a water container (not shown) and cleaned, for example. The dresser may be cleaned by being submerged in a water tank, by ejecting a spray from a spray nozzle, or by being rotated and pressed against a brush provided on a bottom of the water tank. An ultrasonic element may be provided in the water tank to clean the dresser by vibrational energy of the ultrasonic element.

Further, the first polishing unit 30A has an atomizer 304A as a non-contact type dresser using a fluid pressure in addition to the mechanical dresser 303A. The atomizer mainly serves to wash away polishing wastes and slurry particles which have been accumulated on or clogged in the polishing surface. A combination of cleaning of the polishing surface by the atomizer using a fluid pressure and dressing of the polishing surface by the dresser 303A using a mechanical contact can achieve more effective dressing, i.e., can regenerate the polishing surface more effectively. Conditioning of the polishing surface by an atomizer is usually performed after dressing by a contact type dresser (e.g. diamond dresser).

Figure 10:
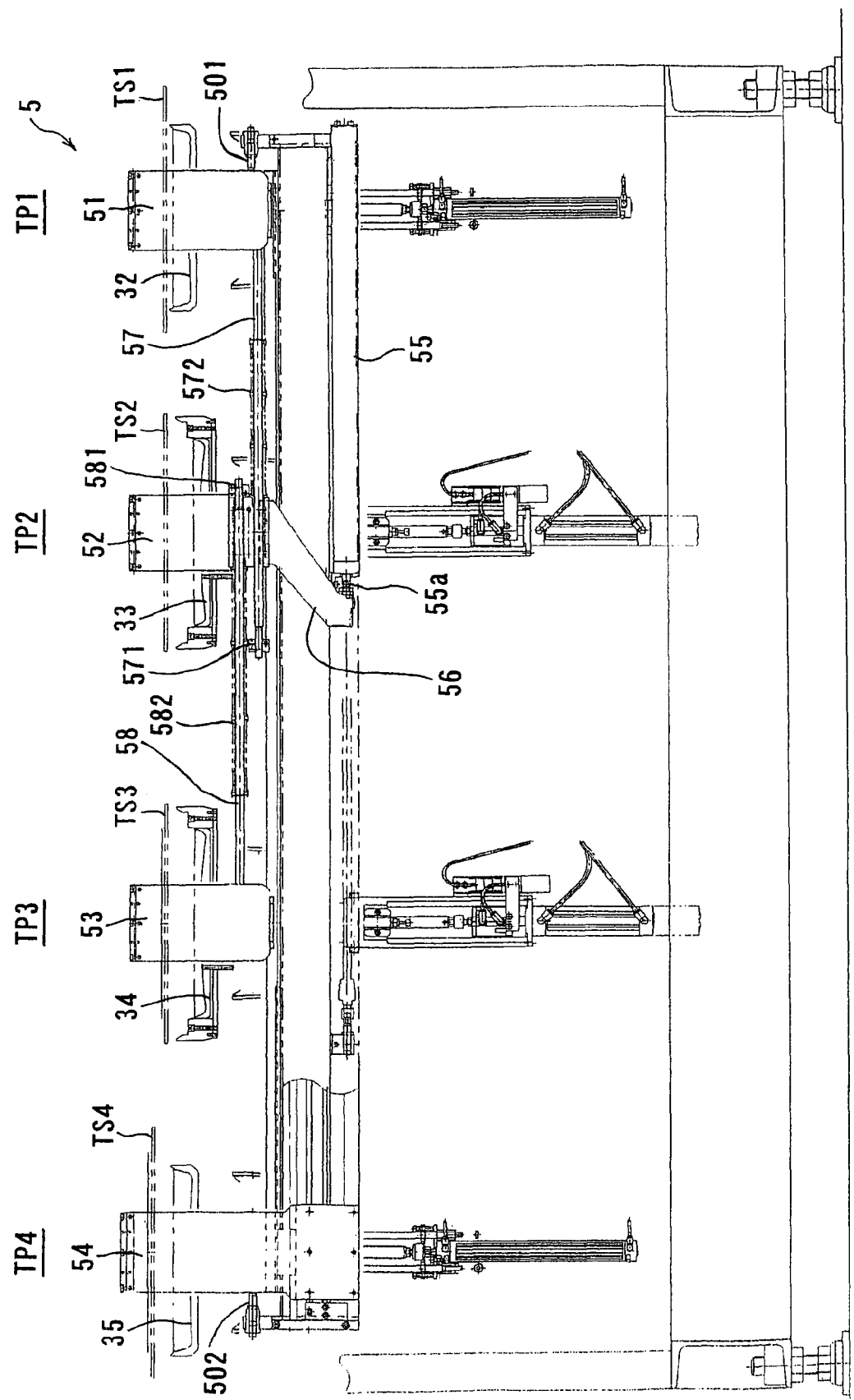
FIG. 10 is a front view of a first linear transporter in the polishing apparatus shown in FIG. 1.
Figure 11:
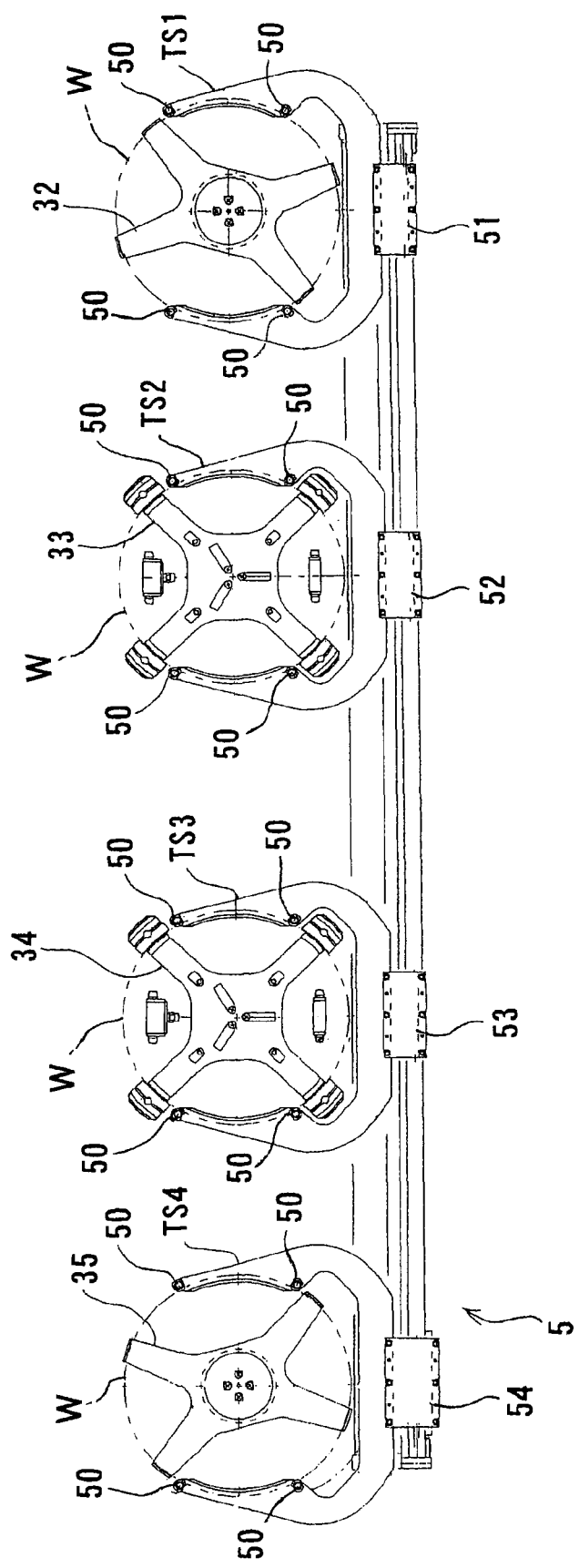
FIG. 11 is a plan view of FIG. 10.

The first linear transporter 5 in the first polishing section 3 will be described below. FIG. 10 is a front view of the first linear transporter 5, and FIG. 11 is a plan view of FIG. 10. As shown in FIGS. 10 and 11, the first linear transporter 5 has four transfer stages TS1, TS2, TS3, and TS4, which are linearly movable in a reciprocating manner. These transfer stages have a two-line structure including an upper line and a lower line. Specifically, a first transfer stage TS1, a second transfer stage TS2, and a third transfer stage TS3 are disposed on the lower line, whereas a fourth transfer stage TS4 is disposed on the upper line.

While lower transfer stages TS1, TS2, and TS3 and upper transfer stage TS4 move on the same axis in the plan view shown in FIG. 11, the lower transfer stages TS1, TS2, and TS3 and the upper transfer stage TS4 can freely move without interfering with each other because they are provided at different heights. The first transfer stage TS1 transfers a wafer between the first transferring position TP1 at which the reversing machine 31 and lifter 32 are disposed, and the second transferring position TP2, which is a wafer receiving/delivering position at which the pusher 33 is disposed. The second transfer stage TS2 transfers a wafer between the second transferring position TP2, and the third transferring position TP3, which is a wafer receiving/delivering position at which the pusher 34 is disposed. The third transfer stage TS3 transfers a wafer between the third transferring position TP3, and the fourth transferring position TP4 at which the lifter 35 is disposed. The fourth transfer stage TS4 transfers a wafer between the first transferring position TP1 and the fourth transferring position TP4.

As shown in FIG. 11, each of the transfer stages TS1, TS2, TS3, and TS4 has four pins 50 fixed thereto, and a wafer is supported on a corresponding transfer stage in a state such that a peripheral edge of the wafer placed on the transfer stage is guided and positioned by the pins 50. The pins 50 are made of resin such as polychlorotrifluoroethylene (PCTFE) or polyetheretherketone (PEEK). Each transfer stage has a sensor (not shown) such as a transmission type sensor for detecting presence of a wafer on this transfer stage.

The transfer stages TS1, TS2, TS3, and TS4 are supported by supports 51, 52, 53, and 54, respectively. As shown in FIG. 10, a connecting member 56 connected to a rod 55a of an air cylinder (driving mechanism) 55 is mounted on a lower portion of the support 52 of the second transfer stage TS2 (driving transfer stage). A shaft 57 and a shaft 58 are inserted through the support 52 of the second transfer stage TS2. An end of the shaft 57 is connected to the support 51 of the first transfer stage TS1 (driven transfer stage), and another end of the shaft 57 is provided with a stopper 581. A spring 572 is interposed on the shaft 57 between the support 51 of the first transfer stage TS1 and the support 52 of the second transfer stage TS2. Similarly, a spring 582 is interposed on the shaft 58 between the support 52 of the second transfer stage TS2 and the support 53 of the third transfer stage TS3. Mechanical stoppers 501 and 502, which are brought into contact with the support 51 of the first transfer stage TS1 and the support 53 of the third transfer stage TS3, respectively, are provided at both ends of the first linear transporter 5.

When the air cylinder 55 is actuated to extend and contract the rod 55a, the connecting member 56 connected to the rod 55a is moved so that the second transfer stage TS2 is moved together with the connecting member 56. Since the support 51 of the first transfer stage TS1 is connected to the support 52 of the second transfer stage TS2 via the shaft 57 and the spring 572, the first transfer stage TS1 is also moved together with the second transfer stage TS2. Further, since the support 53 of the third transfer stage TS3 is connected to the support 52 of the second transfer stage TS2 via the shaft 58 and the spring 582, the third transfer stage TS3 is also moved together with the second transfer stage TS2. Thus, the first transfer stage TS1, the second transfer stage TS2, and the third transfer stage TS3 are linearly moved integrally and simultaneously in a reciprocating manner by actuation of the air cylinder 55.

If the first transfer stage TS1 is to be moved over the first transferring position TP1, then the support 51 of the first transfer stage TS1 is restricted by the mechanical stopper 501, and the spring 572 absorbs further movement of the first transfer stage TS1, so that the first transfer stage TS1 cannot be moved over the first transferring position TP1. Therefore, the first transfer stage TS1 is accurately positioned at the first transferring position TP1. Similarly, if the third transfer stage TS3 is to be moved over the fourth transferring position TP4, then the support 53 of the third transfer stage TS3 is restricted by the mechanical stopper 502, and the spring 582 absorbs further movement of the third transfer stage TS3, so that the third transfer stage TS3 cannot be moved over the fourth transferring position TP4. Therefore, the third transfer stage TS3 is accurately positioned at the fourth transferring position TP4.

When respective transfer stages have different strokes of movement, movement of the respective transfer stages can be controlled by air cylinders provided in the respective transfer stages. However, such air cylinders cause the apparatus to become large. In the present embodiment, the stroke of the air cylinder 55 is configured with respect to the transfer stage that has a longest distance of movement, so that the springs 572 and 582 absorb excessive strokes with respect to the other transfer stages. Therefore, even if the transfer stages TS1, TS2, and TS3 have different strokes, these three transfer stages TS1, TS2, and TS3 can simultaneously be moved by one air cylinder 55.

The first linear transporter 5 has an air cylinder (not shown) for linearly moving the fourth transfer stage TS4 of the upper line in a reciprocating manner. The fourth transfer stage TS4 is controlled by the air cylinder so as to be moved simultaneously with the lower transfer stages TS1, TS2, and TS3.

Figure 12:
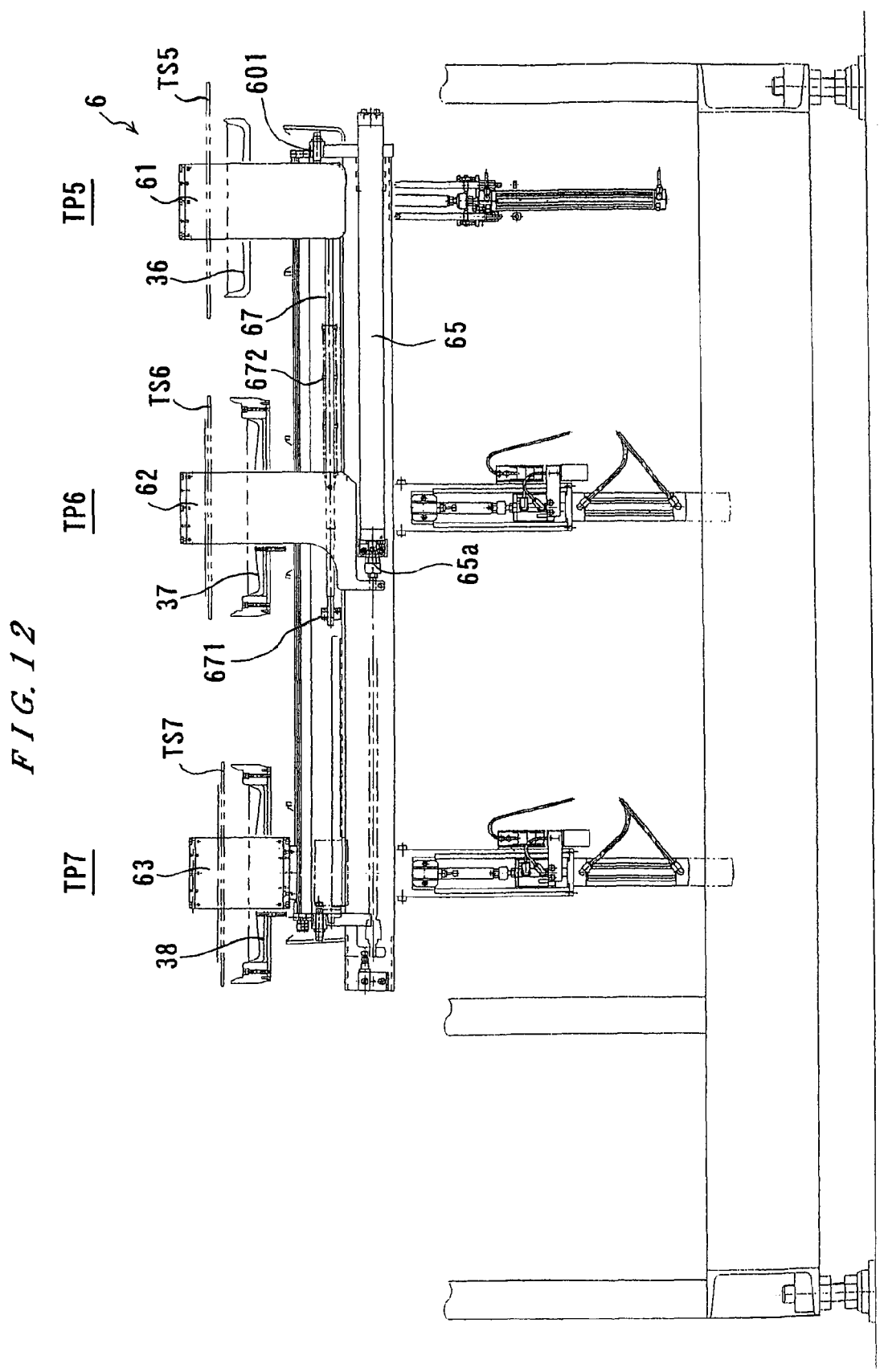
FIG. 12 is a front view showing a second linear transporter in the polishing apparatus shown in FIG. 1.

The second linear transporter 6 in the second polishing section 3b will be described below. FIG. 12 is a front view showing the second linear transporter 6, and FIG. 13 is a plan view of FIG. 12. As shown in FIGS. 12 and 13, the second linear transporter 6 has three transfer stages TS5, TS6, and TS7, which are linearly movable in a reciprocating manner. These transfer stages have a two-line structure including an upper line and a lower line. Specifically, a fifth transfer stage TS5 and a sixth transfer stage TS6 are disposed on the upper line, whereas a seventh transfer stage TS7 is disposed on the lower line.

While upper transfer stages TS5 and TS6 and lower transfer stage TS7 move on the same axis in the plan view shown in FIG. 13, the upper transfer stages TS5 and TS6 and the lower transfer stage TS7 can freely move without interfering with each other because they are provided at different heights. The fifth transfer stage TS5 transfers a wafer between the fifth transferring position TP5 at which the lifter 36 is disposed, and the sixth transferring position TP6, which is a wafer receiving/delivering position at which the pusher 37 is disposed. The sixth transfer stage TS6 transfers a wafer between the sixth transferring position TP6, and the seventh transferring position TP7, which is a wafer receiving/delivering position at which the pusher 38 is disposed. The seventh transfer stage TS7 transfers a wafer between the fifth transferring position TP5 and the seventh transferring position TP7.

As shown in FIG. 13, each of the transfer stages TS5, TS6, and TS7 has four pins 60 fixed thereto, and a wafer is supported on a corresponding transfer stage in a state such that a peripheral edge of the wafer placed on the transfer stage is guided and positioned by the pins 60. The pins 60 are made of resin such as polychlorotrifluoroethylene (PCTFE) or polyetheretherketone (PEEK). Each transfer stage has a sensor (not shown) such as a transmission type sensor for detecting presence of a wafer on this transfer stage.

The transfer stages TS5, TS6, and TS7 are supported by the supports 61, 62, and 63, respectively. As shown in FIG. 12, a rod 65a of an air cylinder (driving mechanism) 65 is connected to a lower portion of the support 62 of the sixth transfer stage TS6 (driving transfer stage). A shaft 67 is inserted through the support 62 of the sixth transfer stage TS6. An end of the shaft 67 is connected to the support 61 of the fifth transfer stage TS5 (driven transfer stage), and another end of the shaft 67 is provided with a stopper 671. A spring 672 is interposed on the shaft 67 between the support 61 of the fifth transfer stage TS5 and the support 62 of the sixth transfer stage TS6. Mechanical stopper 601, which is brought into contact with the support 61 of the fifth transfer stage TS5, is provided at an end of the second linear transporter 6 on a fifth transfer stage TS5 side.

When the air cylinder 65 is actuated to extend and contract the rod 65a, the sixth transfer stage TS6 connected to the rod 65a is moved. Since the support 61 of the fifth transfer stage TS5 is connected to the support 62 of the sixth transfer stage TS6 via the shaft 67 and the spring 672, the fifth transfer stage TS5 is also moved together with the sixth transfer stage TS6. Thus, the fifth transfer stage TS5 and the sixth transfer stage TS6 are linearly moved integrally and simultaneously in a reciprocating manner by actuation of the air cylinder 65.

If the fifth transfer stage TS5 is to be moved over the fifth transferring position TP5, then the support 61 of the fifth transfer stage TS5 is restricted by the mechanical stopper 601, and the spring 672 absorbs further movement of the fifth transfer stage TS5, so that the fifth transfer stage TS5 cannot be moved over the fifth transferring position TP5. Therefore, the fifth transfer stage TS5 is accurately positioned at the fifth transferring position TP5. Thus, in the second linear transporter 6, as with the first linear transporter 5, two transfer stages (TS5 and TS6) can simultaneously be moved by one air cylinder (65). The second linear transporter 6 has an air cylinder (not shown) for linearly moving the seventh transfer stage TS7 of the lower line in a reciprocating manner. The seventh transfer stage TS7 is controlled by the air cylinder so as to be moved simultaneously with the upper transfer stages TS5 and TS6.

Although the linear transporters 5 and 6 are operated by the air cylinders, they may be operated by, for example, motor actuation using ball screws.

Figure 14A:
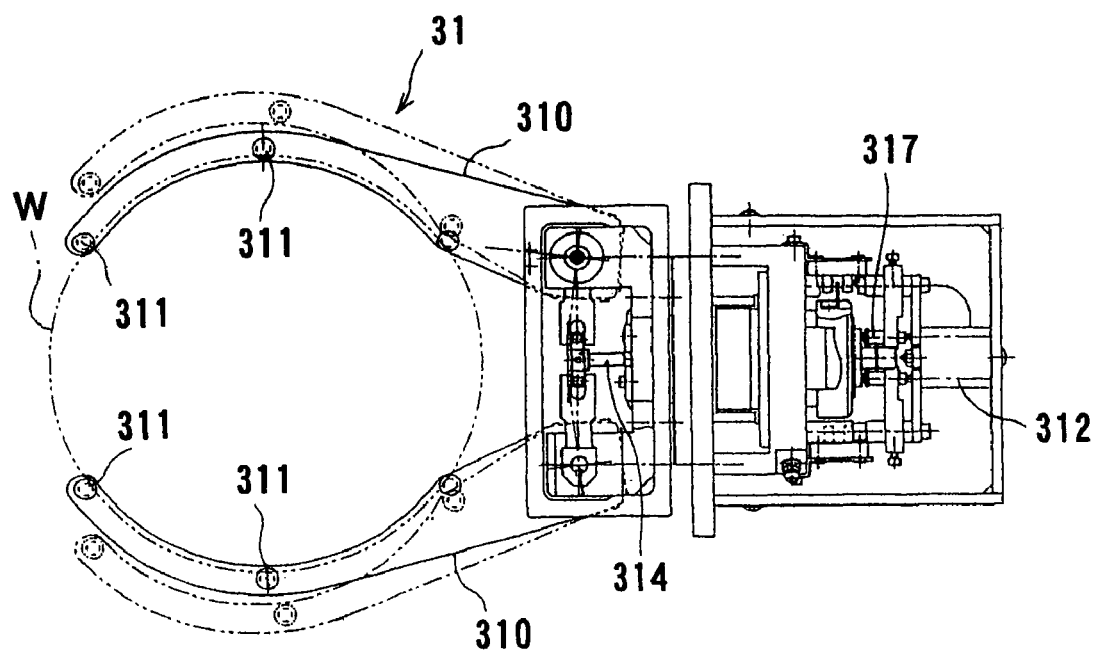
FIGS. 14A and 14B are views showing a reversing machine in the polishing apparatus shown in FIG. 1, with FIG. 14A being a plan view, and FIG. 14B being a side view, partly in cross section, of FIG. 14A.
Figure 14B:
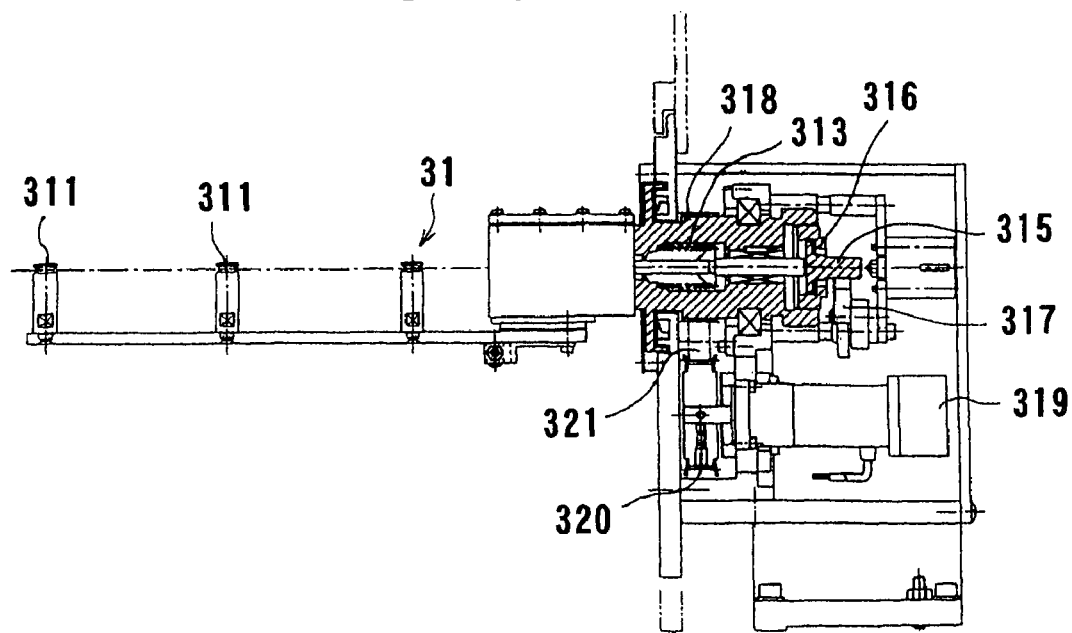

Next, the reversing machine 31 in the first polishing section 3a and the reversing machine 41 in the cleaning section 4 will be described below. The reversing machine 31 in the first polishing section 3a is disposed at a position to which a hand of the first transfer robot 22 in the loading/unloading section 2 is accessible and serves to receive a wafer that has not been polished from the first transfer robot 22, reverse the wafer upside down, and deliver the wafer to the lifter 32. The reversing machine 41 in the cleaning section 4 is disposed at a position to which a hand of the second transfer robot 40 is accessible and serves to receive a wafer that has been polished from the second transfer robot 40, reverse the wafer upside down, and deliver the wafer to the transfer unit 46. The reversing machines 31 and 41 have the same structure, and only the reversing machine 31 will be described below FIG. 14A is a plan view showing the reversing machine 31, and FIG. 14B is a side view, partly in cross section, of FIG. 14A. As shown in FIGS. 14A and 14B, the reversing machine 31 has a pair of arcuate arms 310, and a plurality of (e.g., six) pins 311 which have grooves for clamping a wafer W therein are fixed to the arms 310. The arms 310 can be opened and closed in response to movement of a shaft 314 that can be pushed and pulled by a cylinder 312 and a compression spring 313. When the cylinder 312 is extended, the arms 310 are opened thereby. When the cylinder 312 is contracted, the arms 310 are closed under force of the compression spring 313. The shaft 314 and a tip end of the cylinder 312 are spaced from each other by a distance, and the shaft 314 is pulled back until a stopper 316 contacts an end block 315 under bias of the compression spring 313.

The end block 315 is adjusted such that when a wafer W is chucked, a clearance of 1 mm is created between the stopper 316 and the end block 315. The stopper 316 has a slit defined therein, and a transmission type light sensor 317 is positioned to detect light that has passed through the slit when the wafer is clamped by the arms 310. Therefore, when the wafer W is not clamped or cannot be clamped properly, the transmission type light sensor 317 does not detect light. Thus, the transmission type light sensor 317 is capable of recognizing whether or not the wafer W is present in the reversing machine 31.

A slide mechanism for the shaft 314 and a pulley 318 are connected to each other, and the pulley 318 is coupled to a pulley 320 fixed to a shaft end of a stepping motor 319 through a belt 321. When the stepping motor 319 is energized, the arms 310 are rotated.

As shown in FIG. 1, the shutter 10 is disposed between the reversing machine 31 and the first transfer robot 22. For transferring wafers, the shutter 10 is opened, and a wafer is delivered between the first transfer robot 22 and the reversing machine 31. Shutters 11, 12, 13, and 14 are disposed between the reversing machine 41 and the second transfer robot 40, between the reversing machine 41 and the primary cleaning device 42, between the first polishing section 3a and the second transfer robot 40, and between the second polishing section 3b and the second transfer robot 40. For transferring wafers, the shutters 11, 12, 13, and 14 are opened, and a wafer is delivered between the reversing machine 41 and the second transfer robot 40 or the primary cleaning device 42. When a wafer is not transferred, the shutters 10, 11, 12, 13, and 14 are closed. The shutters 10, 11, 12, 13, and 14 have a water proof mechanism so as to clean the wafer or clean the chucking pins 311 fixed to the arms 310 at that time. A plurality of nozzles (not shown) are provided around the reversing machine 31 and/or the reversing machine 41 for preventing a wafer from being dried. If a wafer remains for a long period of time, then pure water is ejected from the nozzles to prevent the wafer from being dried.

Next, operation of the reversing machine thus constructed will be described below. The reversing machine 31 awaits a wafer transferred from the first transfer robot 22 in a state such that the arms 310 are opened. When a position of the wafer transferred by the lower hand of the first transfer robot 22 is substantially aligned with a center of a pin arrangement of the arms 310 at the same height as the grooves of the pins 311 fixed to the arms 310 for clamping a wafer, the arms 310 are closed in response to a signal indicating completion of movement from the first transfer robot 22. After the sensor 317 determines presence of the wafer W, the first transfer robot 22 lowers the hand to a predetermined height and then withdraws the hand. The wafer W delivered to the reversing machine 31 is reversed together with the arms 310 by actuation of the stepping motor 319. This reversed wafer W awaits the lifter 32 until the lifter 32 moves to receive the wafer W. The reversing machine 41 also receives a polished wafer from the second transfer robot 40, reverses this wafer upside down, and delivers the wafer to the transfer unit 46 by the same operation as the reversing machine 31.

Reversing operation is performed before and after polishing. When a wafer W that has been polished is reversed (by the reversing machine 41), the wafer W is rinsed with a cleaning liquid during or after this reversing operation in order to prevent an abrasive liquid or polishing wastes attached to the wafer W during polishing from being dried and solidified to cause damage to the wafer W. Pure water or chemical liquid is used as the cleaning liquid to rinse a wafer and ejected at a required flow rate under a required pressure from spray nozzles at optimal angles for a predetermined period of time. This rinsing effectively improves cleaning performance in a subsequent cleaning process. A cleaning liquid is continuously applied while the wafer W awaits the lifter on the reversing machine. However, the cleaning liquid may be intermittently supplied in consideration of a running cost to reduce an amount of cleaning liquid used. When the wafer W is not clamped by the reversing machine 31 or 41, the grooves for clamping the wafer W and surrounding areas are cleaned with the cleaning liquid to prevent the wafer W from being contaminated from portions contacting the wafer W.

Next, the second transfer robot 40 will be described below. FIG. 15 is a perspective view showing the second transfer robot 40. As shown in FIG. 15, the second transfer robot 40 has a O-axis 400 for rotation, an R1-axis 401-1 for extending or contracting an upper hand, an R2-axis 401-2 for extending or contracting a lower hand, and a Z-axis 402 for movement in a vertical direction. The upper and lower hands can employ a recess support-type hand described above. When the hands of the robot employ a recess support-type hand, presence of a wafer on the hand can be detected by using a proximity sensor such as a reflection-type sensor or a capacitance-type sensor or a transmission optical sensor. FIG. 15 shows that the upper and lower hands comprise recess support-type hands 405 and 406. In the present embodiment, the hands 405 and 406 are accessible to the lifters 35, 36 and the reversing machine 41.

Next, the lifters 32, 35 in the first polishing section 3a and the lifter 36 in the second polishing section 3b will be described below. The lifter 32 in the first polishing section 3a is disposed at a position to which the first transfer robot 22 and the first linear transporter 5 are accessible, and serves as a first receiving/delivering mechanism for receiving and delivering a wafer between the first transfer robot 22 and the first linear transporter 5. Specifically, the lifter 32 serves to deliver a wafer reversed by the reversing machine 31 to the first transfer stage TS1 or the fourth transfer stage TS4 in the first linear transporter 5. The lifter 35 in the first polishing section 3a and the lifter 36 in the second polishing section 3b are disposed at positions to which the linear transporters 5, 6 and the second transfer robot 40 in the cleaning section 4 are accessible, and serves as a second receiving/delivering mechanism for receiving and delivering a wafer between the linear transporters 5, 6 and the second transfer robot 40. Specifically, the lifter 35 serves to deliver a wafer placed on the third transfer stage TS3 or the fourth transfer stage TS4 in the first linear transporter 5 to the second transfer robot 40, and the lifter 36 serves to deliver a wafer placed on the fifth transfer stage TS5 or the seventh transfer stage TS7 in the second linear transporter 6 to the second transfer robot 40. The lifters 32, 35, and 36 have the same structure, and only the lifter 32 will be described.

Figure 16:
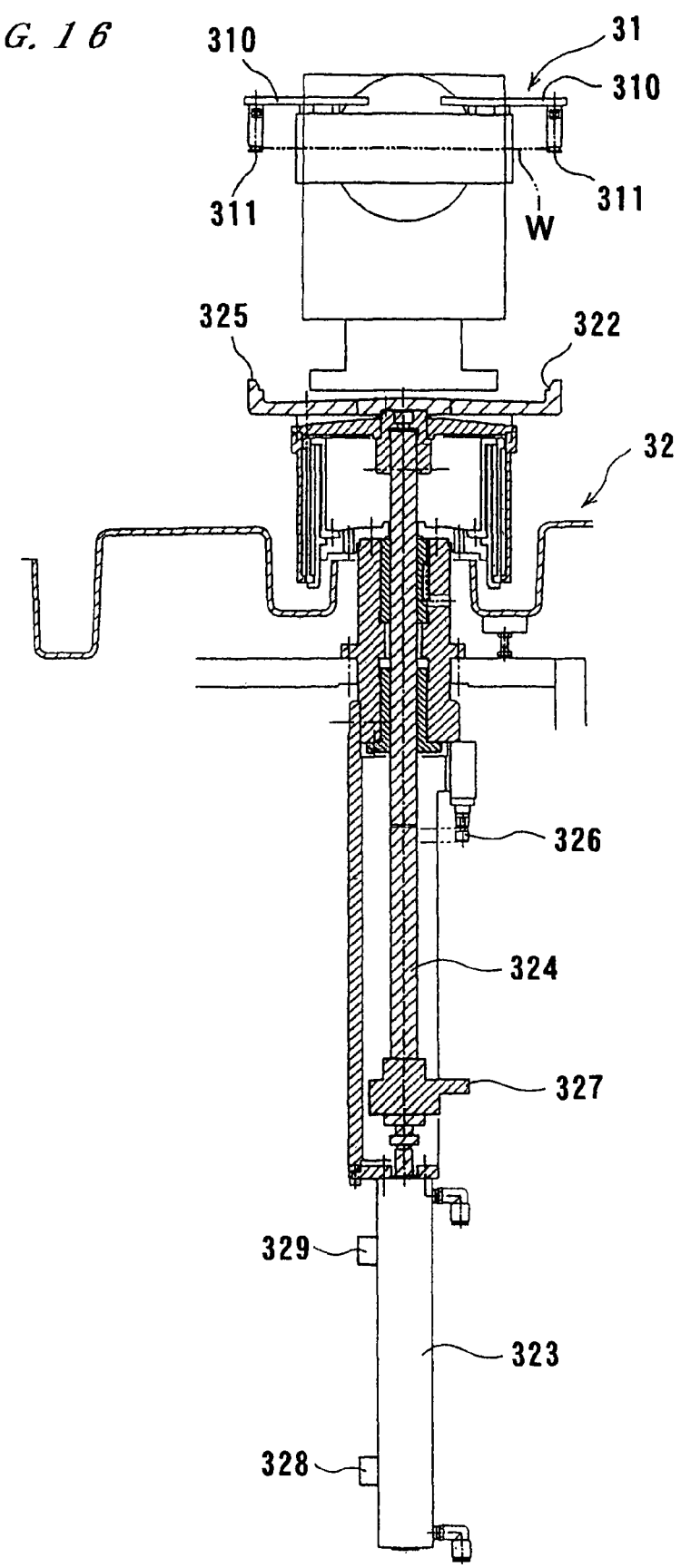
FIG. 16 is a vertical cross-sectional view showing a lifter in the polishing apparatus shown in FIG. 1.

FIG. 16 is a vertical cross-sectional view showing the lifter 32. The lifter 32 comprises a stage 322 for placing a wafer thereon and a cylinder 323 for lifting and lowering the stage 322. The cylinder 323 and the stage 322 are coupled by a slidable shaft 324. The stage 322 has a plurality of claws 325, and respective claws 325 are arranged at angular intervals so that a wafer having an orientation flat can be held and reliably transported. The claws 325 are disposed at positions where they are not aligned with the pins 311 for chucking the wafer in the reversing machine 31. Specifically, a first peripheral edge of a wafer held by the pins 311 for chucking does not correspond to a second peripheral edge of the wafer held by the claws 325 of the lifter 32. The claws 325 which perform transfer of the wafer to the reversing machine 31 and the first linear transporter 5 have respective support surfaces for supporting the wafer thereon, and respective taper surfaces extending upward from the support surfaces so as to absorb errors in transferring and positioning and center the wafer when the wafer is placed on the support surfaces.

The wafer support surfaces of the stage 322 are raised by actuation of the cylinder 323 to a position where the wafer is held by the reversing machine 31. A stopper 326 having a shock absorbing function is provided as a stopper to stop raising of the stage 322. When a stopper base 327 fixed to the shaft of the cylinder 323 contacts the stopper 326, further actuation of the air cylinder 323 is stopped, and lifting of the stage 322 fixed to the shaft of the cylinder 323 is simultaneously stopped. By adjusting a location of the stopper 326, a lifting height of the stage 322 can be adjusted to a transfer position of the wafer between the lifter 32 and the reversing machine 31. Sensors 328 and 329 are provided on the cylinder 323 to detect completion of lifting and lowering of the cylinder 323, respectively.

Next, operation of the lifter having the above structure will be described below. A wafer to be polished is transferred from the first transfer robot 22 to the reversing machine 31. Then, the wafer is reversed so that a pattern surface of the wafer faces downward. The lifter 32 is raised toward the wafer held by the reversing machine 31 and is stopped right below the wafer. When the sensor 329 for detecting lifting of the lifter 32 detects the stop of the lifter 32 at a position where the stage 322 is located right below the wafer, the reversing machine 31 releases the wafer by opening the clamps and the wafer is placed on the stage 322 of the lifter 32. Thereafter, the lifter 32 is lowered while holding the wafer thereon. While the wafer is lowered, the wafer is transferred to the transfer stage TS1 or TS4 of the first linear transporter 5. At that time, the wafer is placed on the pins 50 of the transfer stage. After the wafer is transferred to the first linear transporter 5, the lifter 32 continues to be lowered, and then is stopped when the lifter 32 is lowered by a stroke of the cylinder 323.

The wafer is transferred from the transfer stage TS3 or TS4 of the first linear transporter 5 to the second transfer robot 40 by the lifter 35. A polished wafer is transported by the transfer stage of the first linear transporter 5 to a position above the lifter 35 (the fourth transferring position TP4). After it is confirmed that the wafer placed on the transfer stage TS3 or TS4 of the first linear transporter 5 is located at a position right above the lifter 35 and movement of the wafer is stopped, the lifter 35 starts to be raised. The lifter 35 receives the wafer from the transfer stage TS3 or TS4 of the first linear transporter 5 while the lifter 35 is lifted. Thereafter, the lifter 35 continues to be lifted. Lifting of the wafer is stopped at a transfer position of the wafer to the second transfer robot 40, and thus lifting of the lifter is completed. This completion of lifting of the lifter is detected by the sensor 329 provided on the cylinder 323, and a detecting signal is sent to a control system of an apparatus body to allow the control system to recognize the completion of lifting of the lifter. In response to the signal, the hand of the second transfer robot 40 is moved to receive the wafer. After it is confirmed that the wafer is held by the hand of the second transfer robot 40, the lifter 35 is lowered.

The lifter 36 transfers a wafer from the second transfer robot 40 to the transfer stage TS5 of the second linear transporter 6 in the same manner as the lifter 32, and transfers a wafer from the transfer stage TS7 of the second linear transporter 6 to the second transfer robot 40 in the same manner as the lifter 35.

The pushers 33, 34 in the first polishing section 3a and the pushers 37, 38 in the second polishing section 3b will be described below. The pusher 33 in the first polishing section 3a serves to receive a wafer from the transfer stage TS1 of the first linear transporter 5 and deliver the wafer to the top ring 301A of the first polishing unit 30A, and also serves to receive a polished wafer from the first polishing unit 30A and deliver the wafer to the transfer stage TS2 of the first linear transporter 5. The pusher 34 serves to receive a wafer from the transfer stage TS2 of the first linear transporter 5 and deliver the wafer to the top ring 301B of the second polishing unit 30B, and also serves to receive a polished wafer from the second polishing unit 30B and deliver the wafer to the transfer stage TS3 of the first linear transporter 5. The pusher 37 in the second polishing section 3b serves to receive a wafer from the transfer stage TS5 of the second linear transporter 6 and deliver the wafer to the top ring 301C of the third polishing unit 30C, and also serves to receive a polished wafer from the third polishing unit 30C and deliver the wafer to the transfer stage TS6 of the second linear transporter 6. The pusher 38 serves to receive a wafer from the transfer stage TS6 of the second linear transporter 6 and deliver the wafer to the top ring 301D of the fourth polishing unit 30D, and also serves to receive a polished wafer from the fourth polishing unit 30D and deliver the wafer to the transfer stage TS7 of the second linear transporter 6. Thus, the pushers 33, 34, 37, and 38 serve as a third receiving/delivering mechanism for receiving and delivering wafers between the linear transporters 5, 6 and respective top rings. The pushers 33, 34, 37, and 38 have the same structure, and only the pusher 33 will be described below.

Figure 17:
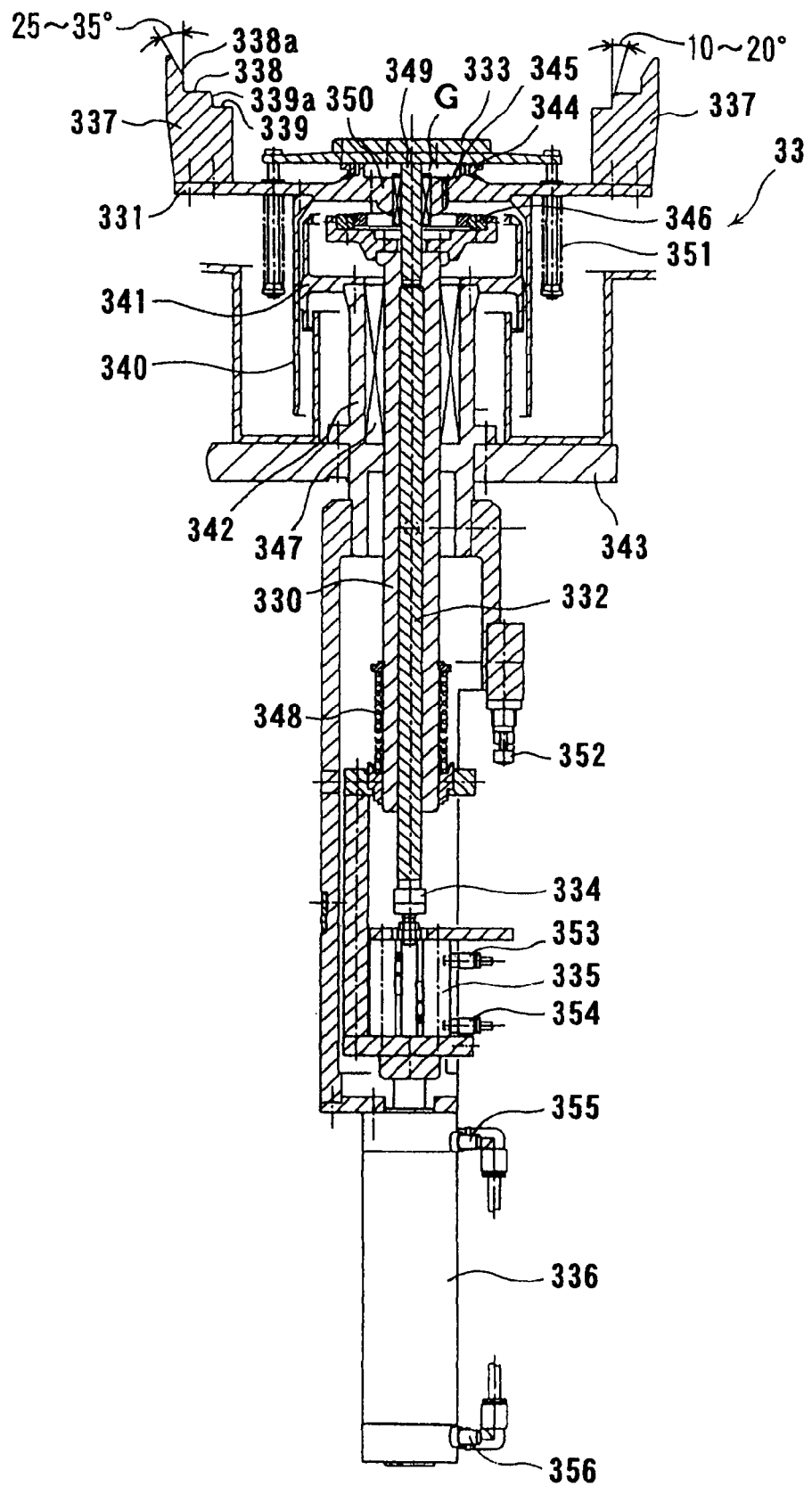
FIG. 17 is a vertical cross-sectional view showing a pusher in the polishing apparatus shown in FIG. 1.

FIG. 17 is a vertical cross-sectional view showing the pusher 33. As shown in FIG. 17, the pusher 33 has a guide stage 331 provided above a hollow shaft 330 for holding a top ring, a spline shaft 332 extending through the hollow shaft 330, and a push stage 333 provided above the spline shaft 332 for holding a wafer thereon. Air cylinders 335, 336 are coupled to the spline shaft 332 through a floating joint 334, which can flexibly be connected to the shaft against displacement of the shaft. The two air cylinders 335 and 336 are disposed vertically in series. Lower air cylinder 336 serves to lift and lower the guide stage 331 and the push stage 333. The lower air cylinder 336 lifts and lowers the hollow shaft 330 together with upper air cylinder 335. The air cylinder 335 serves to lift and lower the push stage 333.

Four top ring guides 337 are provided at an outer circumferential portion of the guide stage 331. Each top ring guide 337 has a two-stage structure including an upper stage 338 and a lower stage 339. The upper stage 338 of the top ring guides 337 serves as a contact portion with a lower surface of the guide ring 3104 (see FIG. 7) of the top ring, whereas the lower stage 339 serves as a centering portion for centering a wafer and a support portion for supporting the wafer. The upper stage 338 has a tapered surface 338a formed (preferably at an angle of about 25° to about 35°) for guiding the top ring toward the upper stage 338. The lower stage 339 has a tapered surface 339a formed (preferably at an angle of about 10° to about 20°) for guiding the wafer W toward the lower stage 339. When the wafer is unloaded from the top ring 301A, the top ring guides 337 directly receive a peripheral edge of the wafer.

A guide sleeve 340 having a water proof function and a function for guiding the guide stage 331 so as to be returned to its original position is provided below the guide stage 331. A center sleeve 341 for centering the pusher is fixed to a bearing case 342 located inside of the guide sleeve 340. The pusher 33 is connected through the bearing case 342 to a motor housing 343 in the polishing section.

A V-ring 344 is used to prevent water from entering between the push stage 333 and the guide stage 331. The V-ring 344 has a lip held in contact with the guide stage 331 to prevent water from passing therethrough. When the guide stage 331 is lifted, a volume of a portion G is increased to lower pressure in the portion G so as to draw water into the portion G. In order to prevent water from being drawn into the portion G, a hole 345 is defined in an inner side of the V-ring 344 for preventing the pressure in the portion G from being lowered.

The pusher 33 has a linear way 346 movable in directions of an X-axis and a Y-axis for allowing the top ring guide 337 to have an alignment mechanism. The guide stage 331 is fixed to the linear way 346. The linear way 346 is fixed to the hollow shaft 330. The hollow shaft 330 is held through a slide bush 347 by the bearing case 342. A stroke of the air cylinder 336 is transmitted through a compression spring 348 to the hollow shaft 330.

The push stage 333 is located above the guide stage 331. The push stage 333 has a push rod 349 extending downward from a center of the push stage 333. The push rod 349 passes through a slide bush 350 located at a center of the guide stage 331 so that the push rod 349 is centered. The push rod 349 is brought into contact with an upper end of the spline shaft 332. The push stage 333 is vertically moved by the spline shaft 332 with the cylinder 335 so that the wafer W is loaded on the top ring 301A. The push stage 333 has compression springs 351 provided at a peripheral portion thereof for positioning the push stage 333.

A shock killer 352 is provided for positioning the top ring guides 337 in a vertical direction and for shock-absorbing when the top ring guides 337 contact the top ring 301A. Each of the air cylinders has upper and lower limit sensors for detecting a position of the pusher in a vertical direction. Specifically, the air cylinder 335 has sensors 353 and 354, and the air cylinder 336 has sensors 355 and 356. The pusher 33 has a cleaning nozzle for cleaning the pusher 33 so as to prevent slurry attached to the pusher from contaminating the wafer. The pusher may have a sensor for detecting presence of a wafer positioned on the pusher. The air cylinders 335 and 336 are controlled by double solenoid valves, respectively.

Operation of the pusher 33 thus constructed will be described below. FIGS. 18A through 18E are views explanatory of operation of the pusher 33.

1) Loading a Wafer

Figure 18:
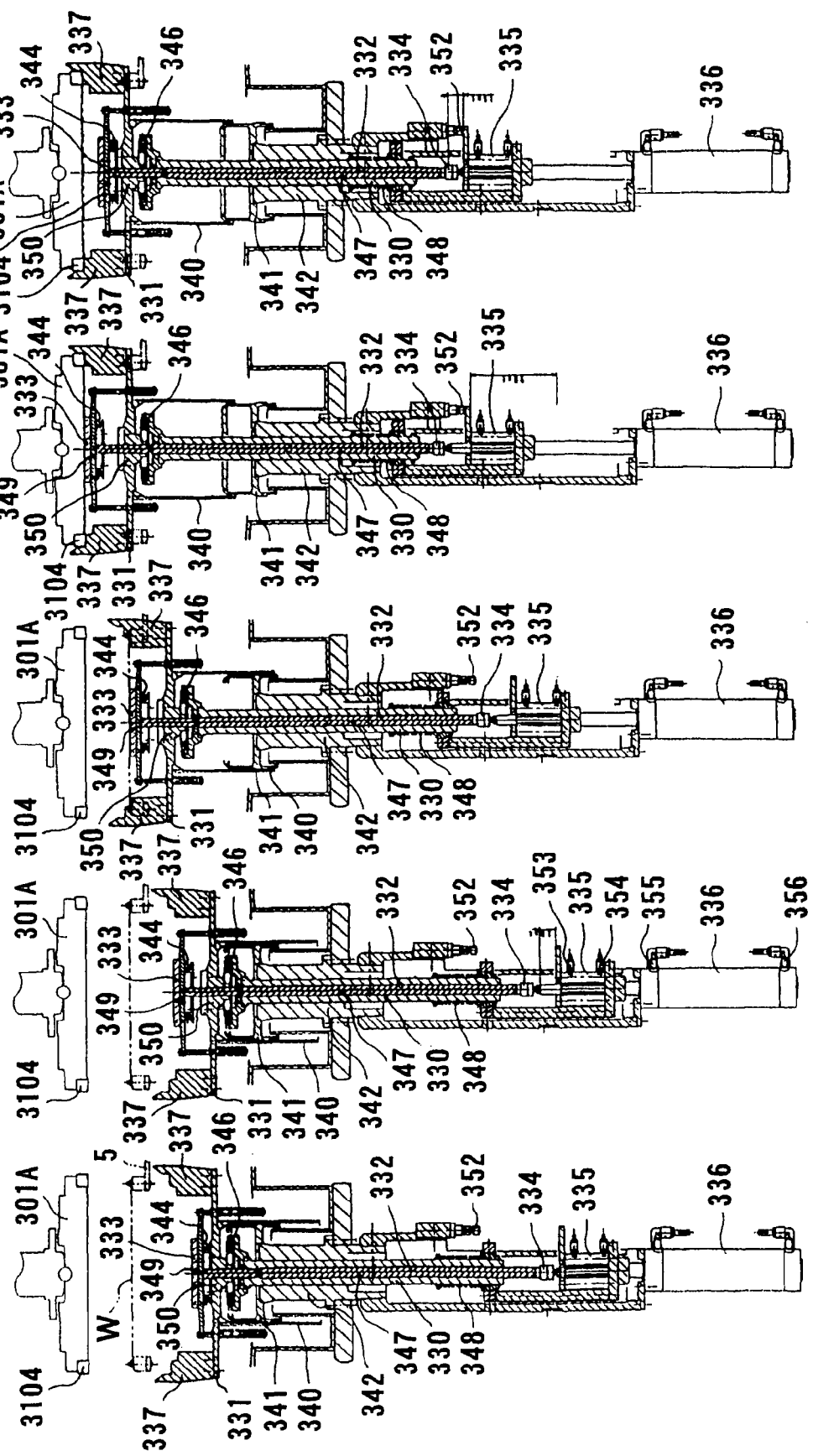
FIGS. 18A through 18E are views explanatory of operation of the pusher shown in FIG. 17.

As shown in FIG. 18A, a wafer W is transferred to a position above the pusher 33 by the first linear transporter 5. When the top ring 301A is located at a wafer loading position (i.e., the second transferring position) above the pusher 33 and does not hold the wafer, the push stage 333 is lifted by the air cylinder 335, as shown in FIG. 18B. When the sensor 353 detects completion of lifting the push stage 333, the guide stage 331 and the components associated with the guide stage 331 are lifted by the air cylinder 336, as shown in FIG. 18C. While the guide stage 331 is lifted, the guide stage 331 passes through the wafer holding position of the transfer stage of the first linear transporter 5. At that time, the wafer W is centered by the tapered surfaces 339a of the top ring guides 337 and held by the push stage 333 at a pattern surface of the wafer W (at portions other than the peripheral edge thereof).

While the push stage 333 holds the wafer W, the top ring guides 337 are lifted without being stopped, and the guide ring 3104 is guided by the tapered surfaces 338a of the top ring guides 337. The center of the top ring guides 337 is aligned with the center of the top ring 301A by the linear way 346 movable in X and Y directions, and the upper stages 338 of the top ring guides 337 contact a lower surface of the guide ring 3104 and lifting of the guide stage 331 is stopped.

When the upper stages 338 of the top ring guides 337 are brought into contact with the lower surface of the guide ring 3104, the guide stage 331 is fixed and is not lifted anymore. However, the air cylinder 336 continues a lifting motion until the air cylinder 336 is brought into contact with the shock killer 352. Accordingly, only the spline shaft 332 continues to be lifted because the compression spring 348 is compressed, and the push stage 333 is further lifted. At that time, as shown in FIG. 18D, the push stage 333 holds the wafer W at the pattern surface of the wafer W (at portions other than the peripheral edge thereof), and transports the wafer W to the top ring 301A. After the wafer W is brought into contact with the top ring 301A, a lifting stroke of the cylinder 336 is absorbed by the springs 351 to thereby protect the wafer W.

After the top ring 301A completes attraction of the wafer W, the pusher starts to be lowered to the position shown in FIG. 18A. When the pusher is lowered, the guide stage 331, which has moved its center for centering the top ring, is centered by a taper portion formed on the guide sleeve 340 and the taper portion formed on the center sleeve 341. When lowering of the pusher is completed, an operation of loading of the wafer is completed.

2) Unloading a Wafer

The wafer W is transported by the top ring 301A to a wafer unloading position located above the pusher. When the transfer stage of the first linear transporter 5 is located above the pusher 33 and does not hold the wafer, the guide stage 331 and components associated with the guide stage 331 are lifted by the air cylinder 336, and the guide ring 3104 is guided by the tapered surfaces 338a of the top ring guides 337. The center of the top ring guides 337 is aligned with the center of the top ring 301A by the linear way 346, and the upper stages 338 of the top ring guides 337 are brought into contact with the lower surface of the guide ring 3104 and lifting of the guide stage 331 is stopped.

The air cylinder 336 continues to be actuated until the air cylinder 336 contacts the shock killer 352. However, since the upper stages 338 of the top ring guides 337 contact the lower surface of the guide ring 3104 to cause the guide stage 331 to be fixed at this position, the air cylinder 336 pushes the spline shaft 332 together with the air cylinder 335 against an urging force of the compression spring 348, thus lifting the push stage 333. At that time, as shown in FIG. 18E, the push stage 333 is not raised to a position higher than the wafer holding portion of the lower stages 339 of the top ring guides 337. In this embodiment, the air cylinder 336 is arranged to be further actuated after the top ring guides 337 contact the guide ring 3104. A shock at that time is absorbed by the compression spring 348.

After lifting actuation of the air cylinder 336 is completed, the wafer W is released from the top ring 301A. At that time, the wafer W is centered by the lower tapered surfaces 339a of the top ring guides 337, and the wafer W is held by the lower stages 339 of the top ring guides 337 at the peripheral edge of the wafer W. After the wafer W is held by the pusher, the pusher starts to be lowered. While the guide stage 331 is lowered, the guide stage 331, which has moved its center for centering the top ring, is centered by the guide sleeve 340 and the center sleeve 341. While the guide stage 331 is lowered, the wafer W is transferred from the pusher to the first linear transporter 5 at the peripheral edge thereof. When lowering of the guide stage 331 is completed, an operation of unloading of the wafer is completed.

Next, the cleaning devices 42-45 in the cleaning section 4 will be described below. For example, the primary cleaning device 42 and the secondary cleaning device 43 may comprise a roll type cleaning device which rotates and presses upper and lower roll-shaped sponges against reverse and front sides of a wafer to clean the reverse and front sides of the wafer. For example, tertiary cleaning device 44 may comprise a pencil type cleaning device which rotates and presses a hemispherical sponge against a wafer to clean the wafer. For example, quaternary cleaning device 45 may comprise a pencil type cleaning device which rinses a reverse side of a wafer and rotates and presses a hemispherical sponge against a front side of the wafer to clean the wafer. The quaternary cleaning device 45 has a stage for rotating a chucked wafer at a high rotational speed, and thus has a function (spin-drying function) to dry a cleaned wafer by rotating the wafer at a high rotational speed. In the cleaning devices 42-45, a megasonic type cleaning device which applies ultrasonic waves to a cleaning liquid to clean a wafer may be provided in addition to the roll type cleaning device described above.

Figure 19:
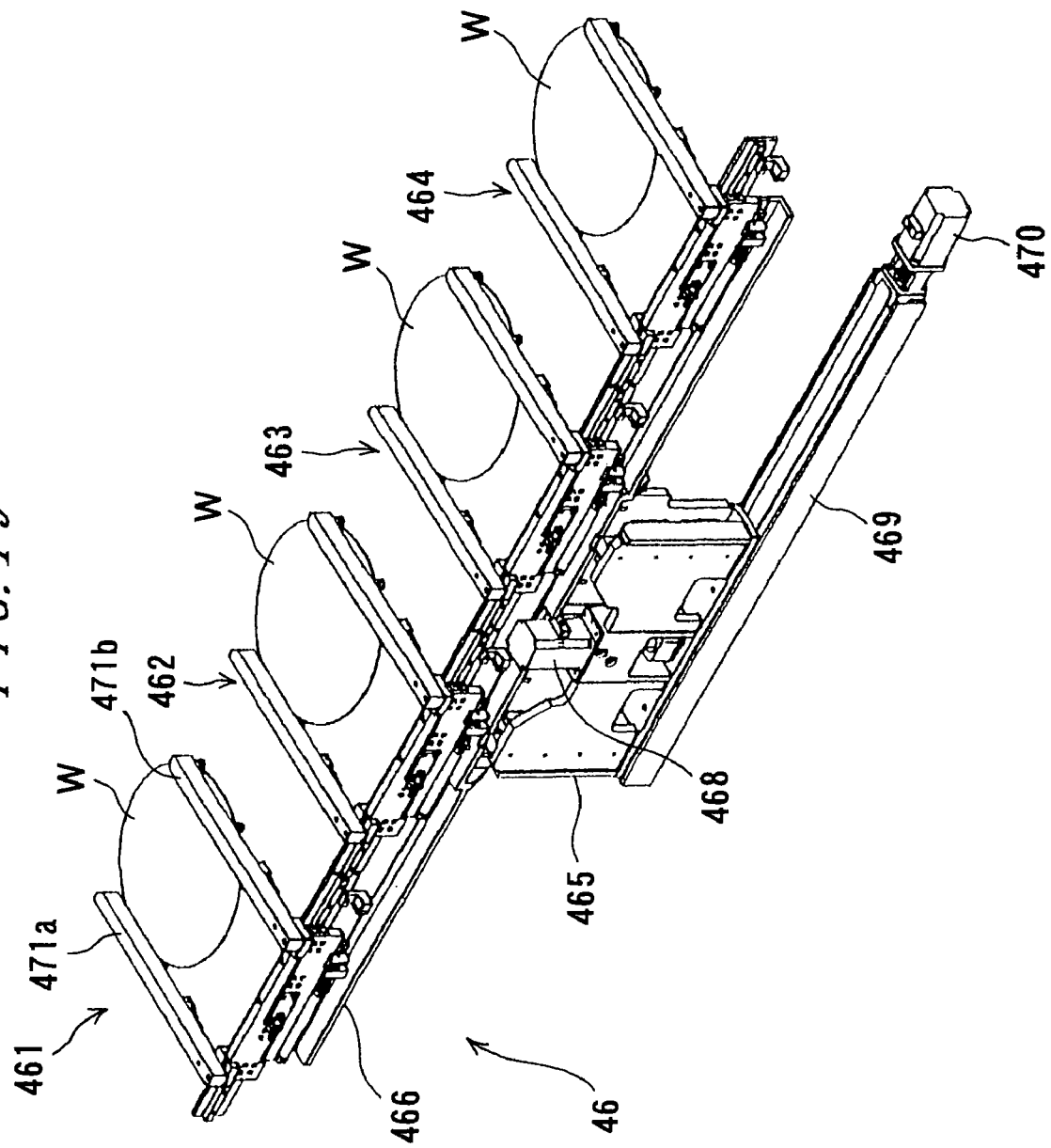
FIG. 19 is a perspective view showing a transfer unit in the polishing apparatus shown in FIG. 1.
Figure 20:
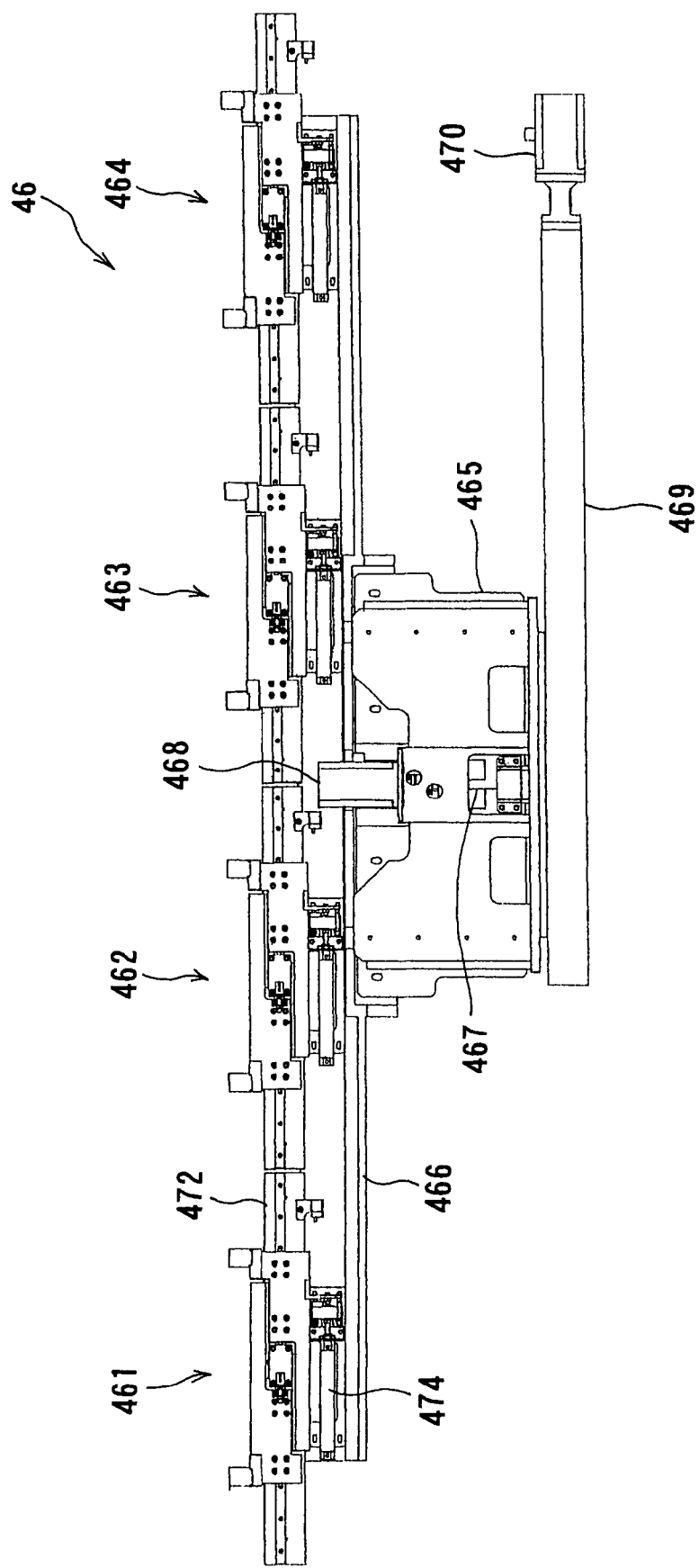
FIG. 20 is a front view of FIG. 19.

Next, the transfer unit 46 in the cleaning section 4 will be described below. FIG. 19 is a perspective view showing the transfer unit 46, FIG. 20 is a front view thereof, and FIG. 21 is a plan view thereof. As shown in FIGS. 19 through 21, the transfer unit 46 has four chucking units 461-464 as a holding mechanism for detachably holding wafers in the cleaning devices. The chucking units 461-464 are mounted on a guide frame 466 extending horizontally from a main frame 465. A ball screw 467 extending vertically is mounted on the main frame 465. The main frame 465 and the chucking units 461-464 are vertically moved by actuation of a motor 468 coupled to the ball screw 467. Thus, the motor 468 and the ball screw 467 constitute a vertically moving mechanism for vertically moving the chucking units 461-464. A ball screw 469 extending horizontally in parallel with an array of the cleaning devices 42-45 is mounted on the main frame 465. The main frame 465 and the chucking units 461-464 are horizontally moved by actuation of a motor 470 coupled to the ball screw 469. Thus, the motor 470 and the ball screw 469 constitute a moving mechanism for moving the chucking units 461-464 along a direction of the array of the cleaning devices 42-45.

Figure 22A:
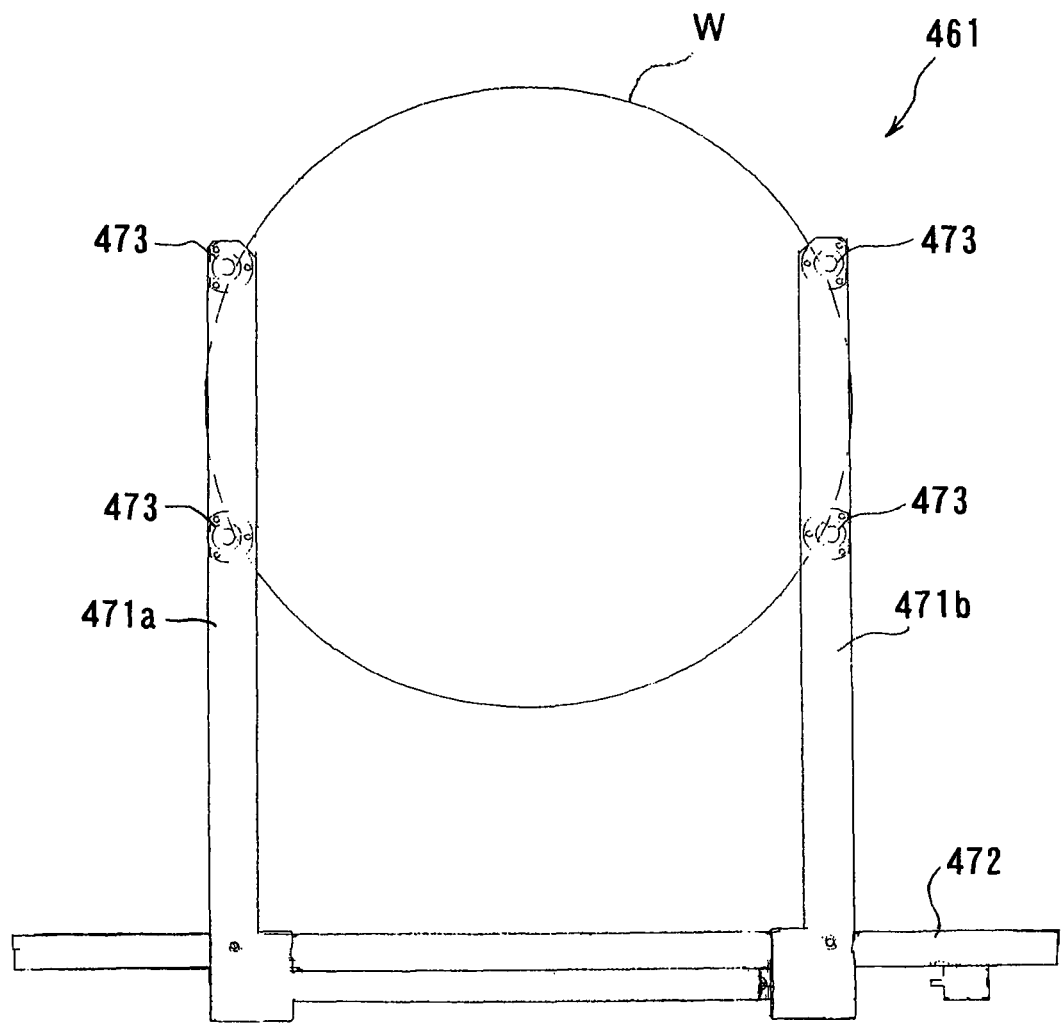
FIGS. 22A and 22B show a chucking unit of the transfer unit shown in FIG. 19, with FIG. 22A being a plan view, and FIG. 22B being a front view.
Figure 22B:
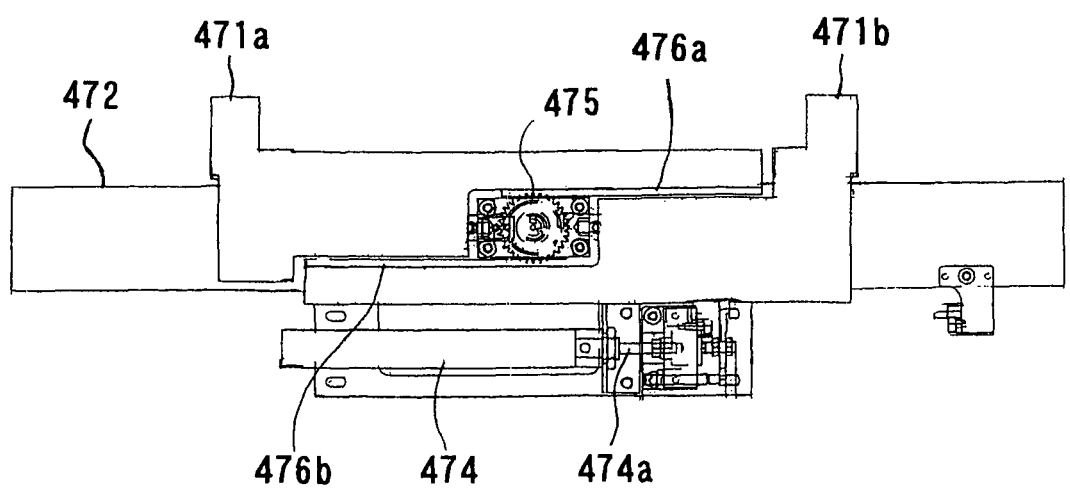

FIGS. 22A and 22B show the chucking unit 461. FIG. 22A is a plan view of the chucking unit 461, and FIG. 22B is a front view thereof. The present embodiment employs the same number of the chucking units as the cleaning devices 42-45. The chucking units 461-464 have the same structure, and only the chucking unit 461 will be described below. As shown in FIGS. 22A and 22B, the chucking unit 461 has a pair of arms 471a, 471b openable and closable for holding a wafer W and a base 472 on which the arms 471a, 471b are mounted. The arms 471a and 471b have at least three chucking pins 473 (four in the present embodiment). The chucking pins 473 clamp and hold a peripheral edge of a wafer W to transfer the wafer to a next cleaning device.

As shown in FIG. 22B, a shaft 474a of an air cylinder 474 is connected to one of the arms 471b to open the arm 471b. The air cylinder 474 and the base 472 are fixed to the guide frame 466, respectively. The base 472 has a pinion 475, and respective arms 471a, 471b have racks 476a, 476b which engage with the pinion 475. Therefore, when one of the arms 471b is opened by the air cylinder 474, the other of arms 471a is simultaneously opened via the rack 476a by engagement of the rack 476b of the arm 471b and the pinion 475. Thus, the chucking unit clamps and holds an edge surface of the wafer W between the arms 471a and 471b. Respective chucking units can detect a stroke of the air cylinder to detect presence of a wafer. A wafer may be held by vacuum suction. In such a case, vacuum pressure can be measured to detect presence of a wafer.

Figure 23A:
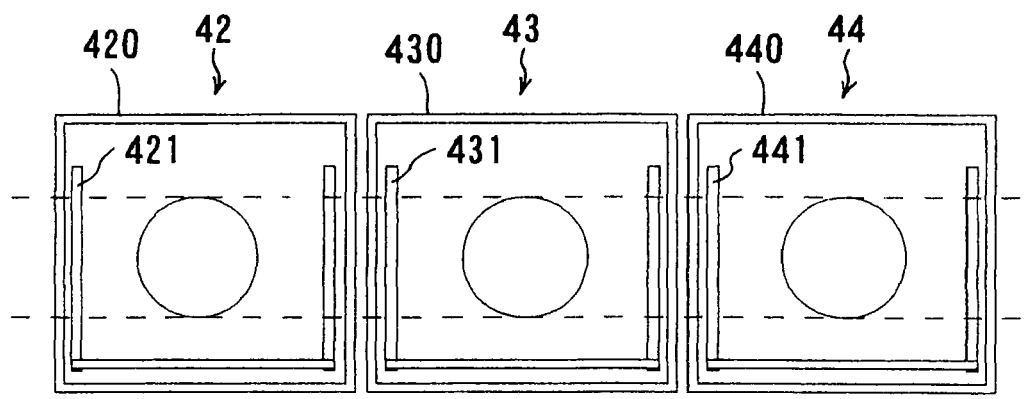
FIGS. 23A and 23B are views explanatory of operation of the transfer unit shown in FIG. 19, with FIG. 23A being a horizontal cross-sectional view, and FIG. 23B being a vertical cross-sectional view.
Figure 23B:
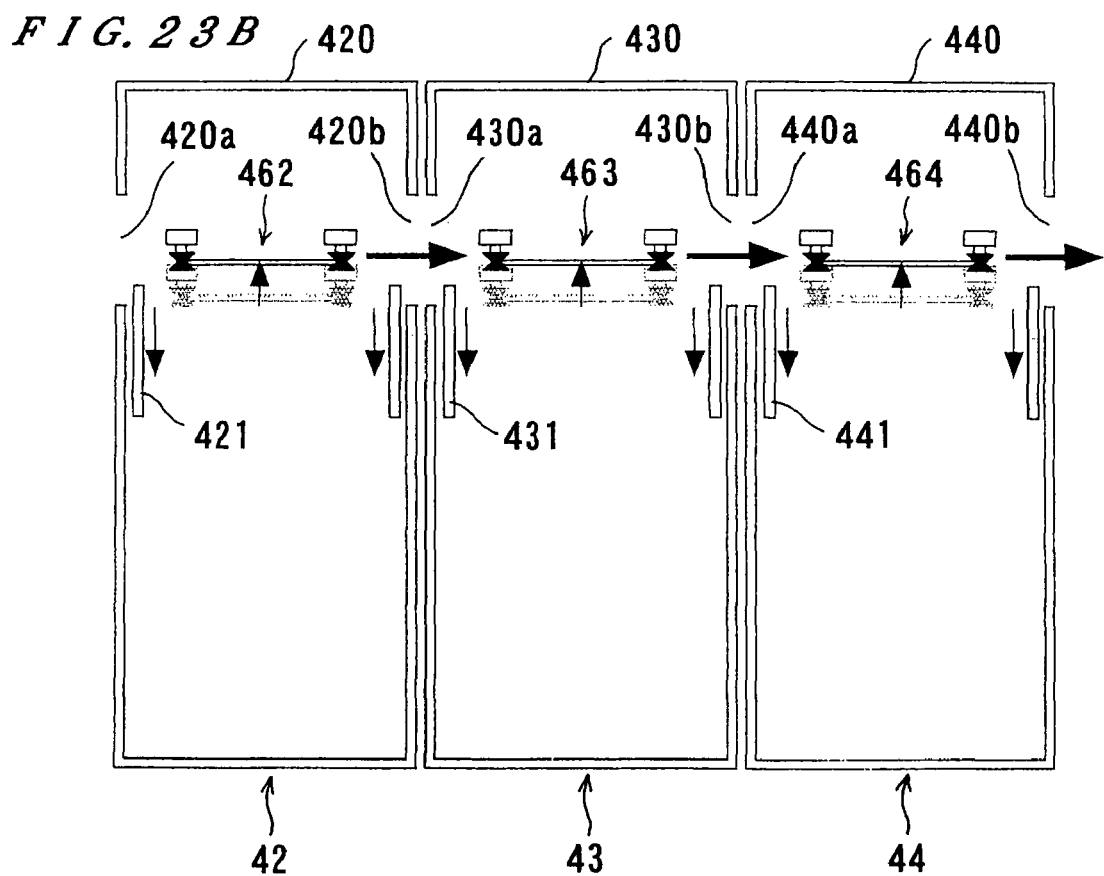

Next, operation of the transfer unit 46 thus constructed will be described below. FIGS. 23A and 23B are views explanatory of operation of the transfer unit shown in FIG. 19. FIG. 23A is a horizontal cross-sectional view, and FIG. 23B is a vertical cross-sectional view. As shown in FIGS. 23A and 23B, respective cleaning devices 42-45 (FIGS. 23A and 23B show only the cleaning devices 42-44) are partitioned by partition walls 420, 430, 440 and the like to prevent a used liquid from scattering during cleaning. The partition walls have openings 420a, 420b, 430a, 430b, 440a, 440b and the like for allowing the chucking units of the transfer unit 46 to pass therethrough. Shutters 421, 431, 441 and the like are provided on the openings.

When wafers are not transferred, the shutters are closed, and respective chucking units 461-464 stand by at a space (standby position) above the reversing machine 41 or the cleaning devices 42-44. At this standby position, the pair of arms of the chucking unit 461 are located on both sides of the reversing machine 41 (this position is a standby position for a wafer to be cleaned), the pair of arms of the chucking unit 462 are located on both sides of the primary cleaning device 42, the pair of arms of the chucking unit 463 are located on both sides of the secondary cleaning device 43, and the pair of arms of the chucking unit 464 are located on both sides of the tertiary cleaning device 42.

When wafers are transferred, the respective chucking units 461-464 are lowered to a wafer position within the reversing machine 41 or cleaning tanks by actuation of the motor 468 of the transfer unit 46. Then, the arms are opened and closed by actuation of the air cylinders 474 of the respective chucking units to hold the wafers within the reversing machine 41 or the cleaning tanks. Thereafter, the chucking units 461-464 are lifted to positions at which the openings 420a, 420b, 430a, 430b, 440a, 440b and the like are formed by actuation of the motor 468 of the transfer unit 46, and the shutters 421, 431, 441 and the like are opened. By actuation of the motor 470 of the transfer unit 46, the chucking unit 461 is introduced into the primary cleaning device 42 through the opening 420a, the chucking unit 462 is introduced into the secondary cleaning device 43 through the openings 420b and 430a, the chucking unit 463 is introduced into the tertiary cleaning device 44 through the openings 430b and 440a, and the chucking unit 464 is introduced into the quaternary cleaning device 45 through the opening 440b. After wafers are transferred to the cleaning devices 42-45, the shutter is closed, and the chucking units 461-464 are lowered to the wafer holding mechanisms within the cleaning tanks by actuation of the motor 470. Then, the arms are opened and closed by actuation of the air cylinders 474 of the respective chucking units to deliver wafers held by the arms to the wafer holding mechanisms within the cleaning tanks.

Thus, in the present embodiment, semiconductor wafers can be transferred simultaneously from the reversing machine 41 to the primary cleaning device, from the primary cleaning device to the secondary cleaning device, from the secondary cleaning device to the tertiary cleaning device, and from the tertiary cleaning device to the quaternary cleaning device, respectively. Since a wafer can be transferred within a cleaning device to a next cleaning device without being taken out of the cleaning devices, a stroke required for transferring wafers can be minimized, and a time required for transferring wafers can be reduced. Although it is not shown, a standby position at which a wafer stands by after being cleaned may be provided adjacent to the quaternary cleaning device 45 so that a wafer that has been cleaned by the quaternary cleaning device 45 is moved to this standby position by the transfer unit 46.

Instead of the reversing machine 41 in the cleaning section 4, a film thickness measuring device may be provided. FIGS. 24A through 24F are views explanatory of operation of such a film thickness measuring device. As shown in FIG. 24A, the film thickness measuring device comprises a wafer reversing and holding mechanism 470 for holding and reversing a semiconductor wafer, a handling unit 471 for holding the semiconductor wafer under suction, and a film thickness measuring unit 472 having a wafer measuring window 472a on an upper surface thereof. The film thickness measuring unit 472 serves to measure thickness of a wafer. When a wafer is placed on the wafer measuring window 472a on the upper surface of the film thickness measuring unit, the film thickness of the wafer is detected. The film thickness measuring unit 472 is disposed substantially in a vertical direction with respect to the wafer reversing and holding mechanism 470.

The wafer reversing and holding mechanism 470 of the film thickness measuring device is disposed at the same position as the reversing machine 41. The wafer reversing and holding mechanism 470 holds a wafer by at least three chucking pins (holding portions) 470b fixed to arms 470a and reverses the wafer, which has been received in a state such that a pattern surface faces downward (face-down), so that the pattern surface faces upward (face-up). The wafer reversing and holding mechanism 470 has a notch aligning function to detect a notch of the wafer and position a wafer when the film thickness of the wafer is measured. The handling unit 471 of the film thickness measuring device is vertically reversible and vertically movable and is used as a transferring mechanism for transferring a wafer between the wafer reversing and holding mechanism 470 and the film thickness measuring unit 472. The handling unit 471 has vacuum suction hands (vacuum suction portions) 471a and 471b for attracting wafers under vacuum suction in a vertical direction. Two wafers are simultaneously attracted by these vacuum suction hands 471a and 471b. One of the vacuum suction hands 471a is used to attract a wafer before film thickness measurement, and the other of the vacuum suction hands 471b is used to attract a wafer after the film thickness measurement.

A plurality of nozzles (not shown) for preventing a wafer from being dried are provided at the wafer standby position. When a wafer remains for a long period of time, pure water is ejected from the nozzles to prevent the wafer from being dried. The film thickness measuring device has a tank-like structure to prevent pure water ejected from the nozzles from scattering. The wafer reversing and holding mechanism 470 has a sensor for detecting presence of a wafer based on an opening angle of the arms 470a. The handling unit 471 has a sensor for detecting presence of a wafer by detecting a vacuum pressure.

First, the hand of the second transfer robot 40 is inserted into the film thickness measuring device (FIG. 24A), and a polished wafer W1 is held by the chucking pins 470b of the wafer reversing and holding mechanism 470 in a face-down state (FIG. 24B). The chucking pins 470b are rotatable, and notch aligning of the wafer W1 can be performed by rotation of the chucking pins 470b.

Next, the wafer reversing and holding mechanism 470 reverses the wafer W1 so that the wafer W1 is in a face-up state. Then, the handling unit 471 is lifted, and a reverse side of the wafer W1 is attracted by the vacuum suction hand 471a (FIG. 24C). Thereafter, the wafer reversing and holding mechanism 470 releases the wafer W1 (FIG. 24D), and the handling unit 471 holding the wafer W1 under suction is lowered (FIG. 24E). When the handling unit 471 is lowered by a predetermined distance, the handling unit 471 is reversed so that the wafer W1 is reversed into a face-down state (FIG. 24F). At that time, the wafer reversing and holding mechanism 470 is also reversed.

After reversing the wafer W1, the handling unit 471 is lowered to place this attracted wafer W1 on the wafer measuring window 472a of the film thickness measuring unit 472, and measurement of the film thickness is started (FIG. 24G). After the wafer W1 is placed on the wafer measuring window 472a, the handling unit 471 is lifted and reversed. At that time, a next wafer W2 is inserted into the film thickness measuring device by the hand of the second transfer robot 40 (FIG. 24H). This inserted wafer W2 is held by the chucking pin 470b of the wafer reversing and holding mechanism 470 as with the wafer W1 (FIG. 24I).

Similarly, the wafer reversing and holding mechanism 470 reverses the wafer W2 so that the wafer W2 is in a face-up state. Then, the handling unit 471 is lifted, and a reverse side of the wafer W2 is attracted by the vacuum suction hand 471a (FIG. 24J). Thereafter, the wafer reversing and holding mechanism 470 releases the wafer W2 (FIG. 25A), and the handling unit 471 holding the wafer W2 under suction is lowered (FIG. 25B). At that time, the handling unit 471 is not reversed. When the film thickness measurement of the wafer W1 is completed, the handling unit 471 is further lowered to attract the wafer W1 after the film thickness measurement by the vacuum suction hand 471b (FIG. 25C). Thereafter, the handling unit 471 is lifted (FIG. 25D) and reversed at a predetermined position (FIG. 25E). Thus, the wafer W1 after the film thickness measurement becomes in a face-up state, and the wafer W2 before film thickness measurement becomes in a face-down state.

Then, the handling unit 471 is lowered to place the wafer W2 on the wafer measuring window 472a of the film thickness measuring unit 472, and measurement of a film thickness is started (FIG. 25F). Thereafter, the handling unit 471 is lifted while attracting the wafer W1 after the film thickness measurement under suction (FIG. 25G) and transfers the wafer W1 to the wafer reversing and holding mechanism 470

(FIG. 25H). The wafer W1 after the film thickness measurement is held in a face-up state by the chucking pin 470b of the wafer reversing and holding mechanism 470 (FIG. 25I), and the handling unit 471 is lowered again (FIG. 25J).

Next, the chucking unit 461 of the transfer unit 46 is introduced into the film thickness measuring device (FIG. 26A), and the wafer W1 after the film thickness measurement is held by the chucking unit 461 (FIG. 26B). The wafer W1 is transferred to the primary cleaning device 42 (FIGS. 26C and 26D). After the wafer W1 after the film thickness measurement, is transferred, the wafer reversing and holding mechanism 470 is reversed (FIG. 26E), and a next wafer W3 is introduced into the film thickness measuring device by the hand of the second transfer robot 40 (FIG. 26F). Thereafter, processes shown in FIGS. 24A through 26F are repeated.

Operation of polishing wafers with use of the polishing apparatus thus constructed will be described below.

When serial processing is performed, a wafer is transferred on the following route: the wafer cassette of the front loading portion 20→the first transfer robot 22→the reversing machine 31→the lifter 32→the first transfer stage TS1 of the first linear transporter 5→the pusher 33→the top ring 301A→the polishing table 300A→the pusher 33→the second transfer stage TS2 of the first linear transporter 5→the pusher 34→the top ring 301B→the polishing table 300B→the pusher 34→the third transfer stage TS3 of the first linear transporter 5→the lifter 35→the second transfer robot 40→the lifter 36 the fifth transfer stage TS5 of the second linear transporter 6→the pusher 37→the top ring 301C→the polishing table 300C→the pusher 37→the sixth transfer stage TS6 of the second linear transporter 6→the pusher 38→the top ring 301D→the polishing table 300D→the pusher 38→the seventh transfer stage TS7 of the second linear transporter 6→the second transfer robot 40→the reversing machine 41→the chucking unit 461 of the transfer unit 46→the primary cleaning device 42→the chucking unit 462 of the transfer unit 46→the secondary cleaning device 43→the chucking unit 463 of the transfer unit 46→the tertiary cleaning device 44→the chucking unit 464 of the transfer unit 46→the quaternary cleaning device 45→the first transfer robot 22→the wafer cassette of the front loading portion 20.

Figure 27A:
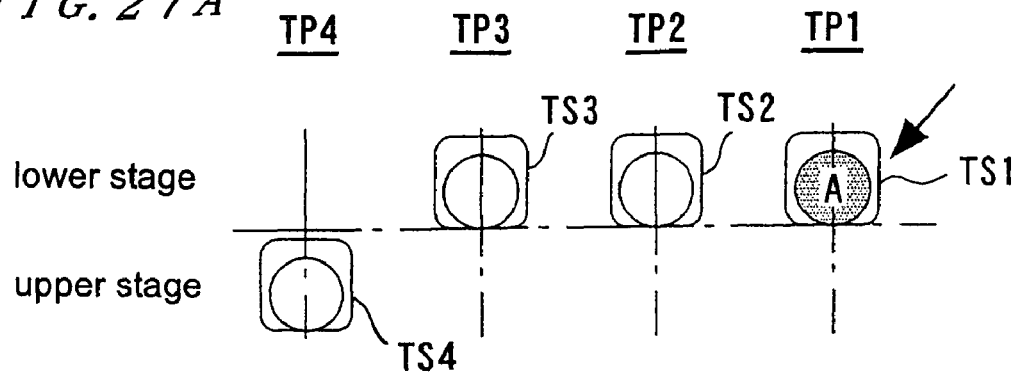
FIGS. 27A through 27D are schematic views explanatory of operation of the first linear transporter when serial processing is performed.

Operation of the linear transporters 5 and 6 will be described below with reference to FIGS. 27A through 33E. First, the first transfer robot 22 picks up a wafer A from the wafer cassette on the front loading portion 20 and transfers the wafer A to the reversing machine 31. The reversing machine 31 chucks the wafer A and then reverses the wafer A by 180°. Then, the lifter 32 is lifted, so that the wafer A is placed on the lifter 32. Then, the lifter 32 is lowered, so that the wafer A is placed on the first transfer stage TS1 of the first linear transporter 5 (FIG. 27A).

Figure 27B:
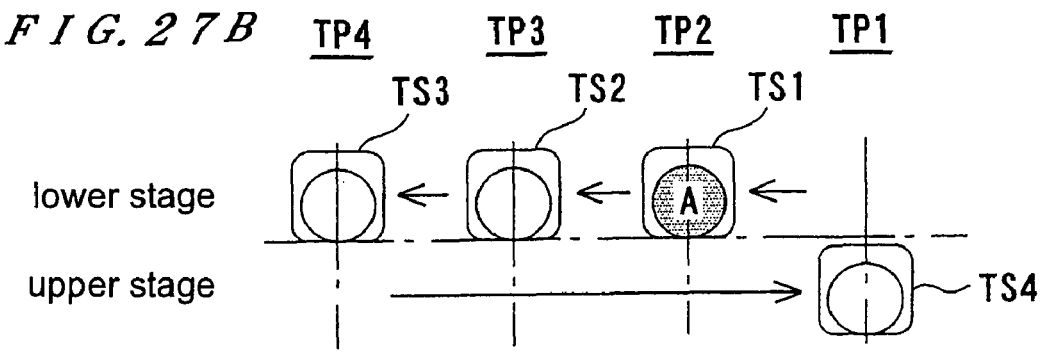

After the wafer A is placed on the first transfer stage TS1 of the first linear transporter 5, the lifter 32 continues to be lowered until a position in which the lifter 32 does not interfere with the first transfer stage TS1 even if the first transfer stage TS1 is moved. When lowering of the lifter 32 is completed, the lower transfer stages TS1, TS2, and TS3 move toward the fourth transferring position TP4, and the upper transfer stage TS4 moves toward the first transferring position TP1. Thus, the wafer A on the first transfer stage TS1 is moved to the wafer receiving/delivering position (second transferring position TP2) for the top ring 301A (FIG. 27B).

Figure 27C:
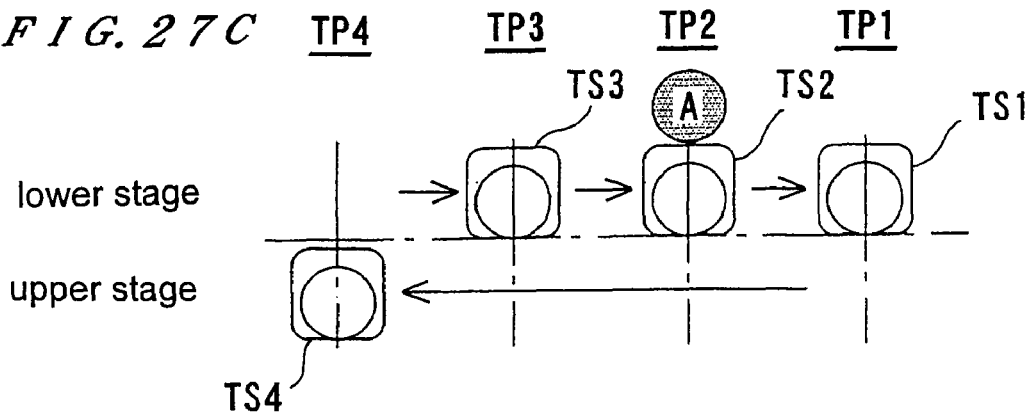
Figure 27D:
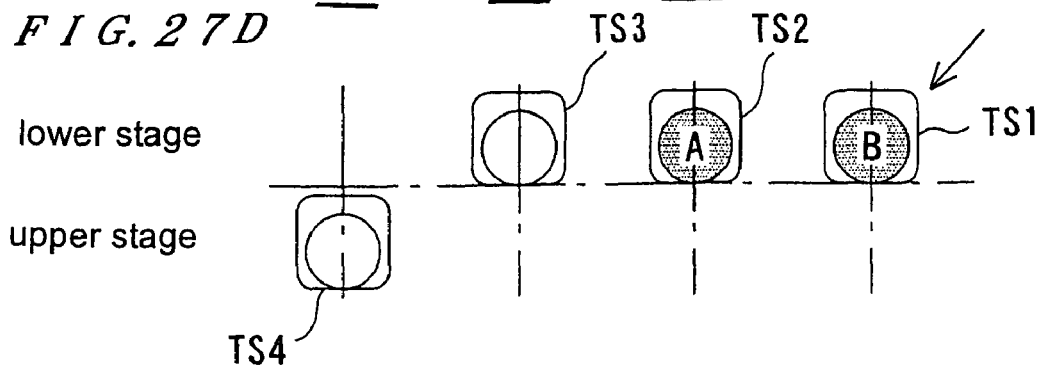

Then, the pusher 33 located at the second transferring position TP2 is lifted to transfer the wafer A to the top ring 301A. At that time, the lower transfer stages TS1, TS2, and TS3 move toward the first transferring position TP1, and the upper transfer stage TS4 moves toward the fourth transferring position TP4 (FIG. 27C). The wafer A delivered to the top ring 301A is attracted by a vacuum suction mechanism of the top ring 301A, and moved to the polishing table 300A while being attracted by the vacuum suction mechanism. Then, the wafer A is polished by the polishing surface, such as a polishing cloth or a grinding stone, attached onto the polishing table 300A. This polished wafer A is moved above the pusher 33 by the swinging motion of the top ring 301A and transferred to the pusher 33. The wafer A is placed on the second transfer stage TS2 when the pusher 33 is lowered (FIG. 27D). At that time, a next wafer B is placed on the first transfer stage TS1 as described above.

Figure 28A:
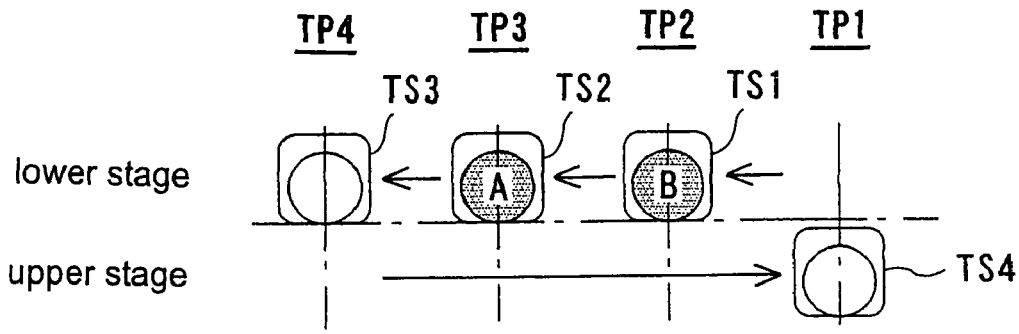
FIGS. 28A through 28D are schematic views explanatory of operation of the first linear transporter when serial processing is performed.

Then, the lower transfer stages TS1, TS2, and TS3 move toward the fourth transferring position TP4, and the upper transfer stage TS4 moves toward the first transferring position TP1. Thus, the wafer A on the second transfer stage TS2 is moved to the wafer receiving/delivering position (third transferring position TP3) for the top ring 301B, and the wafer B on the first transfer stage TS1 is moved to the wafer receiving/delivering position (second transferring position TP2) for the top ring 301A (FIG. 28A).

Figure 28B:
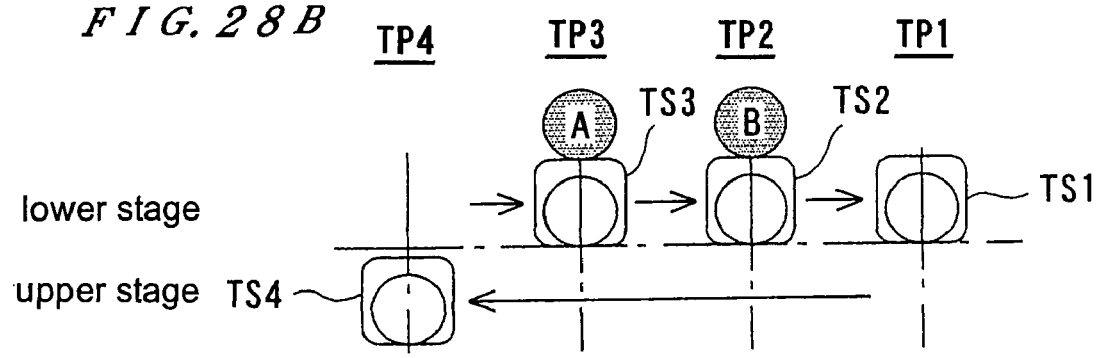
Figure 28C:
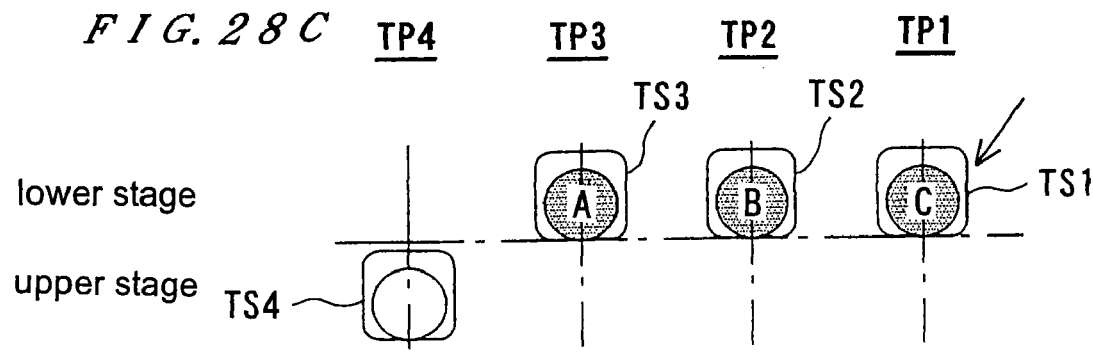

Then, the pusher 34 located at the third transferring position TP3 and the pusher 33 located at the second transferring position TP2 are lifted to transfer the wafer A and the wafer B to the top ring 301B and the top ring 301A, respectively. At that time, the lower transfer stages TS1, TS2, and TS3 move toward the first transferring position TP1, and the upper transfer stage TS4 moves toward the fourth transferring position TP4 (FIG. 28B). The wafer A and the wafer B which have been polished in the respective polishing units are placed on the third transfer stage TS3 and the second transfer stage TS2 by the pushers 34 and 33, respectively (FIG. 28C). At that time, a next wafer C is placed on the first transfer stage TS1 as described above.

Figure 28D:
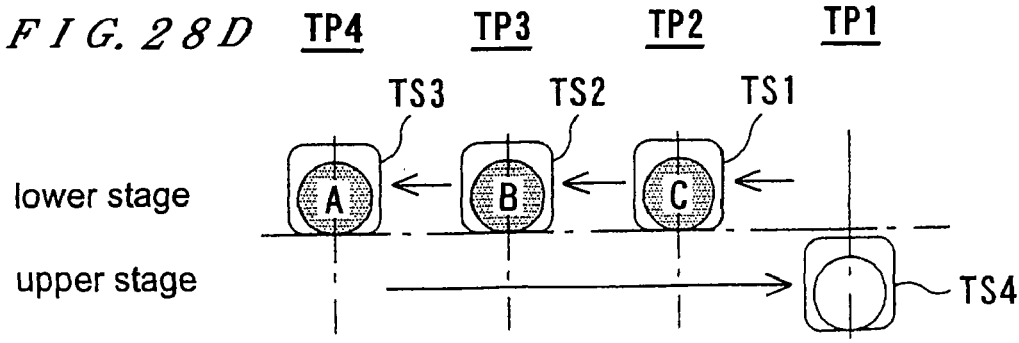

Then, the lower transfer stages TS1, TS2, and TS3 move toward the fourth transferring position TP4, and the upper transfer stage TS4 moves toward the first transferring position TP1. Thus, the wafer A on the third transfer stage TS3 is moved to the fourth transferring position TP4 at which the lifter 35 is disposed, the wafer B on the second transfer stage TS2 is moved to the wafer receiving/delivering position (third transferring position TP3) for the top ring 301B, and the wafer C on the first transfer stage TS1 is moved to the wafer receiving/delivering position (second transferring position TP2) for the top ring 301A (FIG. 28D).

Figure 29A:
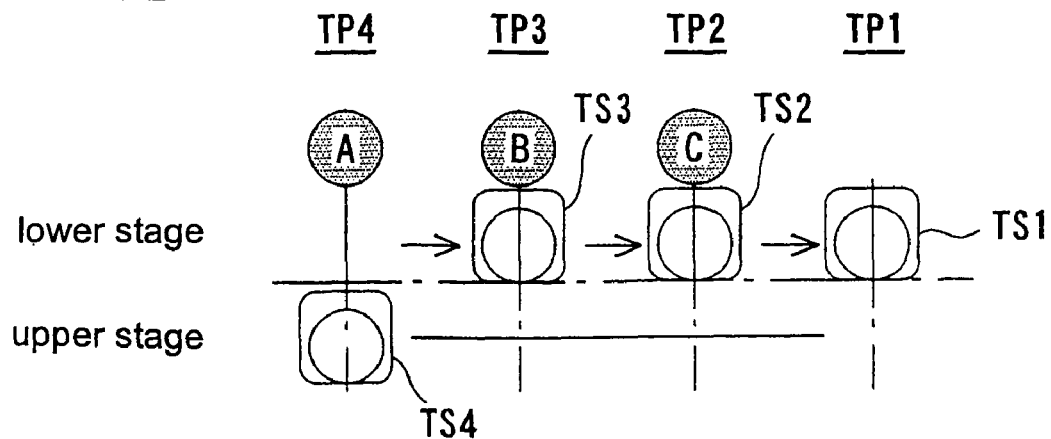
FIGS. 29A through 29D are schematic views explanatory of operation of the first linear transporter when serial processing is performed.
Figure 29B:
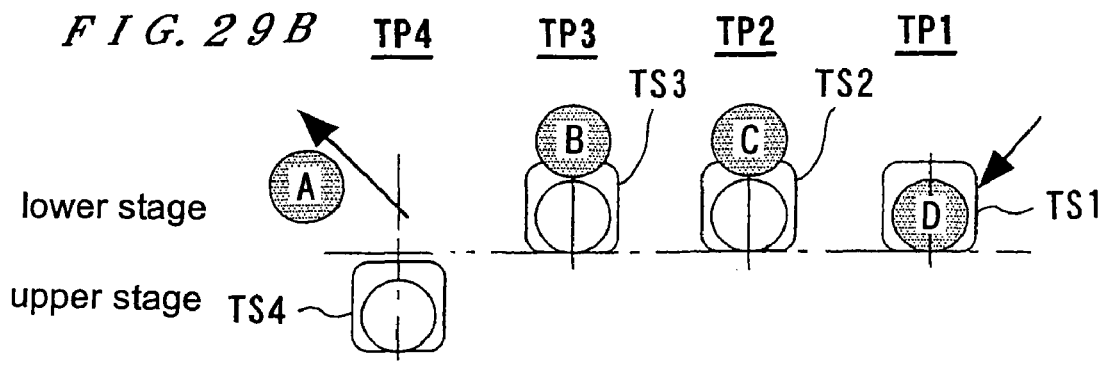
Figure 29C:
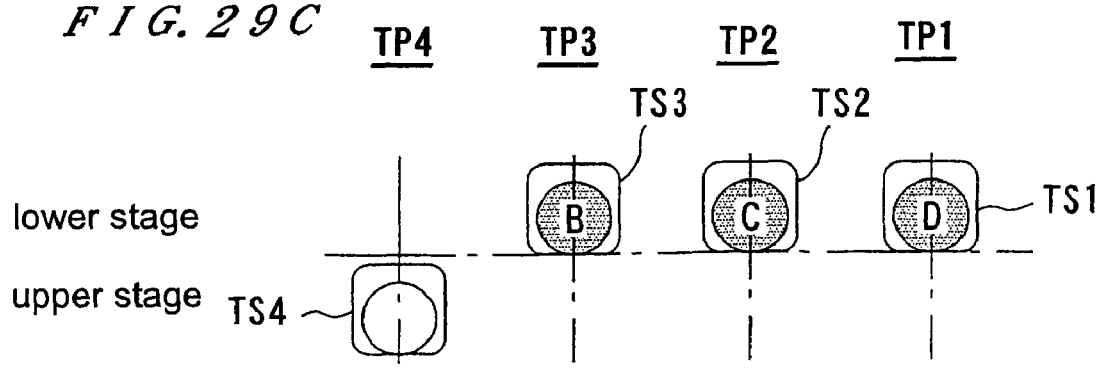

Then, the pusher 34 located at the third transferring position TP3 and the pusher 33 located at the second transferring position TP2 are lifted to transfer the wafer B and the wafer C to the top ring 301B and the top ring 301A, respectively. Further, the lifter 35 located at the fourth transferring position TP4 is lifted to transfer the wafer A to the second transfer robot 40. At that time, the lower transfer stages TS1, TS2, and TS3 move toward the first transferring position TP1, and the upper transfer stage TS4 moves toward the fourth transferring position TP4 (FIG. 29A). The wafer B and the wafer C which have been polished in respective polishing units are placed on the third transfer stage TS3 and the second transfer stage TS2 by the pushers 34 and 33, respectively, and the wafer A is transferred to the second polishing section 3b by the second transfer robot 40 (FIG. 29B). At that time, a next wafer D is placed on the first transfer stage TS1 as described above (FIGS. 29B and 29C).

Figure 29D:
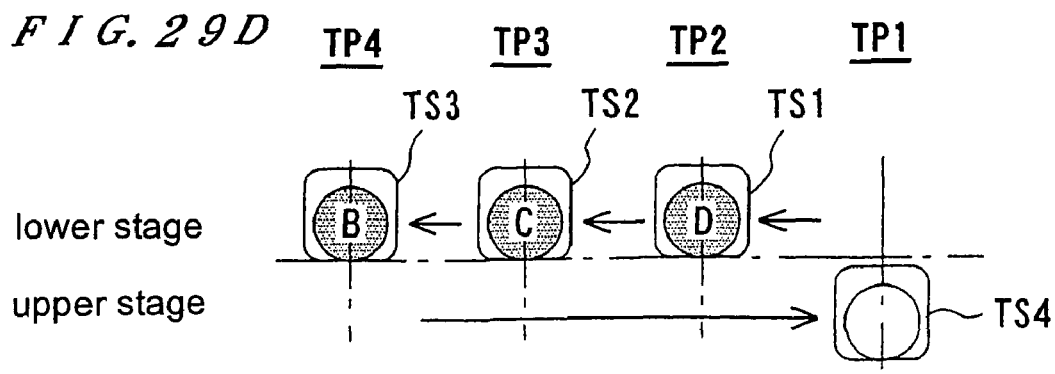

Then, the lower transfer stages TS1, TS2, and TS3 move toward the fourth transferring position TP4, and the upper transfer stage TS4 moves toward the first transferring position TP1. Thus, the wafer B on the third transfer stage TS3 is moved to the fourth transferring position TP4 at which the lifter 35 is disposed, the wafer C on the second transfer stage TS2 is moved to the wafer receiving/delivering position (third transferring position TP3) for the top ring 301B, and the wafer D on the first transfer stage TS1 is moved to the wafer receiving/delivering position (second transferring position TP2) for the top ring 301A (FIG. 29D).

Figure 30A:
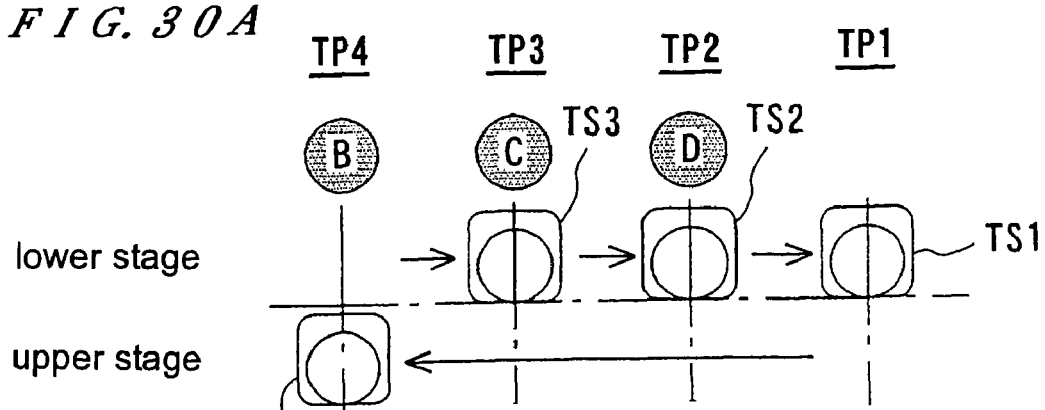
FIGS. 30A through 30D are schematic views explanatory of operation of the first linear transporter when serial processing is performed.
Figure 30B:
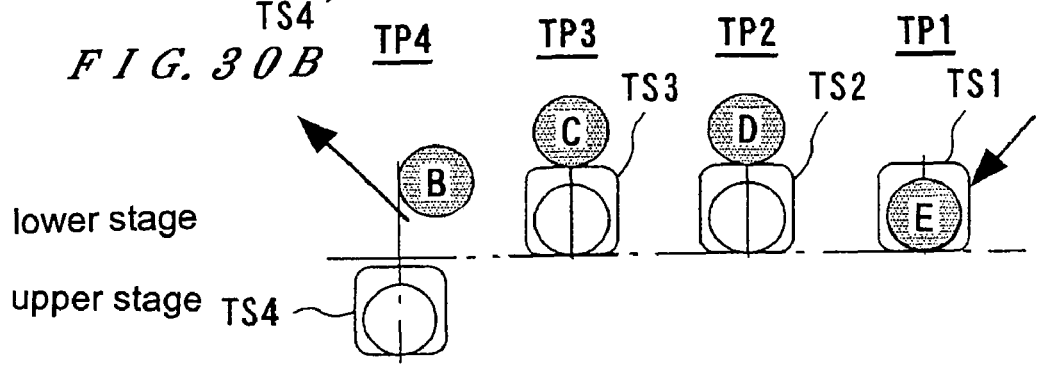
Figure 30C:
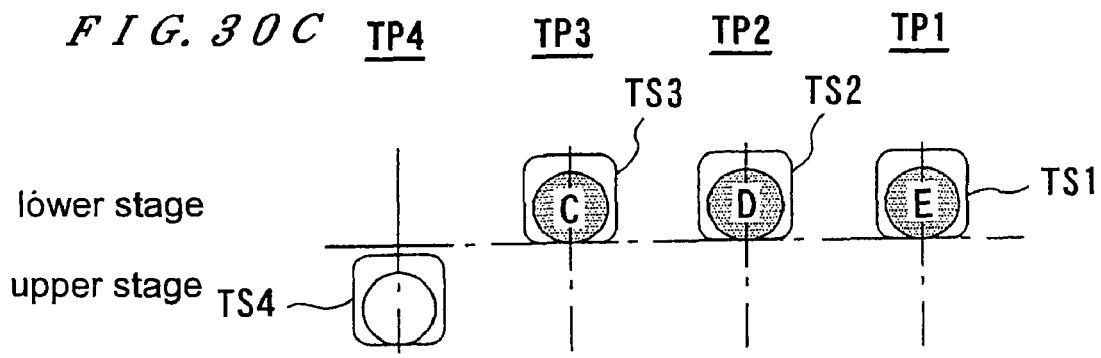

Then, the pusher 34 located at the third transferring position TP3 and the pusher 33 located at the second transferring position TP2 are lifted to transfer the wafer C and the wafer D to the top ring 301B and the top ring 301A, respectively. Further, the lifter 35 located at the fourth transferring position TP4 is lifted to transfer the wafer B to the second transfer robot 40. At that time, the lower transfer stages TS1, TS2, and TS3 move toward the first transferring position TP1, and the upper transfer stage TS4 moves toward the fourth transferring position TP4 (FIG. 30A). The wafer C and the wafer D which have been polished in the respective polishing units are placed on the third transfer stage TS3 and the second transfer stage TS2 by the pushers 34 and 33, respectively, and the wafer B is transferred to the second polishing section 3b by the second transfer robot 40. At that time, a next wafer E is placed on the first transfer stage TS1 as described above (FIGS. 30B and 30C).

Figure 30D:
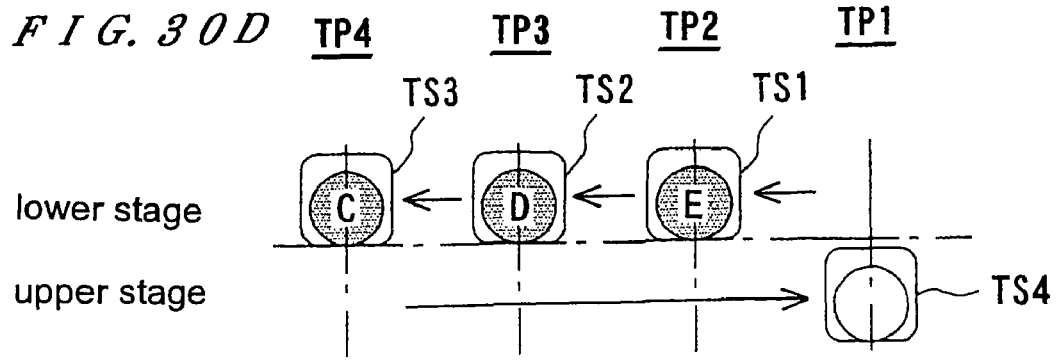

Then, the lower transfer stages TS1, TS2, and TS3 move toward the fourth transferring position TP4, and the upper transfer stage TS4 moves toward the first transferring position TP1. Thus, the wafer C on the third transfer stage TS3 is moved to the fourth transferring position TP4 at which the lifter 35 is disposed, the wafer D on the second transfer stage TS2 is moved to the wafer receiving/delivering position (third transferring position TP3) for the top ring 301B, and the wafer E on the first transfer stage TS1 is moved to the wafer receiving/delivering position (second transferring position TP2) for the top ring 301A (FIG. 30D). Thereafter, processes shown in FIGS. 30A through 30D are repeated.

Figure 31A:
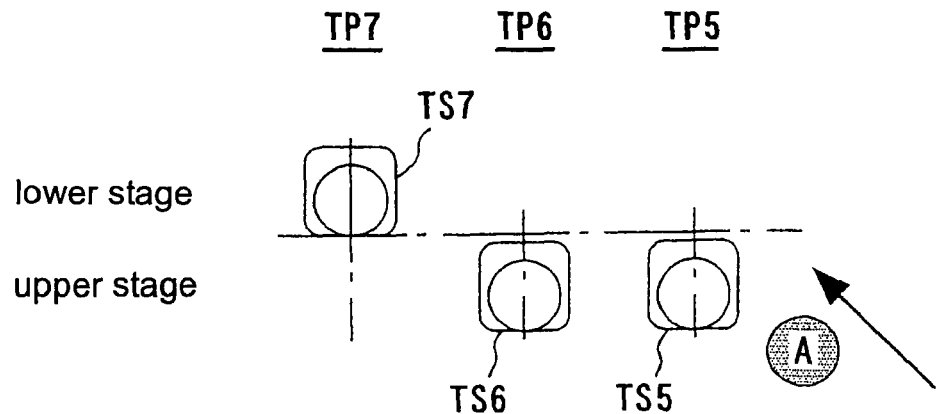
FIGS. 31A through 31D are schematic views explanatory of operation of the second linear transporter when serial processing is performed.
Figure 31B:
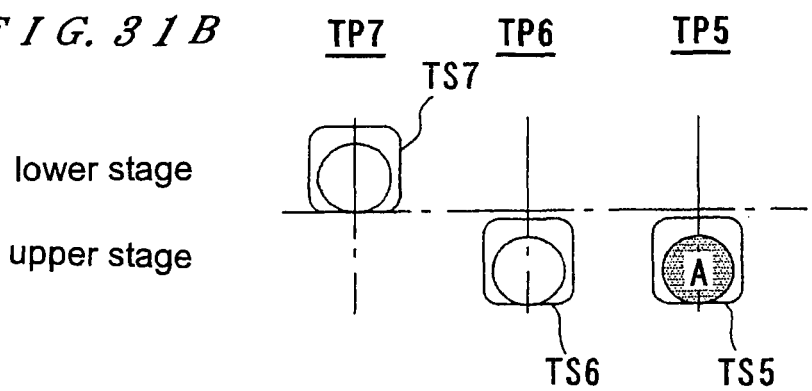

On the other hand, the second transfer robot 40 which has received the wafer A transfers the wafer A to the lifter 36 of the second linear transporter 6 in the second polishing section 3b (FIG. 31A). The wafer A is placed on the lifter 36 when the lifter 36 is lifted. The wafer A is placed on the fifth transfer stage TS5 of the second linear transporter 6 when the lifter 36 is lowered (FIG. 31B).

Figure 31C:
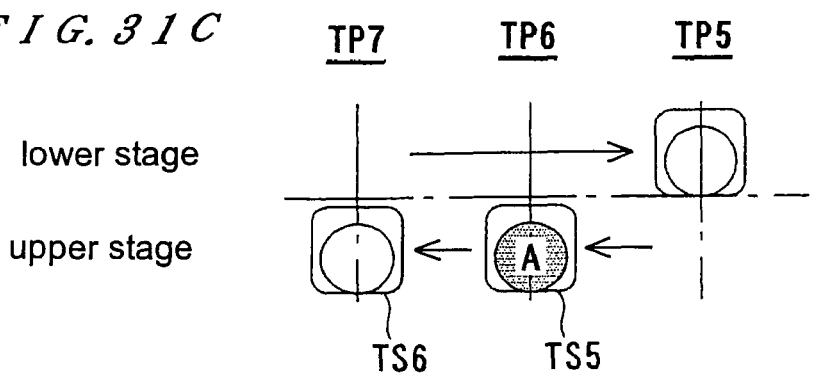

After the wafer A is placed on the fifth transfer stage TS5 of the second linear transporter 6, the lifter 36 continues to be lowered until a position in which the lifter 36 does not interfere with the fifth transfer stage TS5 even if the fifth transfer stage TS5 is moved. When lowering of the lifter 36 is completed, the upper transfer stages TS5 and TS6 move toward the seventh transferring position TP7, and the lower transfer stage TS7 moves toward the fifth transferring position TP5. Thus, the wafer A on the fifth transfer stage TS5 is moved to the wafer receiving/delivering position (sixth transferring position TP6) for the top ring 301C (FIG. 31C).

Figure 31D:
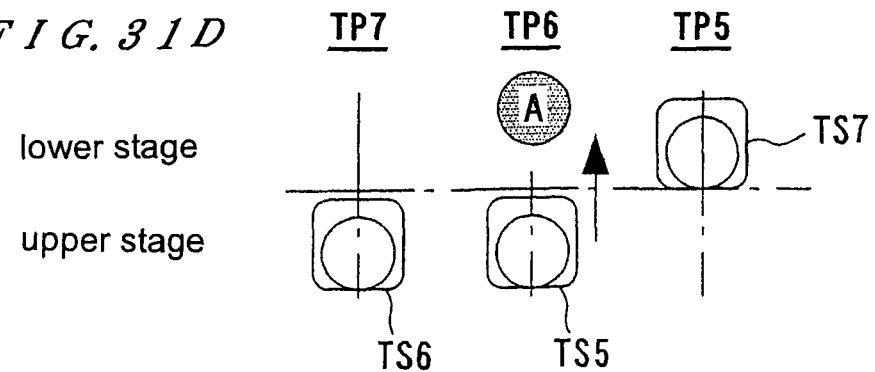
Figure 32A:
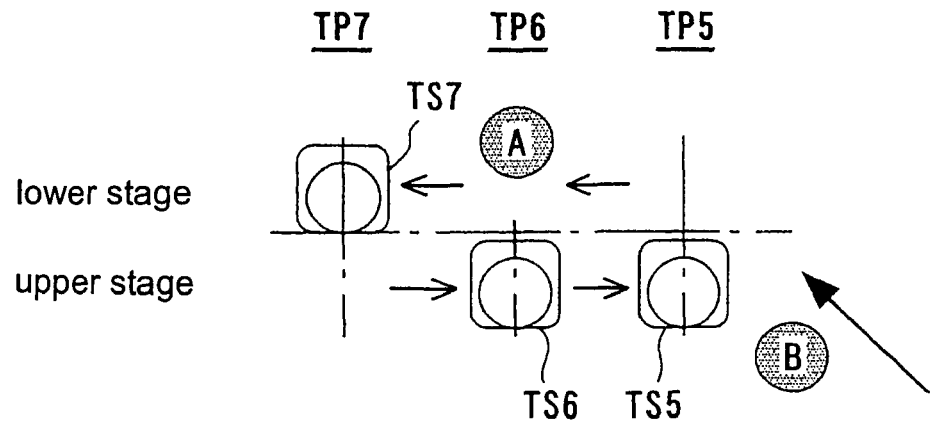
FIGS. 32A through 32D are schematic views explanatory of operation of the second linear transporter when serial processing is performed.
Figure 32B:
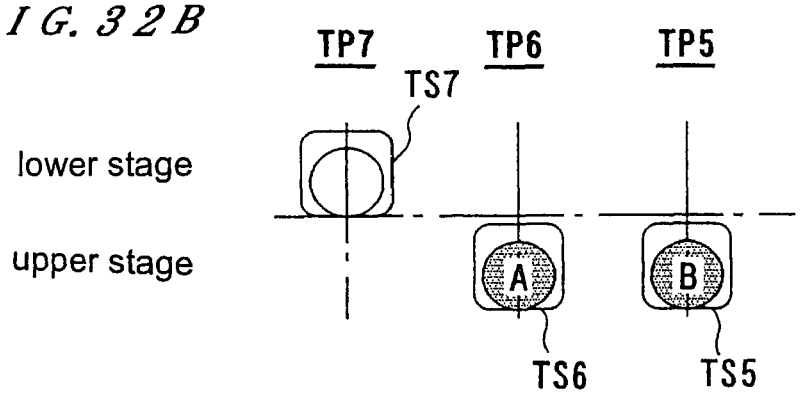

Then, the pusher 37 located at the sixth transferring position TP6 is lifted to transfer the wafer A to the top ring 301C (FIG. 31D). At that time, the upper transfer stages TS5 and TS6 move toward the fifth transferring position TP5, and the lower transfer stage TS7 moves toward the seventh transferring position TP7 (FIG. 32A). Then, the polished wafer A is placed on the sixth transfer stage TS6 (FIG. 32B). At that time, the next wafer B is placed on the fifth transfer stage TS5 as described above.

Figure 32C:
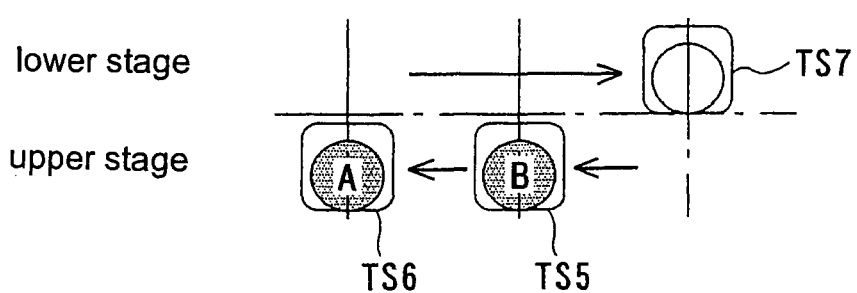

Then, the upper transfer stages TS5 and TS6 move toward the seventh transferring position TP7, and the lower transfer stage TS7 moves toward the fifth transferring position TP5. Thus, the wafer A on the sixth transfer stage TS6 is moved to the wafer receiving/delivering position (seventh transferring position TP7) for the top ring 301D, and the wafer B on the fifth transfer stage TS5 is moved to the wafer receiving/delivering position (sixth transferring position TP6) for the top ring 301C (FIG. 32C).

Figure 32D:
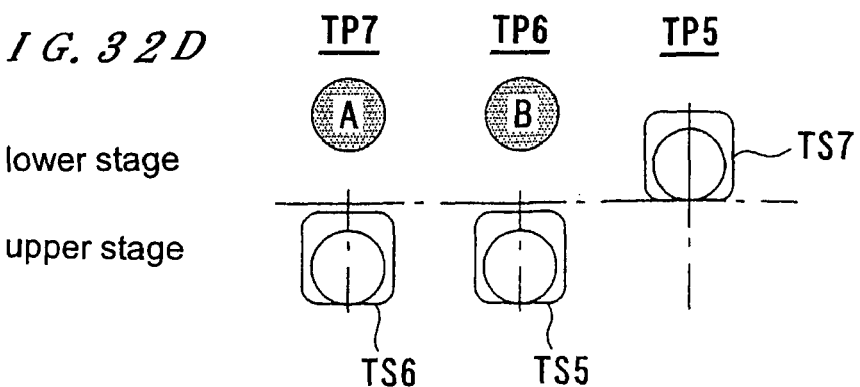
Figure 33A:
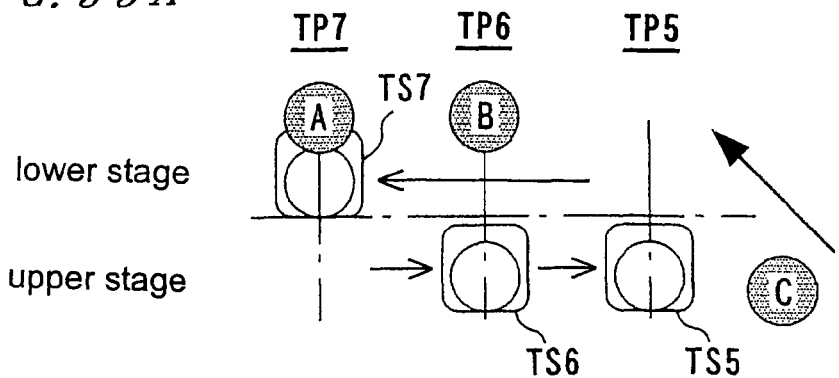
FIGS. 33A through 33E are schematic views explanatory of operation of the second linear transporter when serial processing is performed.
Figure 33B:
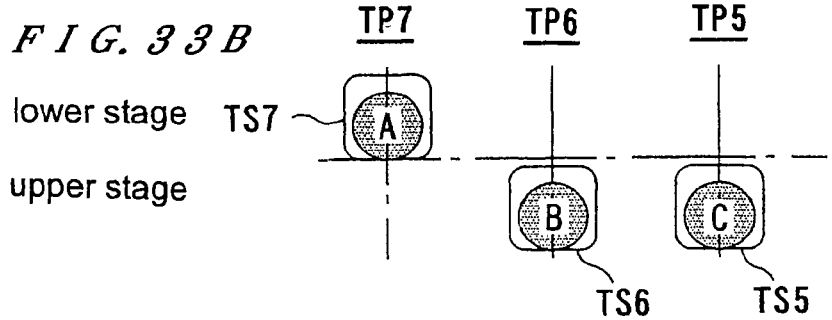
Figure 33C:
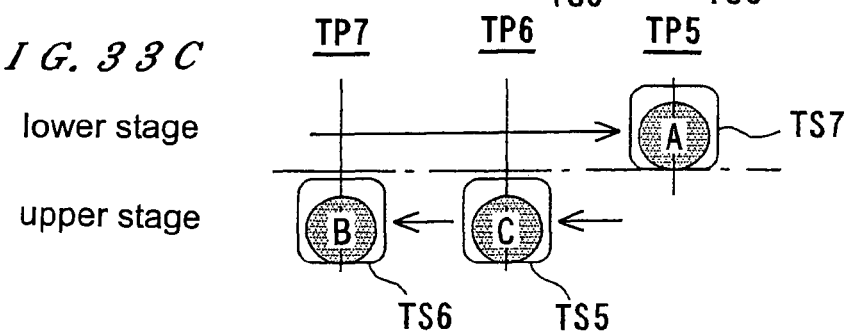

Then, the pusher 38 located at the seventh transferring position TP7, and the pusher 37 located at the sixth transferring position TP6 are lifted to transfer the wafer A and the wafer B to the top ring 301D and the top ring 301C, respectively (FIG. 32D). At that time, the upper transfer stages TS5 and TS6 move toward the fifth transferring position TP5, and the lower transfer stage TS7 moves toward the seventh transferring position TP7 (FIG. 33A). The wafer A and the wafer B which have been polished in the respective polishing units are placed on the seventh transfer stage TS7 and the sixth transfer stage TS6 by the pushers 38 and 37, respectively (FIG. 33B). At that time, a next wafer C is placed on the fifth transfer stage TS5 as described above.

Then, the upper transfer stages TS5 and TS6 move toward the seventh transferring position TP7, and the lower transfer stage TS7 moves toward the fifth transferring position TP5. Thus, the wafer A on the seventh transfer stage TS7 is moved to the fifth transferring position TP5 at which the lifter 36 is disposed, the wafer B on the sixth transfer stage TS6 is moved to the wafer receiving/delivering position (seventh transferring position TP7) for the top ring 301D, and the wafer C on the fifth transfer stage TS5 is moved to the wafer receiving/delivering position (sixth transferring position TP6) for the top ring 301C (see FIG. 33C).

Figure 33D:
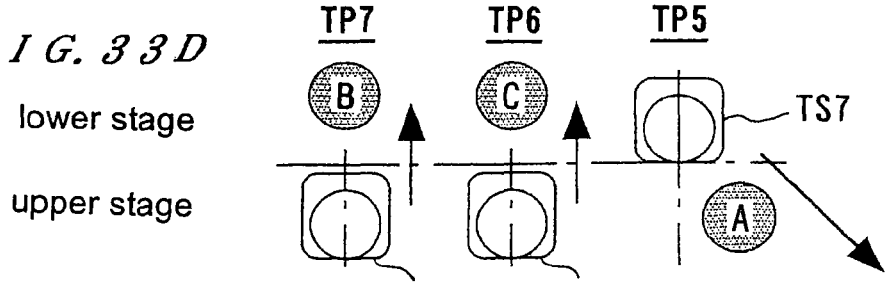
Figure 33E:
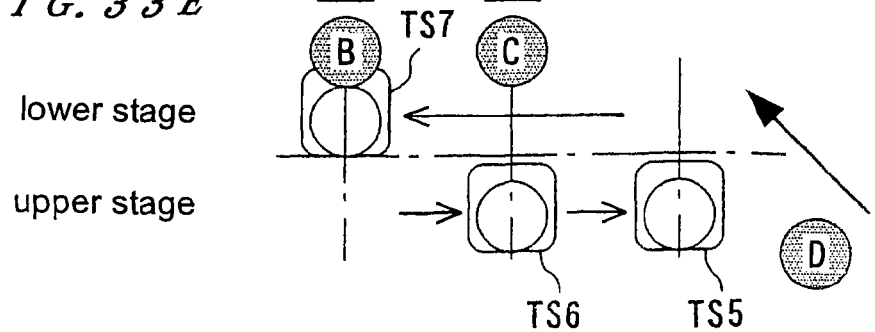

Then, the pusher 38 located at the seventh transferring position TP7, and the pusher 37 located at the sixth transferring position TP6 are lifted to transfer the wafer B and the wafer C to the top ring 301D and the top ring 301C, respectively, and the lifter 36 located at the fifth transferring position is lifted to transfer the wafer A to the second transfer robot 40 (FIG. 33D). At that time, the upper transfer stages TS5 and TS6 move toward the fifth transferring position TP5, and the lower transfer stage TS7 moves toward the seventh transferring position TP7. The next wafer D is prepared by the second transfer robot 40 (FIG. 33E). Thereafter, processes shown in FIGS. 33A through 33E are repeated.

When parallel processing is performed, a wafer is transferred on the following route: the wafer cassette of the front loading portion 20→the first transfer robot 22→the reversing machine 31→the lifter 32→the first transfer stage TS1 of the first linear transporter 5→the pusher 33→the top ring 301A→the polishing table 300A→the pusher 33→the second transfer stage TS2 of the first linear transporter 5→the pusher 34→the top ring 301B→the polishing table 300B→the pusher 34→the third transfer stage TS3 of the first linear transporter 5→the lifter 35→the second transfer robot 40→the reversing machine 41→the chucking unit 461 of the transfer unit 46→the primary cleaning device 42→the chucking unit 462 of the transfer unit 46→the secondary cleaning device 43→the chucking unit 463 of the transfer unit 46→the tertiary cleaning device 44→the chucking unit 464 of the transfer unit 46→the quaternary cleaning device 45→the first transfer robot 22→the wafer cassette of the front loading portion 20.

Another wafer is transferred on the following route: the wafer cassette of the front loading portion 20→the first transfer robot 22→the reversing machine 31→the lifter 32→the fourth transfer stage TS4 of the first linear transporter 5→the lifter 35→the second transfer robot 40→the lifter 36→the fifth transfer stage TS5 of the second linear transporter 6→pusher 37→the top ring 301C→the polishing table 300C→the pusher 37→the sixth transfer stage TS6 of the second linear transporter 6→the pusher 38→the top ring 301D→the polishing table 300D→the pusher 38→the seventh transfer stage TS7 of the second linear transporter 6→the lifter 36→the second transfer robot 40→the reversing machine 41→the chucking unit 461 of the transfer unit 46→the primary cleaning device 42→the chucking unit 462 of the transfer unit 46→the secondary cleaning device 43→the chucking unit 463 of the transfer unit 46→the tertiary cleaning device 44→the chucking unit 464 of the transfer unit 46→the quaternary cleaning device 45→the first transfer robot 22→the wafer cassette of the front loading portion 20.

Figure 34A:
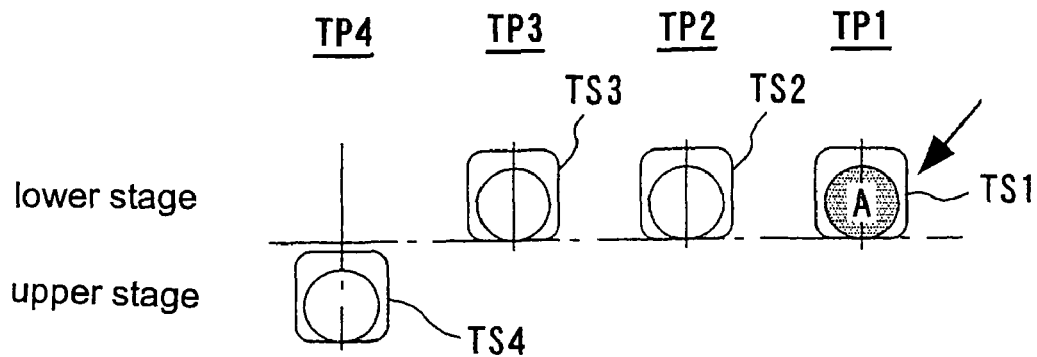
FIGS. 34A through 34D are schematic views explanatory of operation of the first linear transporter when parallel processing is performed.
Figure 34B:
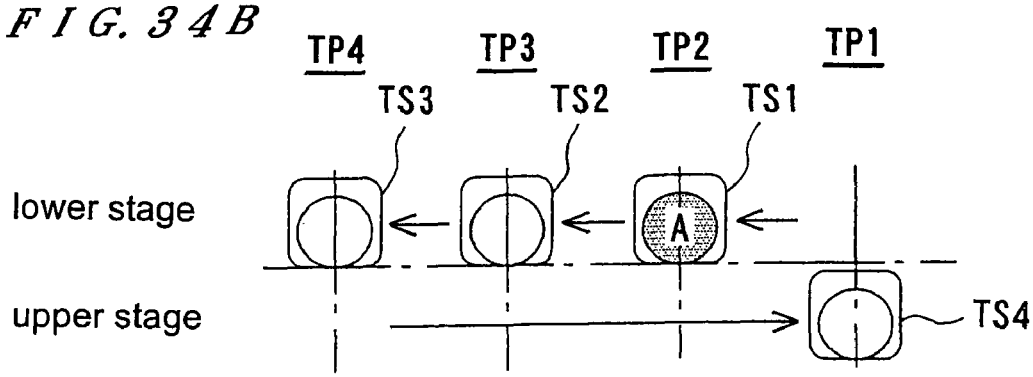

Operation of the linear transporters 5 and 6 will be described below with reference to FIGS. 34A through 39E. A wafer A is placed on the first transfer stage TS1 of the first linear transporter 5 as with the serial processing (FIG. 34A). The lower transfer stages TS1, TS2, and TS3 move toward the fourth transferring position TP4, and the upper transfer stage TS4 moves toward the first transferring position TP1. Thus, the wafer A on the first transfer stage TS1 is moved to the wafer receiving/delivering position (second transferring position TP2) for the top ring 301A (FIG. 34B).

Figure 34C:
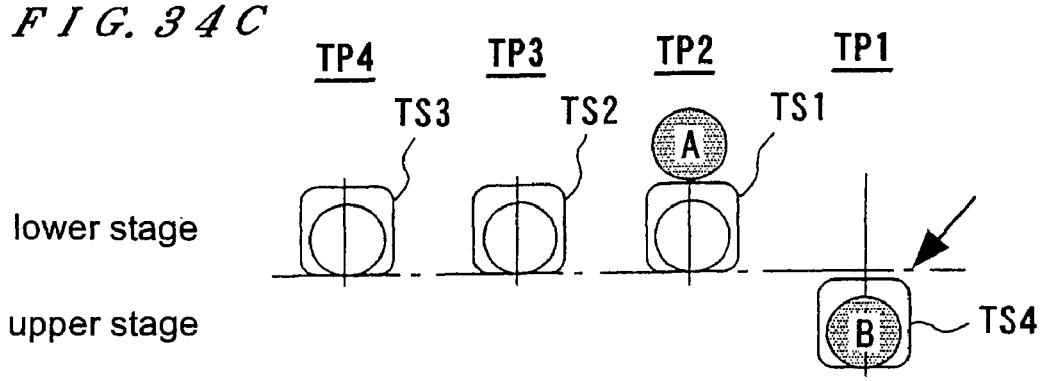
Figure 34D:
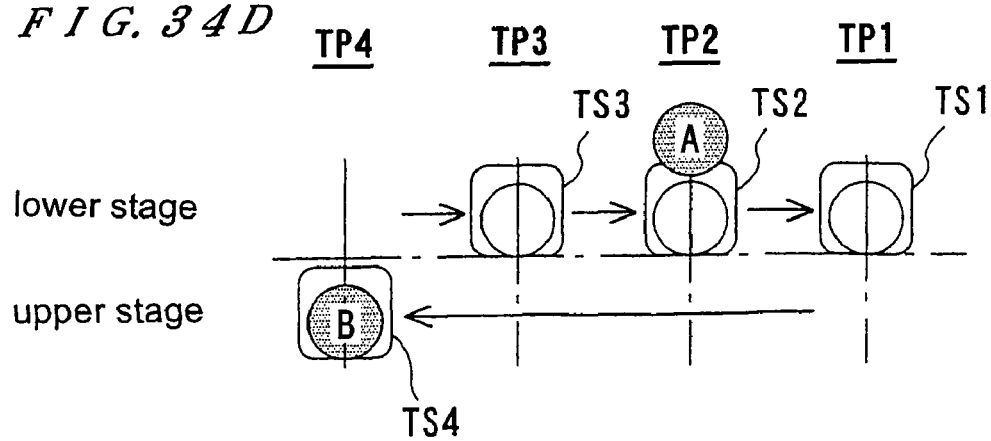

Then, the pusher 33 located at the second transferring position TP2 is lifted to transfer the wafer A to the top ring 301A. At that time, a next wafer B is placed on the fourth transfer stage TS4 (FIG. 34C). The lower transfer stages TS1, TS2, and TS3 move toward the first transferring position TP1, and the upper transfer stage TS4 moves toward the fourth transferring position TP4. Thus, the wafer B on the fourth transfer stage TS4 is moved to the fourth transferring position TP4 at which the lifter 35 is disposed (FIG. 34D).

Figure 35A:
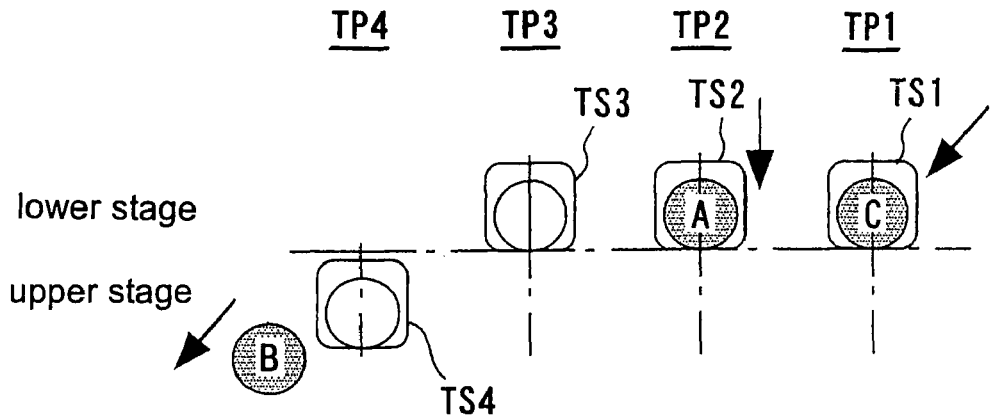
FIGS. 35A through 35D are schematic views explanatory of operation of the first linear transporter when parallel processing is performed.

The wafer A which has been polished is placed on the second transfer stage TS2 by the pusher 33, and a next wafer C is placed on the first transfer stage TS1. The lifter 35 located at the fourth transferring position TP4 is lifted to transfer the wafer B to the second transfer robot 40 (FIG. 35A). The wafer B is transferred to the second polishing section 3b by the second transfer robot 40.

Figure 35B:
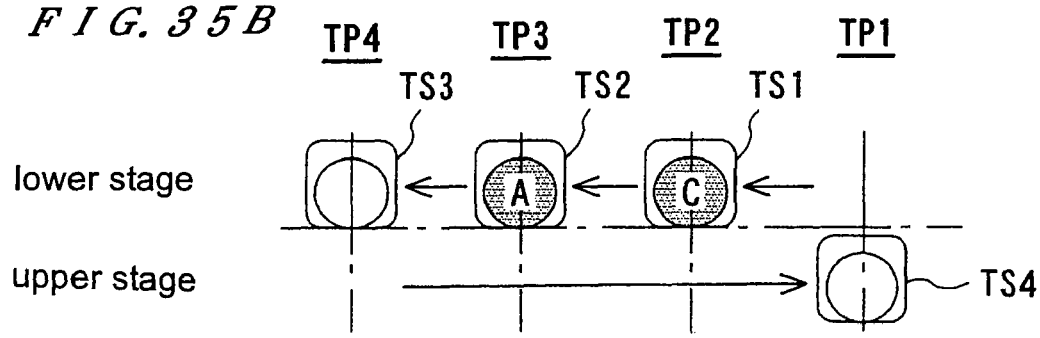
Figure 35C:
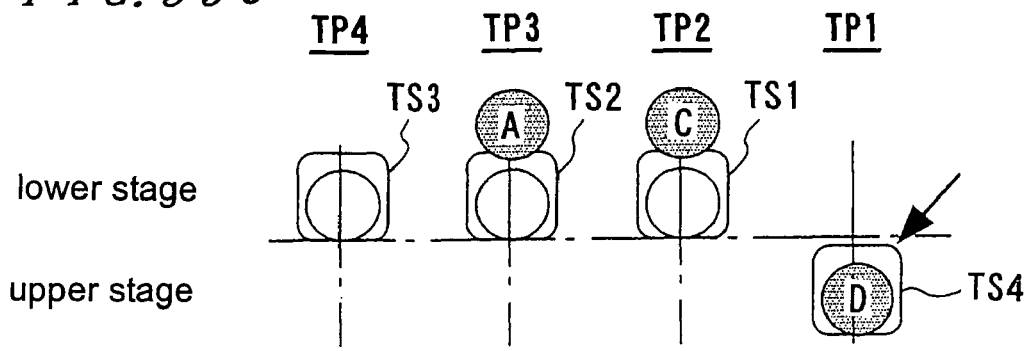

Then, the lower transfer stages TS1, TS2, and TS3 move toward the fourth transferring position TP4, and the upper transfer stages TS4 moves toward the first transferring position TP1. Thus, the wafer A on the second transfer stage TS2 is moved to the wafer receiving/delivering position (third transferring position TP3) for the top ring 301B, and the wafer C on the first transfer stage TS1 is moved to the wafer receiving/delivering position (second transferring position TP2) for the top ring 301A (FIG. 35B).

Figure 35D:
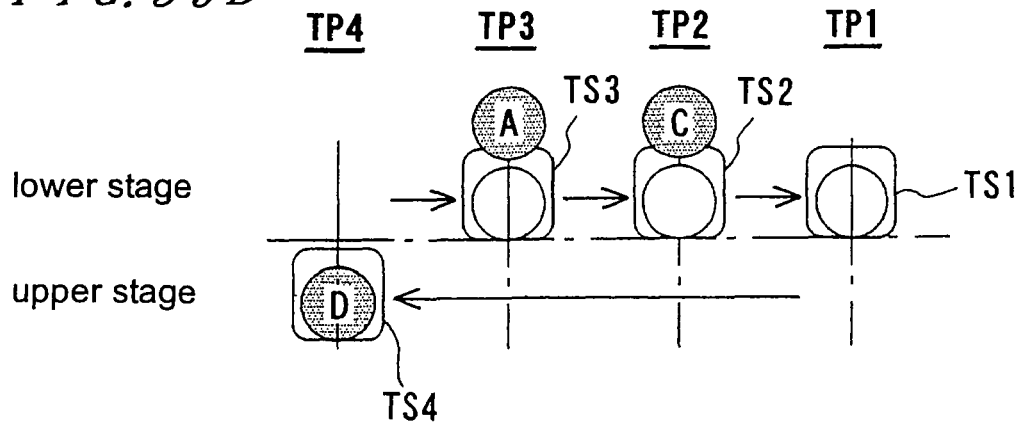

Then, the pusher 34 located at the third transferring position TP3 and the pusher 33 located at the second transferring position TP2 are lifted to transfer the wafer A and the wafer C to the top ring 301B and the top ring 301A, respectively. Further, a next wafer D is placed on the fourth transfer stage TS4 as described above (FIG. 35C). Then, the lower transfer stages TS1, TS2, and TS3 move toward the first transferring position TP1, and the upper transfer stage TS4 moves toward the fourth transferring position TP4. Thus, the wafer D on the fourth transfer stage TS4 is moved to the fourth transferring position TP4 at which the lifter 35 is disposed (FIG. 35D).

Figure 36A:
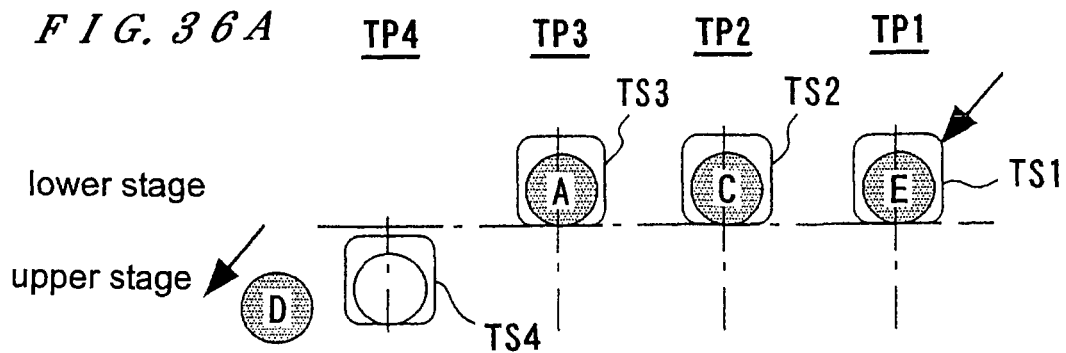
FIGS. 36A through 36E are schematic views explanatory of operation of the first linear transporter when parallel processing is performed.

The wafer A and the wafer C which have been polished in respective polishing units are placed on the third transfer stage TS3 and the second transfer stage TS2 by the pushers 34 and 33, respectively, and a next wafer E is placed on the first transfer stage TS1. Further, the lifter 35 located at the fourth transferring position TP4 is lifted to transfer the wafer D to the second transfer robot 40 (FIG. 36A).

Figure 36B:
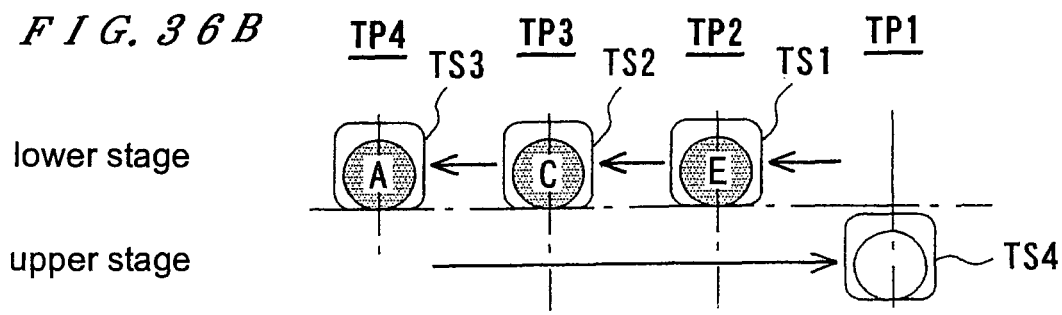

Then, the lower transfer stages TS1, TS2, and TS3 move toward the fourth transferring position TP4, and the upper transfer stage TS4 moves toward the first transferring position TP1. Thus, the wafer A on the third transfer stage TS3 is moved to the fourth transferring position TP4 at which the lifter 35 is disposed, the wafer C on the second transfer stage TS2 is moved to the wafer receiving/delivering position (third transferring position TP3) for the top ring 301B, and the wafer E on the first transfer stage TS1 is moved to the wafer receiving/delivering position (second transferring position TP2) for the top ring 301A (FIG. 36B).

Figure 36C:
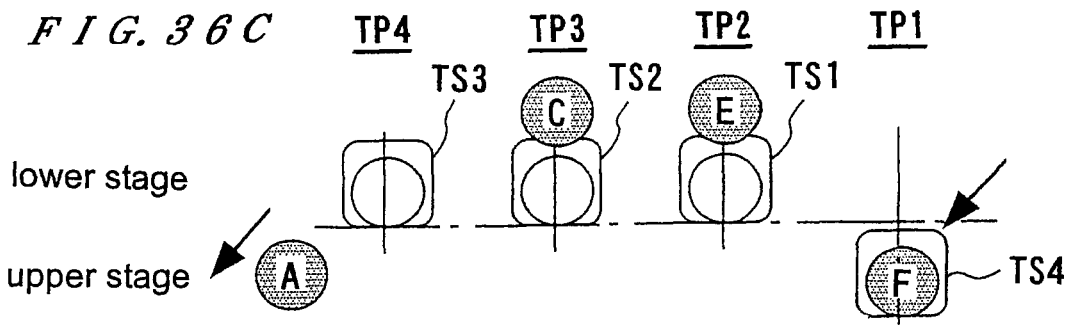

Then, the pusher 34 located at the third transferring position TP3 and the pusher 33 located at the second transferring position TP2 are lifted to transfer the wafer C and the wafer E to the top ring 301B and the top ring 301A, respectively. Further, the lifter 35 located at the fourth transferring position TP4 is lifted to transfer the polished wafer A to the second transfer robot 40 (FIG. 36C). At that time, a next wafer F is placed on the fourth transfer stage TS4 as described above.

Figure 36D:
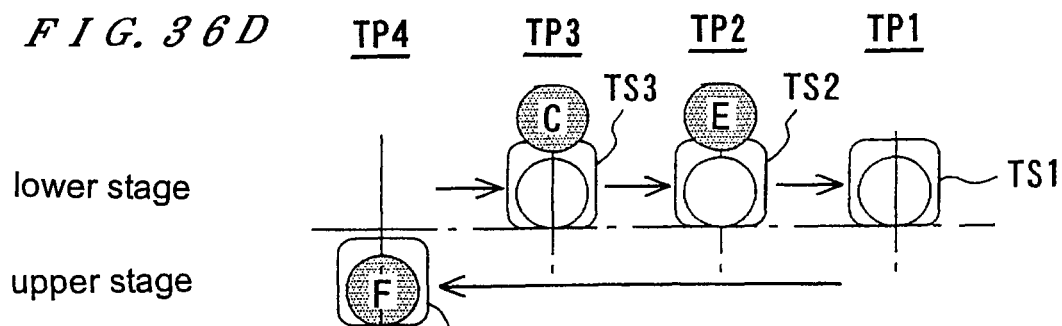
Figure 36E:
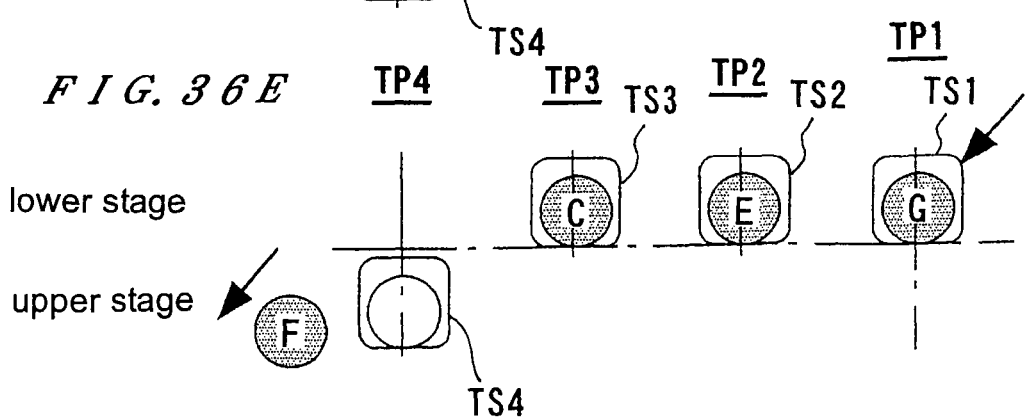

Then, the lower transfer stages TS1, TS2, and TS3 move toward the first transferring position TP1, and the upper transfer stage TS4 moves toward the fourth transferring position TP4. Thus, the wafer F on the fourth transfer stage TS4 is moved to the fourth transferring position TP4 at which the lifter 35 is disposed (FIG. 36D). The wafer C and the wafer E which have been polished in the respective polishing units are placed on the third transfer stage TS3 and the second transfer stage TS2 by the pushers 34 and 33, respectively, and a next wafer G is placed on the first transfer stage TS1. Further, the lifter 35 located at the fourth transferring position TP4 is lifted to transfer the wafer F to the second transfer robot 40 (FIG. 36E). Thereafter, processes shown in FIGS. 36B through 36E are repeated.

Figure 37A:
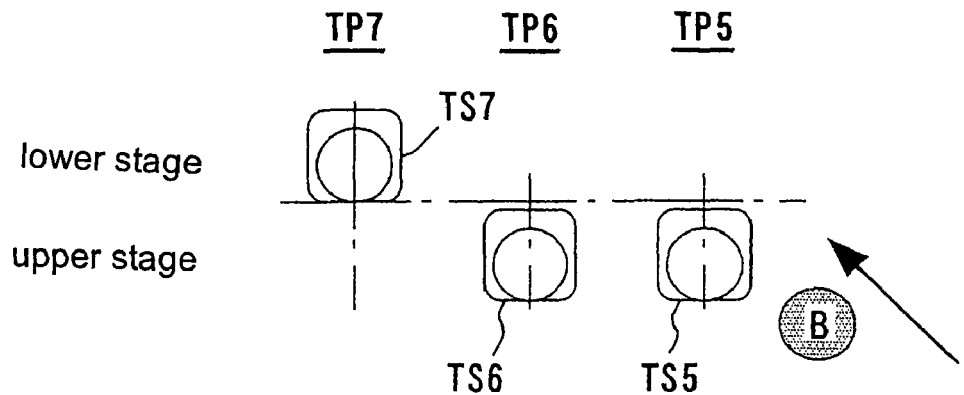
FIGS. 37A through 37D are schematic views explanatory of operation of the second linear transporter when parallel processing is performed.
Figure 37B:
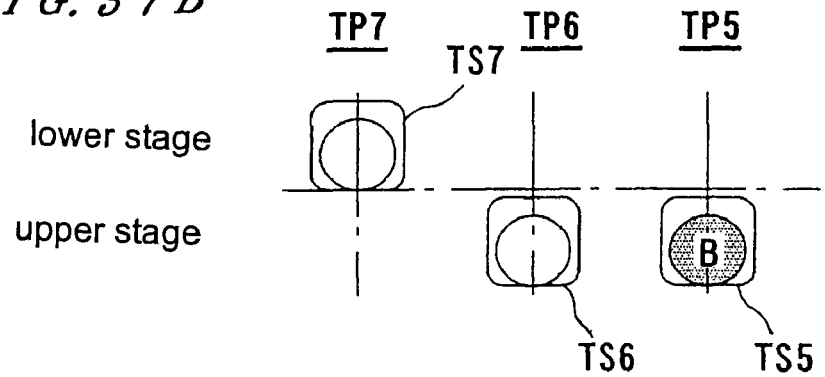

On the other hand, the second transfer robot 40 which has received the wafer B transfers the wafer B to the lifter 36 of the second linear transporter 6 in the second polishing section 3b (FIG. 37A). The wafer B is placed on the lifter 36 when the lifter 36 is lifted. The wafer B is placed on the fifth transfer stage TS5 of the second linear transporter 6 when the lifter 36 is lowered (FIG. 37B).

Figure 37C:
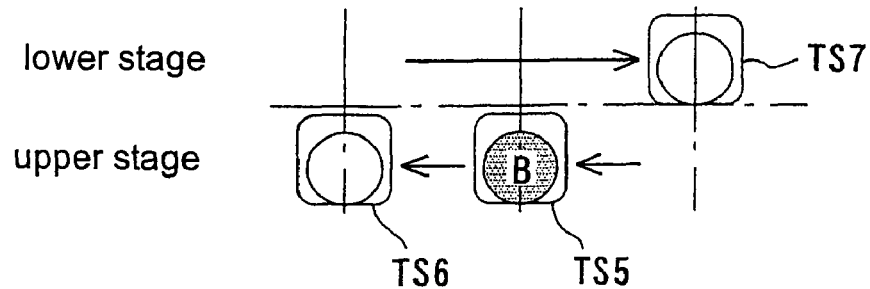

After the wafer B is placed on the fifth transfer stage TS5 of the second linear transporter 6, the lifter 36 continues to be lowered until a position in which the lifter 36 does not interfere with the fifth transfer stage TS5 even if the fifth transfer stage TS5 is moved. When lowering of the lifter 36 is completed, the upper transfer stages TS5 and TS6 move toward the seventh transferring position TP7, and the lower transfer stage TS7 moves toward the fifth transferring position TP5. Thus, the wafer B on the fifth transfer stage TS5 is moved to the wafer receiving/delivering position (sixth transferring position TP6) for the top ring 301C (FIG. 37C).

Figure 37D:
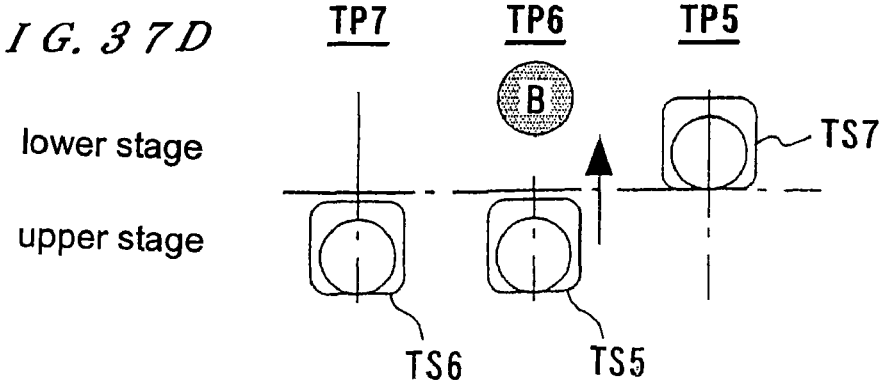
Figure 38A:
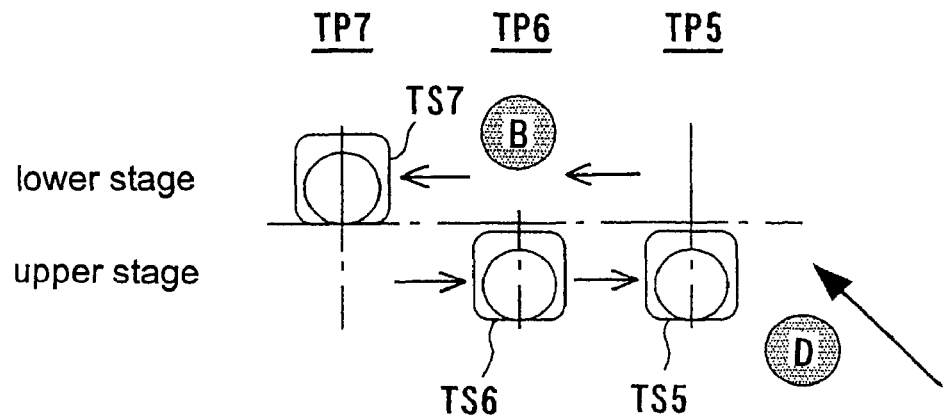
FIGS. 38A through 38D are schematic views explanatory of operation of the second linear transporter when parallel processing is performed.
Figure 38B:
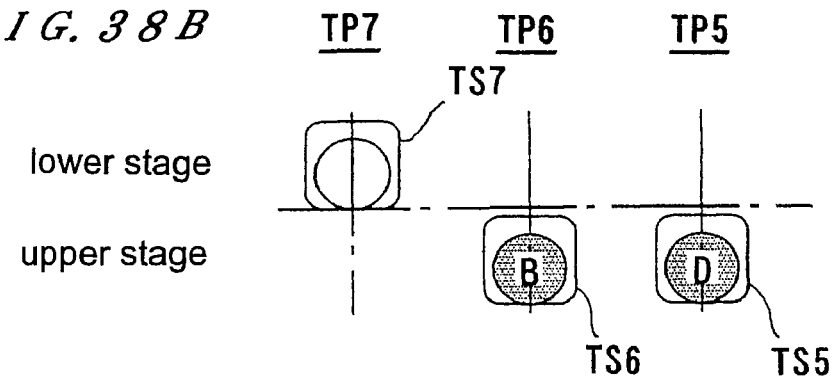

Then, the pusher 37 located at the sixth transferring position TP6 is lifted to transfer the wafer B to the top ring 301C (FIG. 37D). At that time, the upper transfer stages TS5 and TS6 move toward the fifth transferring position TP5, and the lower transfer stage TS7 moves toward the seventh transferring position TP7 (FIG. 38A). Polished wafer B is moved above the sixth transfer stage TS6 by the pusher 37 (FIG. 38B). At that time, the wafer D transferred to the second transfer robot 40 in FIG. 36A is placed on the fifth transfer stage TS5.

Figure 38C:
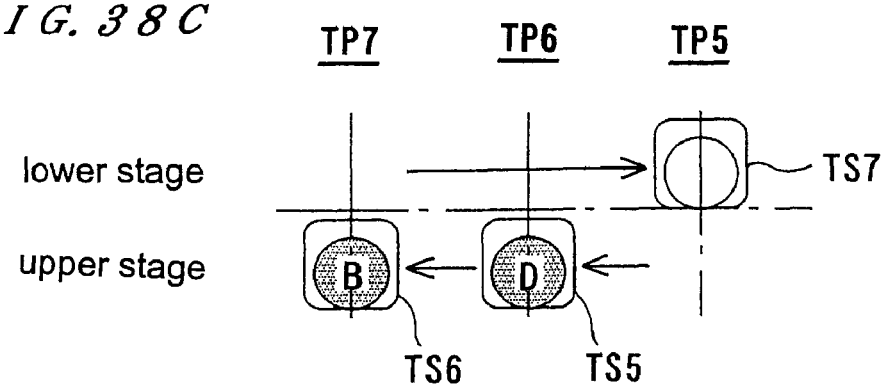

Then, the upper transfer stages TS5 and TS6 move toward the seventh transferring position TP7, and the lower transfer stage TS7 moves toward the fifth transferring position TP5. Thus, the wafer B on the sixth transfer stage TS6 is moved to the wafer receiving/delivering position (seventh transferring position TP7) for the top ring 301D, and the wafer D on the fifth transfer stage TS5 is moved to the wafer receiving/delivering position (sixth transferring position TP6) for the top ring 301C (FIG. 38C).

Figure 38D:
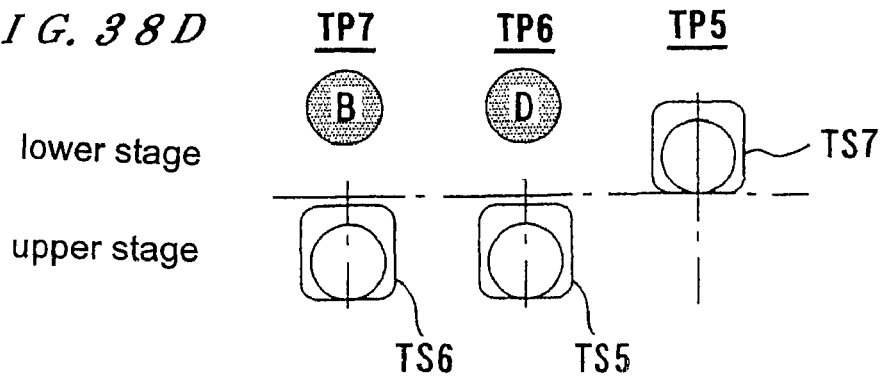
Figure 39A:
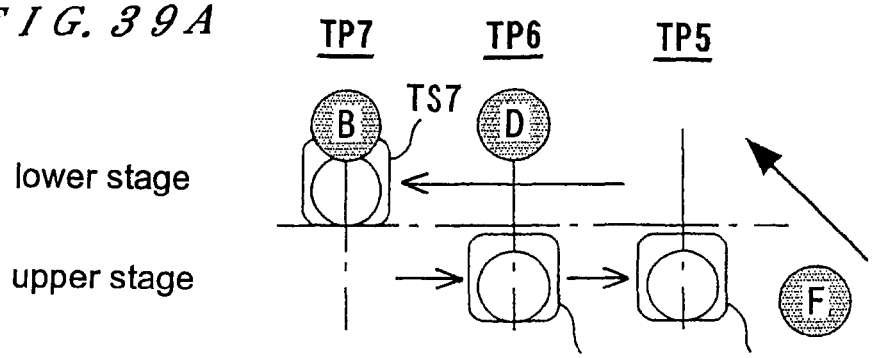
FIGS. 39A through 39E are schematic views explanatory of operation of the second linear transporter when parallel processing is performed.
Figure 39B:
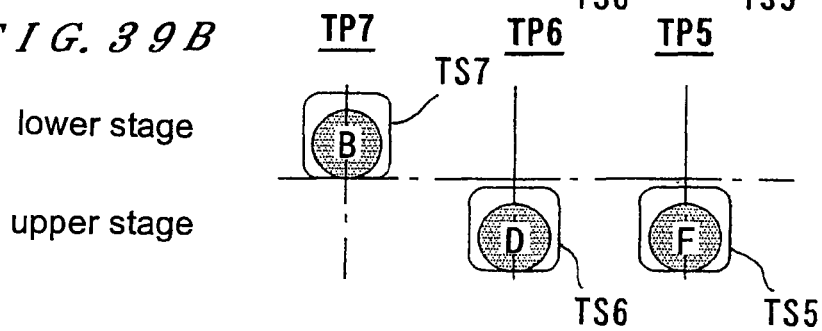

Then, the pusher 38 located at the seventh transferring position TP7, and the pusher 37 located at the sixth transferring position TP6 are lifted to transfer the wafer B and the wafer D to the top ring 301D and the top ring 301C, respectively (FIG. 38D). At that time, the upper transfer stages TS5 and TS6 move toward the fifth transferring position TP5, and the lower transfer stage TS7 moves toward the seventh transferring position TP7 (FIG. 39A). The wafer B and the wafer D which have been polished in the respective polishing units are placed on the seventh transfer stage TS7 and the sixth transfer stage TS6 by the pushers 38 and 37, respectively (see FIG. 39B). At that time, the wafer F transferred to the second transfer robot 40 in FIG. 36E is placed on the fifth transfer stage TS5.

Figure 39C:
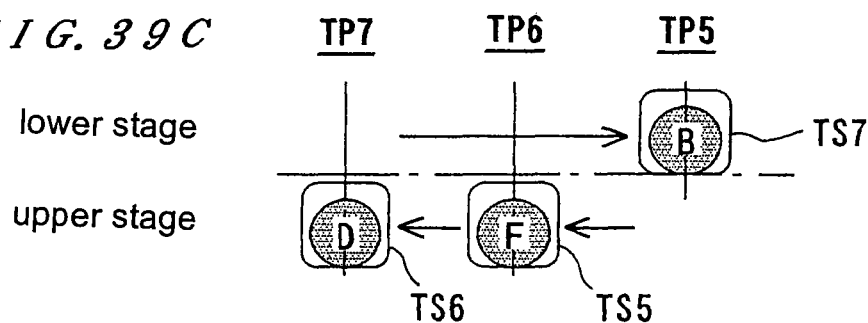

Then, the upper transfer stages TS5 and TS6 move toward the seventh transferring position TP7, and the lower transfer stage TS7 moves toward the fifth transferring position TP5. Thus, the wafer B on the seventh transfer stage TS7 is moved to the fifth transferring position TP5 at which the lifter 36 is disposed, the wafer D on the sixth transfer stage TS6 is moved to the wafer receiving/delivering position (seventh transferring position TP7) for the top ring 301D, and the wafer F on the fifth transfer stage TS5 is moved to the wafer receiving/delivering position (sixth transferring position TP6) for the top ring 301C (FIG. 39C).

Figure 39D:
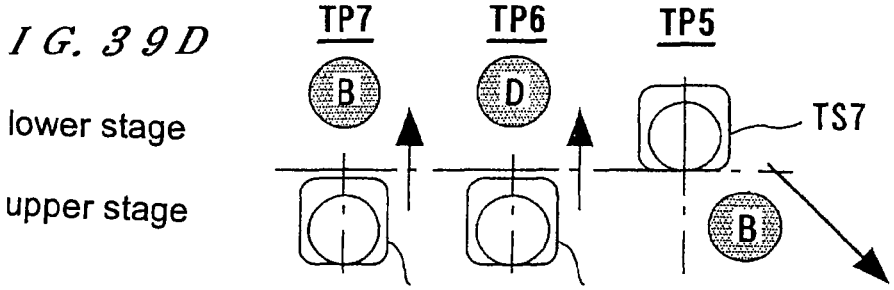
Figure 39E:
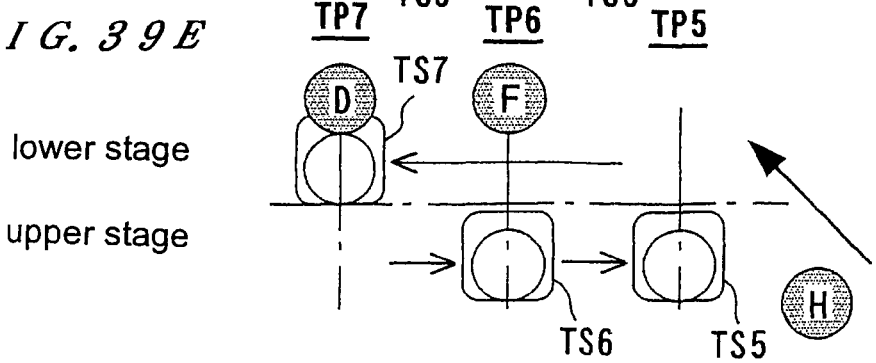

Then, the pusher 38 located at the seventh transferring position TP7, and the pusher 37 located at the sixth transferring position TP6 are lifted to transfer the wafer D and the wafer F to the top ring 301D and the top ring 301C, respectively, and the lifter 36 located at the fifth transferring position is lifted to transfer the wafer B to the second transfer robot 40 (FIG. 39D). At that time, the upper transfer stages TS5 and TS6 move toward the fifth transferring position TP5, and the lower transfer stage TS7 moves toward the seventh transferring position TP7. A next wafer H is prepared by the second transfer robot 40 (FIG. 39E). Thereafter, processes shown in FIGS. 39A through 39E are repeated.

Figure 40:
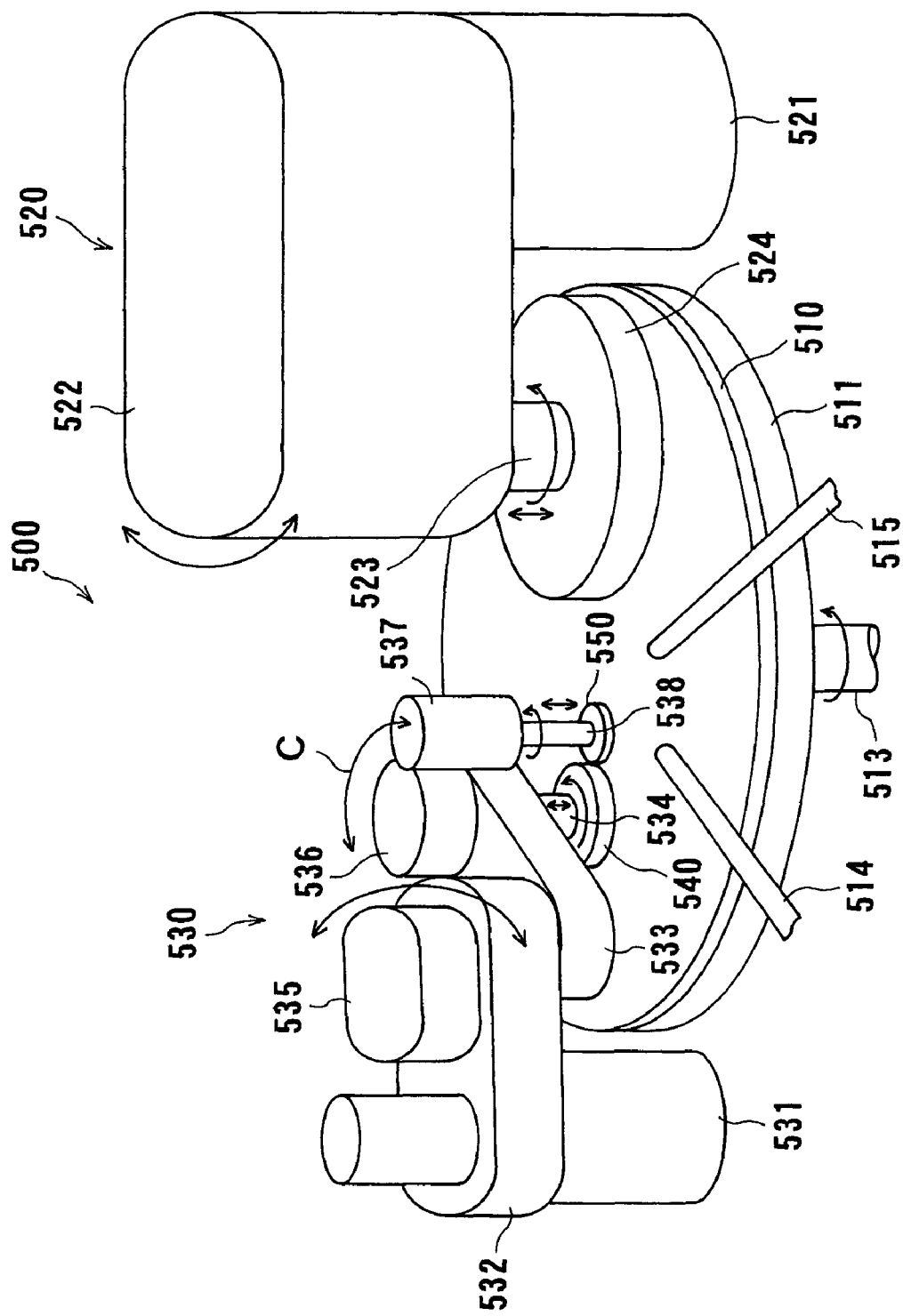
FIG. 40 is a schematic perspective view showing a polishing unit according to another embodiment of the present invention.

Here, a polishing unit shown in FIG. 40 may be used instead of the polishing unit described above. Polishing unit 500 shown in FIG. 40 comprises polishing table 511 having a polishing cloth 510 attached to an upper surface thereof, a top ring unit 520 for holding a semiconductor wafer as a workpiece under vacuum suction and pressing the semiconductor wafer against the polishing table 511 to polish the semiconductor wafer, and a dressing unit 530 for conditioning (dressing) the polishing cloth on the polishing table 511. An upper surface of the polishing cloth 510 on the polishing table 511 forms a polishing surface which is brought into sliding contact with the semiconductor wafer as a workpiece. The polishing table 511 is coupled via a table shaft 513 to a motor (not shown) disposed below the polishing table 511. Thus, the polishing table 511 is rotatable about the table shaft 513. A polishing liquid supply nozzle 514 and an atomizer 515 are disposed above the polishing table 511.

As shown in FIG. 40, the top ring unit 520 comprises a rotatable support shaft (moving mechanism) 521, a top ring head 522 attached to an upper end of the support shaft 521, a top ring shaft 523 extending downward from a free end of the top ring head 522, and a top ring 524, substantially in a disk shape, connected to a lower end of the top ring shaft 523. The top ring 524 is moved horizontally according to a swinging movement of the top ring head 522 by rotation of the support shaft 521 and can reciprocate between a pusher and a polishing position located above the polishing cloth 510.

The top ring 524 is connected via the top ring shaft 523 to a motor and a lifting and lowering cylinder provided within the top ring head 522. Thus, the top ring 524 is vertically movable and rotatable about the top ring shaft 523. A semiconductor wafer as a workpiece is attracted and held to a lower end surface of the top ring 524 under vacuum suction or the like. With the aforementioned mechanisms, the top ring 524 can press the semiconductor wafer held on the lower surface thereof against the polishing cloth 510 at a desired pressure while it is rotated.

The dressing unit 530 serves to regenerate a surface of the polishing cloth 510 that has been deteriorated by polishing. In the present embodiment, the dressing unit 530 comprises a diamond dresser 540 for roughly conditioning the polishing cloth 510 by thinly shaving a surface of the polishing cloth 510, and a brush dresser 550 for removing abrasive particles or polishing wastes clogged in recesses formed in the polishing cloth 510.

The dressing unit 530 is disposed on an opposite side of a center of the polishing table 511 with respect to the top ring unit 520. As shown in FIG. 40, the dressing unit 530 comprises a rotatable support shaft 531, a dresser head 532 attached to the support shaft 531, and a swinging arm 533 mounted on a tip end of the dresser head 532. A swinging motor 535 is mounted on an upper portion of the dresser head 532, and the swinging arm 533 is connected to the swinging motor 535. The dresser head 532 is swung by rotation of the support shaft 531, and the swinging arm 533 is swung as indicated by arrow C in FIG. 40 by rotational actuation of the swinging motor 535.

A dresser shaft 534 extends downward from a free end of the swinging arm 533. A diamond dresser 540 substantially in a disk form is connected to a lower end of the dresser shaft 534. The dresser shaft 534 is coupled to a driving mechanism (air cylinder and motor) 536 provided at an upper portion of the swinging arm 533. With the driving mechanism 536, the diamond dresser 540 connected to the dresser shaft 534 is vertically movable and rotatable about the dresser shaft 534.

As shown in FIG. 40, a driving mechanism (air cylinder and motor) 537 is provided near a free end of the swinging arm 533, and a dresser shaft 538 extends downward from the driving mechanism 537. The brush dresser 550 substantially in a disk form is connected to a lower end of the dresser shaft 538. With the driving mechanism 537, the brush dresser 550 connected to the dresser shaft 538 is vertically movable and rotatable about the dresser shaft 538.

With such a dresser, the polishing cloth can be conditioned by swinging the dresser. Therefore, the dresser itself can be made compact in size, and hence the apparatus in its entirety can be made compact in size. Further, when a swinging speed is adjusted at several predetermined speeds, the polishing cloth can be formed efficiently.

According to recent trends toward automation in semiconductor fabrication plants and wafers having larger diameters, it has increasingly been desired to provide a mechanism for recognizing a wafer ID in a semiconductor fabrication apparatus. Specifically, the following demands have been increased. Standardized ID codes are provided for wafers, and an ID code is read by an ID recognition sensor. Information on a wafer is obtained from the ID code and used for purposes of "adjustment of processing conditions of the semiconductor fabrication apparatus", "process control in a plant", or the like. Such a substrate ID recognition mechanism first detects a position of a notch (or orientation flat) of a wafer and then rotates the wafer at a predetermined angle to position the wafer. A unit performing such rotational positioning is referred to as a "notch aligner". An ID code of a wafer positioned by a notch aligner is read by an ID recognition sensor and transmitted to a controller.

Figure 41A:
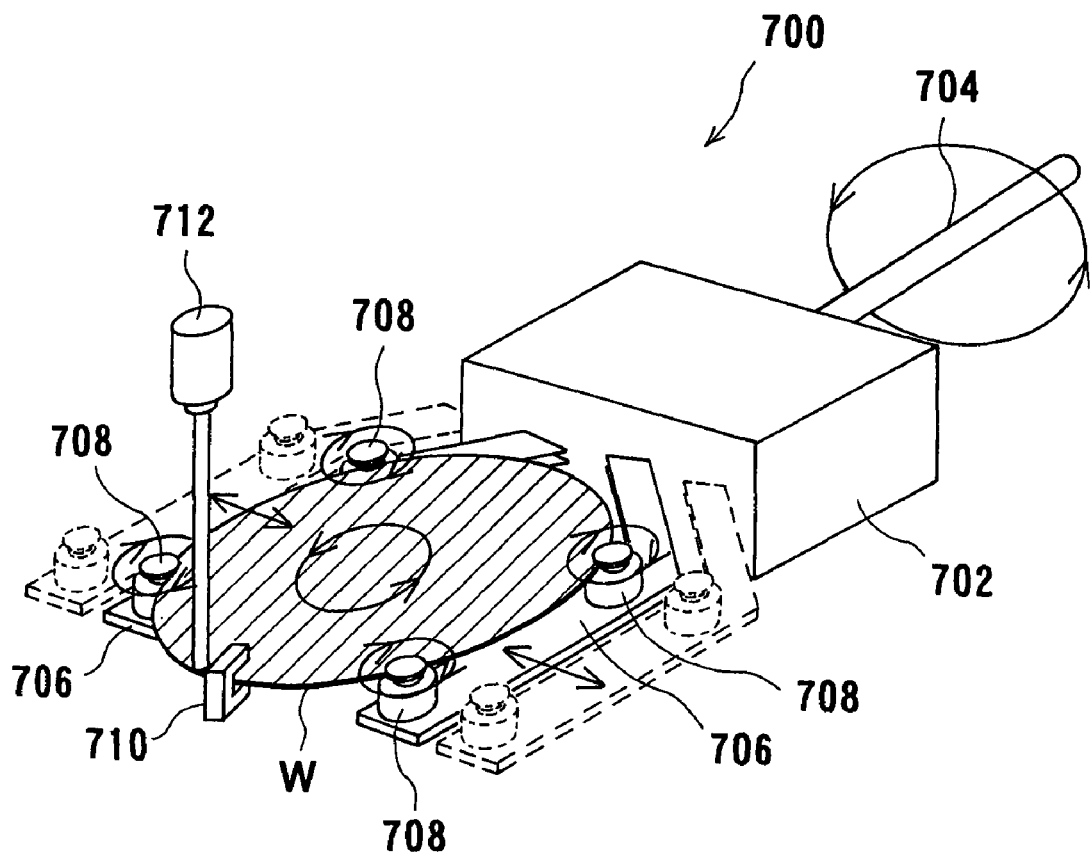
FIG. 41A is a schematic perspective view showing a reversing machine according to another embodiment of the present invention.

However, the notch aligner and the ID recognition mechanism require a large space for installation and thus cause an increase of a footprint of the apparatus. Further, the notch aligner requires actions of transferring a wafer to the notch aligner, disturbance may be caused to a transferring path of wafers, and an expected throughput may not be obtained. Therefore, as shown in FIG. 41A, it is desirable to use a reversing machine 700 combined with a notch aligner. The reversing machine 700 shown in FIG. 41A comprises a reversing machine body 702, a reversing axis 704 attached to the reversing machine body 702, and a pair of arms 706, which are openable and closable, serving as a holding mechanism for holding a substrate. The arms 706 of the reversing machine 700 have a plurality of pins 708 with a groove for clamping a wafer W. When the reversing axis 704 is rotated, a wafer W clamped by the pins 708 of the arms 706 is reversed.

Figure 41B:
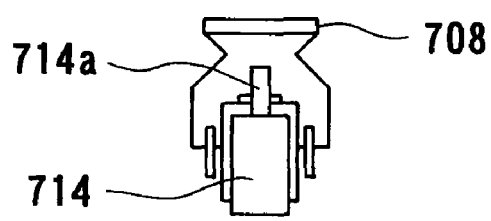
FIG. 41B is a partly cross-sectional view of FIG. 41A.

As a sensor for detecting a notch of the wafer W, a transmission optical sensor 710 is disposed near a peripheral portion of the wafer W. A sensor 712 for recognizing an ID of the wafer W is disposed above the wafer W. As shown in FIG. 41B, the pin 708 on the arm 706 is coupled to a rotational shaft 714a of a motor (rotational mechanism) 714 disposed within the pin 708. Respective pins 708 are rotatable in synchronism with each other. Thus, the wafer W can be rotated by actuation of the motor 714 while the peripheral portion of the wafer W is held by grooves of the pins 708. The pins 708 may be rotated by a transmitting belt which transmits power.

Next, there will be described a process when such a reversing machine 700 is used as a reversing machine in the first polishing section 3a described above. A wafer picked up from the front loading portion 20 is transferred to the reversing machine 700 by the first transfer robot 22. The wafer transferred to the reversing machine 700 is handled by the reversing machine when the arms 706 are closed. At that time, the wafer W is supported by at least three pins 708 (four in the illustrated example of FIG. 41A). Then, the motor is actuated to rotate the wafer W, and the notch detecting sensor 710 detects a notch of the wafer W. When the sensor 710 detects the notch, rotation of the motor 714 is stopped, and the notch is positioned at a predetermined position. In a state in which the notch is thus positioned, an ID code on the wafer is located right below ID recognition sensor 712. Thus, the ID recognition sensor 712 reads the ID code. Then, the reversing axis 704 is rotated to reverse the wafer W, and the wafer W is transferred to a subsequent process. In this manner, with the reversing machine 700 combined with a notch aligner, a wafer can be processed without increasing a number of transfers for a processed wafer by the first transfer robot 22, so that an influence on throughput can be minimized.

Figure 42:
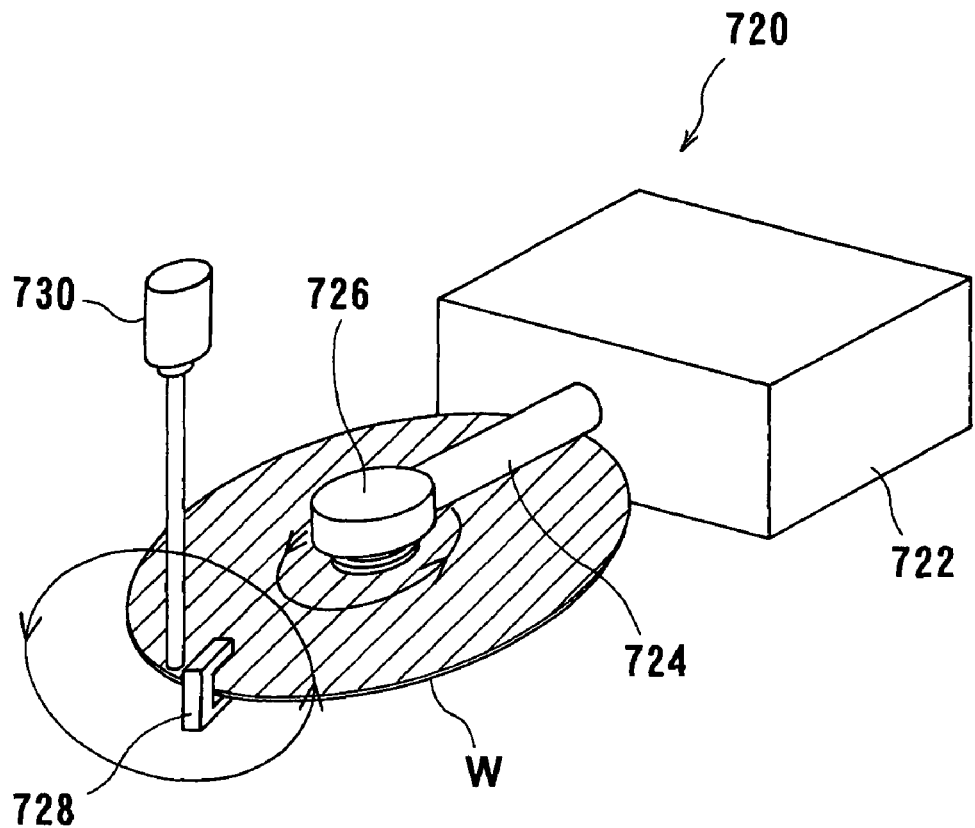
FIG. 42 is a schematic perspective view showing a reversing machine according to another embodiment of the present invention.

There has been described an example shown in FIG. 41A in which the wafer W is clamped by the arms 706. However, as shown in FIG. 42, a notch aligner function may be provided in a reversing machine which attracts a wafer under vacuum suction. The reversing machine 720 shown in FIG. 42 comprises a reversing machine body 722, a reversing axis 724 attached to the reversing machine body 722, and a vacuum suction portion 726 attached to a tip end of the reversing axis 724. A wafer W is attracted on a lower surface of the vacuum suction portion 726 under vacuum suction. When the reversing axis 724 is rotated, the wafer W attracted on the vacuum suction portion 726 is reversed.

As a sensor for detecting a notch of the wafer W, a transmission optical sensor 728 is disposed near a peripheral portion of the wafer W. A sensor 730 for recognizing an ID of the wafer W is disposed above the wafer W. The vacuum suction portion 726 is rotatable and thus capable of rotating the wafer W attracted on a lower surface of the vacuum suction portion 726. Thus, the vacuum suction portion 726 serves as a holding mechanism for holding a substrate and a rotational mechanism for rotating the substrate. After the wafer W is attracted to the vacuum suction portion 726, the wafer W is rotated, and the notch detecting sensor 728 detects a notch of the wafer W. When the sensor 728 detects the notch, rotation of the vacuum suction portion 726 is stopped, and the notch is positioned at a predetermined position. In a state in which the notch is thus positioned, an ID code on the wafer is located right below the ID recognition sensor 730. Thus, ID recognition sensor 730 reads the ID code.

Figure 43:
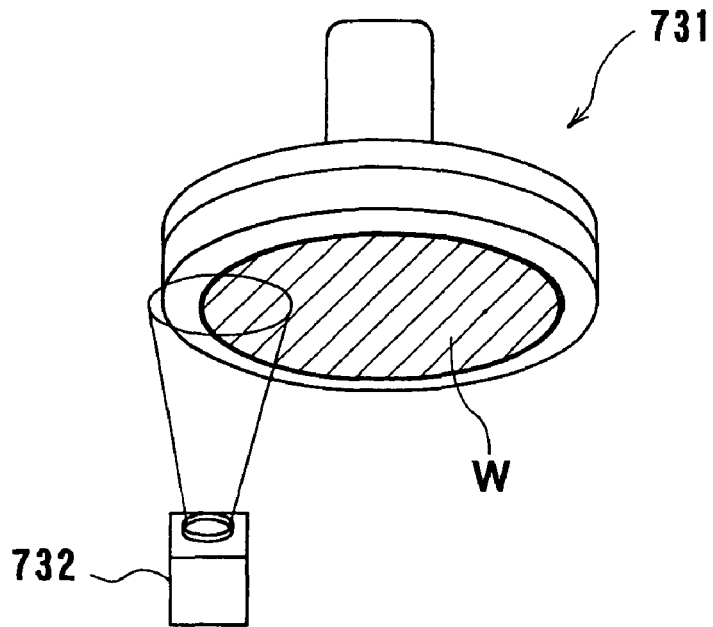
FIG. 43 is a schematic perspective view showing a top ring according to another embodiment of the present invention.

Further, such a notch aligner function may be provided in any substrate processing apparatus other than a reversing machine. For example, a notch aligner function may be added to the top ring of the polishing unit described above. A wafer is held on a lower surface of the top ring in a state such that a surface of the wafer faces downward, and the top ring is rotatable. Therefore, as shown in FIG. 43, when a CCD camera 732 is disposed below a peripheral portion of a wafer W as a sensor for detecting a notch of the wafer W and a sensor for recognizing an ID of the wafer W, top ring 731 can have a notch aligner function. Because technology for processing images captured by CCD cameras has been rapidly improved in recent years, detection of the notch and recognition of the ID can be performed by the CCD camera 732 disposed below the top ring 731.

In the above embodiments, there has been described a polishing apparatus for polishing a workpiece. However, the present invention is not limited to the polishing apparatus and is applicable to other substrate processing apparatuses. For example, some polishing units may be replaced with other substrate processing units (e.g., a deposition unit such as a plating unit or a CVD unit, a wet etching unit, or a dry etching unit) to form a substrate processing apparatus different from a polishing apparatus. Further, a plurality of different substrate processing units may be combined with each other and arrayed in a predetermined direction.

Although certain preferred embodiments of the present invention have been described, it should be understood that the present invention is not limited to the above embodiments, and that various changes and modifications may be made therein without departing from the scope of the technical concept.

As described above, according to the present invention, it is not necessary to provide an installation space for receiving/delivering mechanisms (pushers) which is different from a moving space for a transferring mechanism. Therefore, the apparatus can be made compact in size, and a workpiece can be transferred efficiently. When a plurality of transferring positions of a linear transferring mechanism are arranged along a longitudinal direction of the apparatus, the workpiece can linearly be transferred in the longitudinal direction of the apparatus, and a width of the apparatus can be minimized. Therefore, a space for the apparatus in its entirety can be reduced efficiently.

INDUSTRIAL APPLICABILITY

The present invention is suitable for use in a polishing apparatus for polishing a workpiece such as a semiconductor wafer to a flat mirror finish.

The invention claimed is:
1. A polishing apparatus comprising:
  a plurality of polishing sections, each of said polishing sections having at least two polishing units, each of said polishing units including
    (i) a polishing table with a polishing surface,
    (ii) a top ring for pressing a workpiece against said polishing surface, and

(iii) a moving mechanism for moving said top ring between a polishing position on said polishing surface and a workpiece receiving/delivering position associated with said each of said polishing units;

a linear transferring mechanism arranged linearly, said linear transferring mechanism including a plurality of transfer stages, each of said plurality of transfer stages being configured to transfer the workpiece between a plurality of transferring positions including the workpiece receiving/delivering position associated with said each of said plurality of polishing units, with at least two of said plurality of transfer stages being moved by a common driving mechanism so as to be linearly moved integrally and simultaneously, both of said at least two of said plurality of transfer stages being configured both to load and unload a workpiece, so that said linear transferring mechanism is capable of transferring at least two workpieces simultaneously; and a receiving/delivering mechanism, at the workpiece receiving/delivering position associated with said each of said polishing units, for receiving and delivering the workpiece between one of said transfer stages and said top ring of said each of said polishing units.

2. The polishing apparatus according to claim 1, wherein said plurality of polishing units and the plurality of transferring positions are arranged along a longitudinal direction of the polishing apparatus.

3. The polishing apparatus according to claim 2, wherein two of said plurality of transfer stages constitute a driving transfer stage and a driven transfer stage, respectively, and the polishing apparatus further comprises:

a shaft to be driven by a driving mechanism, said shaft being inserted into said driving transfer stage and having an end fixed to said driven transfer stage; and a stopper for positioning said driven transfer stage at one of the plurality of transferring positions.

4. The polishing apparatus according to claim 1, wherein all of said plurality of transfer stages include an upper transfer stage and a lower transfer stage, respectively.

5. The polishing apparatus according to claim 1, wherein the plurality of transferring positions include at least one transferring position in addition to the workpiece receiving/delivering position associated with said each of said plurality of polishing units.

6. A polishing apparatus comprising:

a plurality of wafer cassettes arranged along a predetermined direction;

a plurality of polishing tables arranged in a predetermined direction, each of said plurality of polishing tables having a polishing surface;

a plurality of top rings, each of said top rings being for pressing a wafer against one of said polishing surfaces; and a linear transferring mechanism arranged linearly, said linear transferring mechanism including a plurality of transfer stages, each of said plurality of transfer stages being configured to transfer a wafer between a plurality of transferring positions along a first direction of an array of said plurality of polishing tables, with at least two of said plurality of transfer stages being moved by a common driving mechanism so as to be linearly moved integrally and simultaneously in said first direction, both of said at least two of said plurality of transfer stages being configured both to load and unload a wafer to and from workpiece receiving/delivering positions at which the workpiece is loaded to and unloaded from said top ring, so that said linear transferring mechanism is capable of transferring at least two wafers simultaneously.

7. The polishing apparatus according to claim 6, wherein one of said plurality of transfer stages is constructed and arranged to move in a second direction opposite to the first direction.

8. The polishing apparatus according to claim 7, wherein two of said plurality of transfer stages constitute a driving transfer stage and a driven transfer stage, respectively, and the polishing apparatus further comprises:

a shaft to be driven by said driving mechanism, said shaft being inserted into said driving transfer stage and having an end fixed to said driven transfer stage; and a stopper for positioning said driven transfer stage at one of the transferring positions.

9. The polishing apparatus according to claim 1, wherein each of said polishing sections performs at least two-stage polishing of a workpiece, a first of said at least two polishing units performing a first stage polishing of the at least two-stage polishing and a second of said at least two polishing units performing a second stage of the at least two-stage polishing.

* * * * *